United States Patent
Hoshi et al.

(10) Patent No.: US 7,700,265 B2
(45) Date of Patent: Apr. 20, 2010

(54) IMAGE FORMING METHOD, PLANOGRAPHIC PRINTING PLATE PRECURSOR, AND PLANOGRAPHIC PRINTING METHOD

(75) Inventors: Satoshi Hoshi, Shizuoka (JP); Hiroshi Sunagawa, Kanagawa (JP); Toshifumi Inno, Shizuoka (JP); Naonori Makino, Shizuoka (JP); Gaku Kumada, Shizuoka (JP); Norio Aoshima, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/593,625

(22) PCT Filed: Mar. 24, 2005

(86) PCT No.: PCT/JP2005/006200

§ 371 (c)(1), (2), (4) Date: Sep. 21, 2006

(87) PCT Pub. No.: WO2005/091068

PCT Pub. Date: Sep. 29, 2005

(65) Prior Publication Data

US 2007/0224535 A1 Sep. 27, 2007

(30) Foreign Application Priority Data

| Mar. 24, 2004 | (JP) | 2004-086216 |
| Mar. 24, 2004 | (JP) | 2004-086217 |
| Mar. 25, 2004 | (JP) | 2004-089828 |

(51) Int. Cl.
 G03F 7/11 (2006.01)
 G03F 7/26 (2006.01)
 B41N 1/08 (2006.01)
(52) U.S. Cl. ............................. 430/302; 101/456
(58) Field of Classification Search .............. 430/270.1, 430/300, 302, 271.1, 322
See application file for complete search history.

(56) References Cited

U.S. PATENT DOCUMENTS

| 5,141,969 A | * | 8/1992 | Saeva et al. ................. 522/31 |
| 6,258,510 B1 | | 7/2001 | Maemoto et al. |
| 6,495,309 B1 | * | 12/2002 | Brabbs et al. ............ 430/271.1 |
| 6,935,236 B2 | * | 8/2005 | Hiller et al. ............... 101/401.1 |
| 2001/0018164 A1 | * | 8/2001 | Furukawa ................ 430/287.1 |
| 2002/0180944 A1 | * | 12/2002 | Fujii et al. ........................ 355/70 |
| 2003/0049564 A1 | * | 3/2003 | Higashi et al. ............... 430/302 |
| 2003/0160207 A1 | * | 8/2003 | Sakaguchi .................... 252/71 |
| 2003/0186162 A1 | * | 10/2003 | Takahashi et al. ......... 430/270.1 |
| 2003/0207204 A1 | * | 11/2003 | Sugasaki et al. .......... 430/270.1 |
| 2004/0197701 A1 | * | 10/2004 | Mitsumoto et al. ....... 430/270.1 |
| 2005/0074692 A1 | * | 4/2005 | Makino et al. ........... 430/270.1 |

FOREIGN PATENT DOCUMENTS

| EP | 1 099 984 A1 | 5/2001 |
| JP | 47-8657 A | 5/1972 |
| JP | 6-502931 A | 3/1994 |
| JP | 7-159583 A | 6/1995 |
| JP | 9-123387 A | 5/1997 |
| JP | 9-197668 A | 7/1997 |
| JP | 9-269593 A | 10/1997 |
| JP | 2938397 B2 | 6/1999 |
| JP | 2000-35673 A | 2/2000 |
| JP | 2000-39711 A | 2/2000 |
| JP | 2000-168136 A | 6/2000 |
| JP | 2000-235254 A | 8/2000 |
| JP | 2003-223007 A | 8/2003 |
| JP | 2004-12899 A | 1/2004 |
| WO | WO-96/34316 A1 | 10/1996 |
| WO | WO-99/45441 A1 | 9/1999 |
| WO | WO 02/076739 | * 10/2002 |

* cited by examiner

Primary Examiner—Cynthia H Kelly
Assistant Examiner—Anca Eoff
(74) Attorney, Agent, or Firm—Birch, Stewart, Kolasch & Birch, LLP

(57) ABSTRACT

An image forming method in which a planographic printing plate precursor having, on a support, an image recording layer containing (A) a polymerization initiator, (B) a polymerizable compound, and (C) a binder polymer, and having photosensitivity in a wavelength range of 250 nm to 420 nm, is subjected to exposure using laser light in the wavelength range of 250 nm to 420 nm, and a one-pixel drawing time is one millisecond or less, a planographic printing plate precursor having the image recording layer which further contains (D) a compound having a polymerizable group and a support adsorptive group, or (F) a filler, and a planographic printing method including development-on-machine, are provided.

7 Claims, 3 Drawing Sheets

IMAGE FORMING METHOD, PLANOGRAPHIC PRINTING PLATE PRECURSOR, AND PLANOGRAPHIC PRINTING METHOD

TECHNICAL FIELD

The present invention relates to an image forming method, a planographic printing plate precursor, and a planographic printing method in the field of printing. More specifically, the present invention relates to an image forming method, a planographic printing plate precursor, and a planographic printing method which employ a light source which emits light having a wavelength in the range of 250 to 420 nm.

BACKGROUND ART

Recently, in the field of planographic printing, a computer-to-plate technique has been developed in which a planographic printing plate precursor is directly subjected to laser exposure, without via a lithographic film, based on digital data from a computer or the like to produce a plate, and a high-sensitivity laser recording type planographic printing plate for use in such a technique has been developed.

However, the conventional high-sensitivity laser recording type planographic printing plate has a problem such that, when it is subjected to exposure using an Ar (488, 514.5 nm) or FD-YAG (532 nm) laser internal drum type platesetter, which is most commonly used on the market, a fog is likely to occur. For example, it is assumed that a negative plate is used as a photosensitive material, and a solid fill image is projected onto the entirety of one side of the plate by exposure. When the other side is a non-image portion, a thin fog (like when development is insufficient) occurs. When the other side is a halftone dot (about 140 to 220° where the other side is at 180° with respect to a light source), a defect, such a thickened dot or the like, occurs. Therefore, there is a demand for an improvement in the conventional technique.

A conventional high sensitivity printing plate for use in plate production using laser, such as Ar laser or FD-YAG laser, may be taken out of a cardboard package under red light, may be loaded into a platesetter cassette, or may be manually inserted into a platesetter. All of these pieces of work need to be performed under dim red light, resulting in considerably poor workability. Compared to this, a typical diazo printing plate can be handled under yellow light or UV-filtered white light, resulting in better workability. Thus, there has been a large demand for an improvement in safe light property of the high sensitivity laser recording planographic printing plate on the market in terms of workability.

To meet these demands, Patent Document 1 describes a method of producing a planographic printing plate by subjecting a planographic printing plate precursor having (A) an aluminum support and (B) a laser photosensitive recording layer to exposure using an internal drum type platesetter which employs semiconductor laser light in the range of ultraviolet to a visible region (360 to 450 nm). According to this plate producing method, it is described that a plate can be handled under yellow light, and a fog does not occur even when exposure is performed using an internal-drum plateset-ter.

On the other hand, in conventional planographic printing plate precursor producing processes, a step of dissolving and removing an unnecessary portion of an image recording layer using a developer solution or the like after exposure, is required. One of the recent challenges is to eliminate or simplify such a wet process which is additionally performed.

As a simple plate producing method which meets this challenge, for example, a method called "development-on-machine" has been proposed in which a planographic printing plate precursor which has an image recording layer capable of being dissolved or dispersed in printing ink and/or fountain solution is used, and printing ink and/or fountain solution are supplied to an exposed plate attached on a printing machine to remove an unexposed portion of the image recording layer, thereby obtaining a planographic printing plate.

Examples of a specific development-on-machine method include: a method of using a planographic printing plate precursor having an image recording layer capable of being dissolved or dispersed in a fountain solution, an ink solvent, or an emulsion of a fountain solution and an ink; a method of physically removing an image recording layer by means of contact with rollers or a blanket of a printing machine; a method of physically removing an image recording layer by means of contact with rollers or a blanket after weakening the aggregation force of the image recording layer or the adhesion force of the image recording layer and a support by means of permeation of a fountain solution, an ink solvent, or the like; and the like.

Note that, as used herein, the term "development step" refers to a step of removing an image recording layer of a planographic printing plate precursor by means of contact with liquid (typically, an alkaline developer solution) using an apparatus (typically, an automatic developing machine) other than a printing machine, thereby exposing a hydrophilic support surface, and the term "development-on-machine" refers to a method and a step of removing an image recording layer of a planographic printing plate precursor by means of contact with liquid (typically, printing ink and/or fountain solution) using a printing machine, thereby uncovering a hydrophilic support surface, unless otherwise specified.

Thus, recently, there is an increasing demand for streamlining of plate producing work in terms of both digitalization and simplification, dry type, and non-process of plate producing work.

To meet this demand, for example, Patent Document 2 describes that a photosensitive composition containing polyvinyl pyrrolidone, polycarboxylic acid polymer, an olefinically unsaturated monomer, a photoinitiator, and the like is used to obtain a printing plate capable of being attached to a printing machine immediately after exposure and without an additional process. However, the photoinitiator used therein has a problem on sensitivity and a fog after exposure.

Patent Document 3 describes a photosensitive planographic printing plate (planographic printing plate precursor) which has a photosensitive layer (image recording layer) having a double-layer structure composed of a photosensitive hydrophilic layer and a photosensitive hydrophobic layer thereon. This photosensitive planographic printing plate can be attached to a printing machine immediately after exposure and without an additional process. However, the adhesion between the upper layer and the lower layer is insufficient, so that printing durability is still poor.

Patent Document 4 describes a planographic printing plate precursor in which an image formation layer obtained by dispersing a hydrophobic thermoplastic polymer particle in a hydrophilic binder is provided on a hydrophilic support. Patent Document 4 also describes that, after exposed with infrared laser, the planographic printing plate precursor can be thermally coalesced with the hydrophobic thermoplastic polymer particle so that an image can be formed, and thereafter, the plate can be attached to a cylinder of a printing machine, followed by development-on-machine using fountain solution and/or ink.

However, it was found that, in the case of the above-described method of forming an image by coalescence of the microparticle due to simple thermal fusion bonding, although good development-on-machine ability is exhibited, image strength is weak, so that printing durability is insufficient.

Therefore, it has been proposed that a reaction in an image recording layer is utilized to improve printing durability. For example, Patent Document 5 describes a negative-type planographic printing plate precursor which employs a photosensitive composition containing a polymer having an acid group or a salt thereof (functional group) and a photocurable functional group, and a photoinitiator, and is usable in printing after exposure without via a development step. Patent Document 6 describes a planographic printing plate precursor which employs a photosensitive composition containing, on a surface-treated aluminum support, (a) a water-soluble or water-dispersible polymer, (b) a monomer or an oligomer having at least one photopolymerizable ethylenically unsaturated double bond, and (c) a specific photopolymerization initiating system having a λmax of 330 nm or more and 375 nm or less, and is usable in printing after exposure without via a development step.

On the other hand, in the field of a photopolymerizable printing plate, it is known that a middle layer containing a compound having a polymerization reactive group and a support adsorptive group is provided between a support and a photopolymerization layer in order to improve the adhesion therebetween.

For example, Patent Document 7 discloses a sol-gel middle layer provided between a support and a photopolymerization layer. Patent Document 8 discloses a sol-gel middle layer to which a phenolic compound or a phosphate compound is added. In these middle layers, a developer solution containing silicate is exclusively used in order to cause silicate to be bound to a non-image portion during development to improve hydrophilicity.

Patent Document 9 discloses a middle layer made of an organic phosphate compound, in which a phosphono group, which is an acidic group, is quickly dissociated during an alkali development process, and loses interaction with a support, and therefore, which is at least partially removed from a non-image portion, or is conferred a high level of hydrophilicity at a surface due to dissociation.

However, all techniques for attempting to achieve both the adhesion between a support and a photopolymerization layer and an improvement in resistance to stain using these adhesive middle layer, are provided based on the assumption of an alkali development action after exposure. When these techniques are applied to a development-on-machine-type planographic printing plate precursor, an improvement in the adhesiveness leads to a degradation in resistance to stain.

On the other hand, when an image recording method which utilizes light of ultraviolet to a visible region is applied to such a non-processed printing plate which does not require a development process using a developer solution, an image recording layer is not fixed and is still kept photosensitive to room light even after exposure. Therefore, after a planographic printing plate precursor is taken out of its package, the plate needs to be handled in a completely light-tight situation or under the environment of safe light until development-on-machine is completed. If otherwise, i.e., for example, if the plate is handled under white light after exposure, a fog occurs in an image recording layer, the layer remains in a non-image portion, leading to printing stain. Therefore, even printing machine work which conventionally does not require safe light needs to be performed under the environment of safe light, resulting in interference with printing work, such as color adjustment or the like. Therefore, there is a demand for a non-processed printing plate system capable of being performed under white light.

[Patent Document 1] JP-A No. 2000-35673
[Patent Document 2] JP-A No. 47-8657
[Patent Document 3] JP-A No. 6-502931
[Patent Document 4] JP-B No. 2938397
[Patent Document 5] International Publication WO96/34316
[Patent Document 6] JP-A No. 2000-39711
[Patent Document 7] JP-A No. 7-159983
[Patent Document 8] JP-A No. 9-269593
[Patent Document 9] JP-A No. 2000-235254

DISCLOSURE OF THE INVENTION

Problems to be Solved by the Invention

The present invention is provided to overcome the above-described drawbacks of conventional techniques. Specifically, an object of the present invention is to provide an image forming method and a planographic printing method with which image recording can be performed using a light source which emits light in the wavelength range of 250 nm to 420 nm, both high sensitivity and white light safety are achieved, and high image quality with a satisfactory level of fine line reproducibility is obtained. Another object of the present invention is to provide a planographic printing plate precursor with which image recording can be performed using a light source which emits light in the wavelength range of 250 nm to 420 nm, printing can be performed by development-on-machine after image recording and without via a development step, and excellent development-on-machine ability, printing durability, and resistance to stain are achieved.

Means for Solving the Problems

1. An image forming method comprising subjecting a planographic printing plate precursor to exposure using laser light in a wavelength range of 250 nm to 420 nm with a one-pixel drawing time of one millisecond or less, wherein the planographic printing plate precursor comprising, on a support, an image recording layer that contains (A) a polymerization initiator, (B) a polymerizable compound, and (C) a binder polymer, and has photosensitivity in the wavelength range of 250 nm to 420 nm.

2. The image forming method of 1, wherein the laser light wavelength is a wavelength selected from 405 nm, 375 nm, 365 nm, 355 nm, and 266 nm.

3. The image forming method of 1, wherein exposure is performed using an optical system comprising: a DMD or GLV modulation element; and a 405 nm or 375 nm-wavelength semiconductor laser.

4. The image forming method of 1, wherein the laser light wavelength is a wavelength selected from 365 nm, 355 nm, and 266 nm, and exposure is performed using an internal drum method.

5. A planographic printing plate precursor comprising, on a support, an image recording layer that contains (A) a polymerization initiator and (B) a polymerizable compound, has photosensitivity in a wavelength range of 250 nm to 420 nm, and is capable of being removed using printing ink and/or fountain solution, wherein (D) a compound having a polymerizable group and a support adsorptive group is contained in at least the image recording layer or another layer.

6. The planographic printing plate precursor of 5, wherein the compound (D) having a polymerizable group and a support adsorptive group is (E) a copolymer having (a1) a repeating unit containing at least one polymerizable group and (a2) a repeating unit containing at least one support adsorptive group.

7. The planographic printing plate precursor of any one of 5 and 6, wherein the compound (D) or the copolymer (E) has a hydrophilicity imparting group.

8. The planographic printing plate precursor of any one of 5 to 7, wherein the polymerization initiator is a compound having an onium ion.

9. A planographic printing plate precursor comprising, on a support, an image recording layer that contains (A) a polymerization initiator, (B) a polymerizable compound, and (F) a filler, and is capable of being removed using printing ink and/or fountain solution, wherein image recording can be performed using a light source which emits light in a wavelength range of 250 nm to 420 nm.

10. The planographic printing plate precursor of 9, wherein the filler has a lipophilic group on a surface thereof.

11. The planographic printing plate precursor of 9 or 10, wherein the filler has a polymerizable functional group on a surface thereof.

12. A planographic printing method comprising: subjecting the planographic printing plate precursor obtained using the image forming method of any one of claims 1 to 4, which has been exposed, to development using a developer solution or development-on-machine performed with supply of printing ink and/or fountain solution; and then printing.

13. A planographic printing method comprising: subjecting the planographic printing plate precursor of any one of claims 5 to 12 to image-like exposure using a light source which emits light in the wavelength range of 250 nm to 420 nm; and then printing with supply of printing ink and fountain solution.

14. The planographic printing method of 13, wherein the light source is a laser.

The action mechanism of the image forming method of the present invention has not been clarified but is inferred as follows. A light source for use in conventional image recording includes an Ar (488, 514.5 nm) or FD-YAG (532 nm) laser, a metal halide lamp, and the like. Such a light source performs image-like exposure using light in the range of 300 to 500 nm. Therefore, a planographic printing plate precursor has photosensitivity in such a range, which significantly overlaps room light having a major light emission band in a visible region. Also, the light source has light irradiation intensity in the range of low illuminance to intermediate illuminance. Thus, exposure is performed using light intensity which is substantially the same as that of room light. Therefore, a reaction occurs similarly, resulting in unnecessary image formation due to room light.

In contrast to this, by shifting an absorption maximum of a photosensitive wavelength to a short wavelength, an overlap with the spectra of light emitted from a white fluorescent lamp used as room light is caused to be small, thereby making it possible to prevent image formation caused by irradiation with a white fluorescent lamp even when the image formation sensitivity of a recording material is sufficiently high (FIGS. 1 and 2). Specifically, by setting a wavelength region to be from 250 nm to 420 nm, the overlap with room light can be minimized, thereby making it possible to suppress unnecessary image formation caused by irradiation with room light.

When a radical polymerization type plate material is subjected to exposure recording, light power required for film formation significantly varies, depending on the rate of an oxygen amount flowing into the film. This is phenomenologically represented as follows.

In general, an amount N of generated radicals is proportional to irradiating exposure energy J.

$$J = c_1 \cdot N \text{ (}c_1\text{ is a factor of proportionality)}$$

Radicals generated with irradiating light are captured by oxygen flowing into the film. The captured amount No is proportional to a flow-in oxygen amount per unit time (q) and an elapsed time from the start of exposure (t).

$$No = c_2 \cdot q \cdot t \text{ (}c_2\text{ is a factor of proportionality)}$$

According to this, exposure energy Jo which generates radicals but is not involved in polymerization is represented as follows.

$$Jo = c_1 \cdot c_2 \cdot q \cdot t$$

Therefore, the exposure energy (irradiation energy) J required for image formation is larger than Jo.

On the other hand, when the amount of radicals generated when exposure is performed for a short time is larger than the flow-in oxygen amount, polymerization is likely to be completed in a short time. Therefore, in this case, irradiation energy Jth is determined without depending on the flow-in oxygen amount.

This relationship is schematically illustrated in FIG. 3, where the horizontal axis indicates a time t (sec) for irradiation and the vertical axis indicates the irradiation energy J. Therefore, when surface exposure is performed for a time of the order of minutes as in conventional techniques, high irradiation energy is required. In contrast to this, if irradiation can be performed for the time region of Jth, image formation can be achieved with low irradiation energy.

According to the present invention, it was found that a region in which Jth is achieved is present when a radical polymerization type plate material is combined with exposure conditions (e.g., high illuminance exposure using high-power UV laser) or a material which causes the amount of generated radicals to be sufficiently large and the polymerization rate to be high when the irradiation time region is one millisecond (msec) or less.

Therefore, it is inferred that, by setting the irradiation time per pixel to be one millisecond or less during image formation, irradiation energy applied to desired image formation can be reduced, and a fog does not occur in a light room illuminated with low illuminance for several minutes or more (under white light) since high irradiation energy is not applied, so that white light safety can also be secured.

EFFECTS OF THE INVENTION

According to the present invention, it is possible to provide an image forming method and a planographic printing method with which image recording can be performed using a light source which emits light in the wavelength range of 250 nm to 420 nm, both high sensitivity and white light safety are achieved, and high image quality with a satisfactory level of fine line reproducibility is obtained. Also, according to the present invention, it is possible to provide a planographic printing plate precursor with which image recording can be performed using a light source which emits light in the wavelength range of 250 nm to 420 nm, printing can be performed by development-on-machine after image recording and without via a development step, and excellent development-on-machine ability, printing durability, and resistance to stain are achieved.

DESCRIPTION OF SYMBOLS

Figure 1:
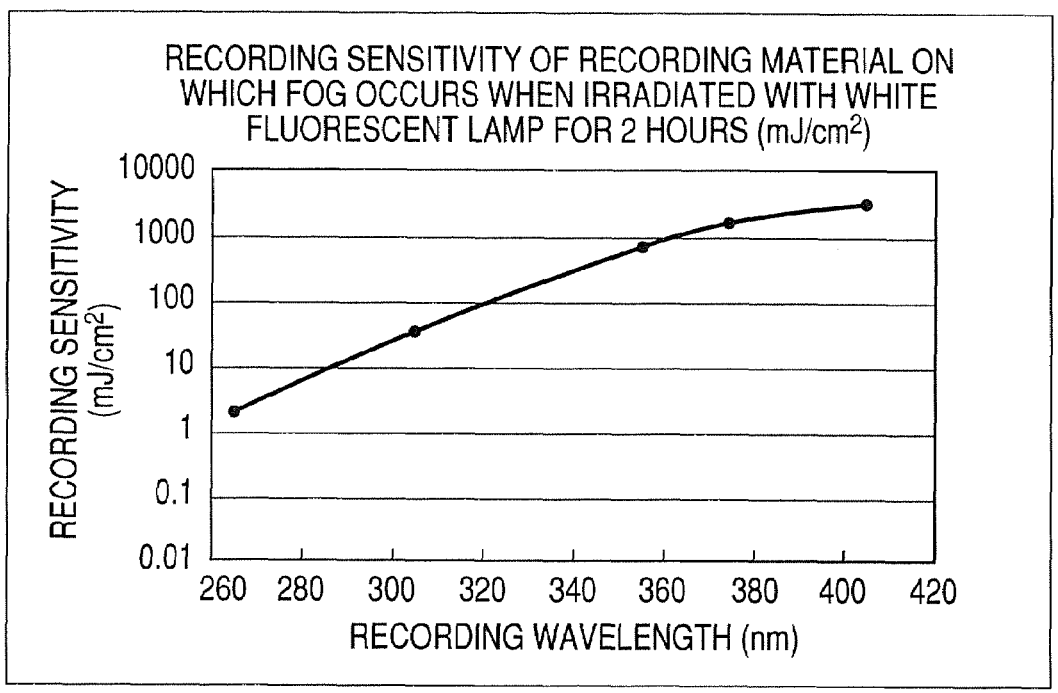
FIG. 1 A diagram illustrating the recording sensitivity of a recording material which causes a fog when irradiated with a white fluorescent lamp for two hours.
Figure 2:
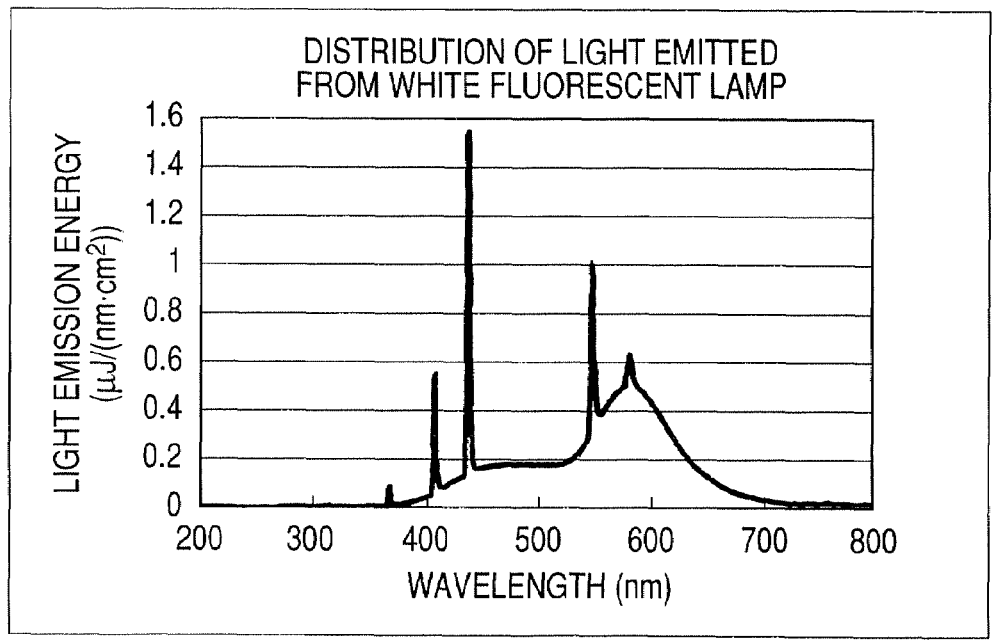
FIG. 2 A diagram illustrating an emitted light distribution of a white fluorescent lamp.
Figure 3:
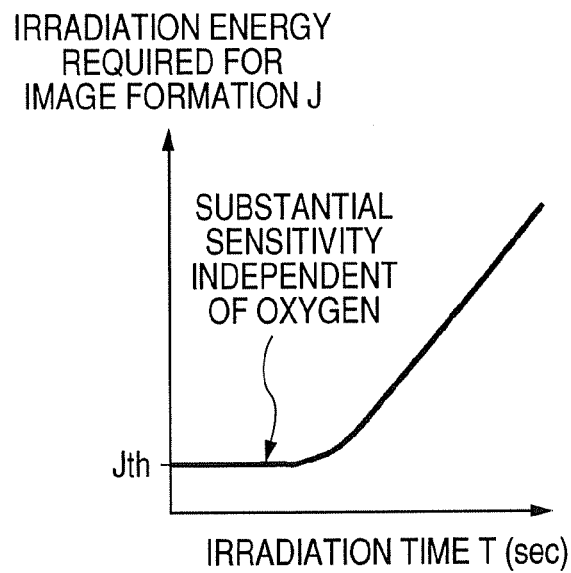
FIG. 3 A diagram illustrating irradiation energy required for image formation with respect to an irradiation time.

1 UV laser
2 optoelectronic modulation element
3 half mirror
4 mirror
5 photodetector
D drum
L1, L2, L3 lens
10 image recording apparatus
12 exposure head
14 drum
16 broad area array laser diode
18 cylindrical lens
20 collimating lens
22, 26 λ/2 plate
24 ferroelectric liquid crystal shutter array
28 analyzer
30, 32 lens
40 controller
50 DMD (space light modulation element)
56 exposed surface
66 fiber array optical system
67 lens system
72 lens system
74 lens system
76 microlens array
78 aperture
80 lens system
82 lens system

BEST MODES FOR CARRYING THE INVENTION

Hereinafter, an exposure method, a planographic printing method, and a planographic printing plate precursor used therein, which relate to an image forming method according to the present invention, will be successively described in detail.

[Exposure Method]

As a scanning exposure method for a planographic printing plate precursor according to the present invention, know methods can be used without limitation. A light source used in the present invention has a wavelength of 250 nm to 400 nm. Specific example of the light source include: gas lasers, such as an Ar ion laser (364 nm, 351 nm, 10 mW to 1 W), a Kr ion laser (356 nm, 351 nm, 10 mW to 1 W), and a He—Cd laser (325 nm, 1 mW to 100 mW); solid lasers, such as a quadruple wave (266 nm, 20 to 100 nW) of a 1064-nm oscillation mode locked solid laser (e.g., YAG, $YVO_4$, etc.), a combination of a waveguide type wavelength conversion element and AlGaAs, InGaAs semiconductor (380 nm to 400 nm, 5 mW to 100 mW), a combination of a waveguide type wavelength conversion element and AlGaInP, AlGaAs semiconductor (300 nm to 350 nm, 5 mW to 100 mW), and AlGaInN (350 nm to 470 nm, 5 mW to 100 mW); pulsed lasers, such as a $N_2$ laser (337 nm, pulse 0.1 to 10 mJ) and XeF (351 nm, pulse 10 to 250 mJ); a triple wave (355 nm, 1 to 4 W) of a 1064-nm oscillation mode locked solid laser (e.g., YAG, $YVO_4$, etc.); and the like.

Among them, particularly preferable lasers are: an AlGaInN semiconductor laser (a commercially available InGaN semiconductor laser: 375 nm or 405 nm, 5 to 100 mW) in terms of capability of high illuminance and short time exposure which can speed up a polymerization rate, and cost; a high power 355-nm laser in terms of productivity; and a 266-nm laser, with which an overlap with the spectra of light emitted from a white fluorescent lamp is smallest and high sensitivity can be achieved, in terms of wavelength suitability.

Examples of a scanning exposure type planographic printing plate exposing apparatus (exposure mechanism) include an internal drum (internal surface drum) type, an external drum (external surface drum) type, and a flat bed type. The internal drum type is preferable in terms of quality and cost. The external surface drum type is preferable in terms of productivity.

Figure 4:
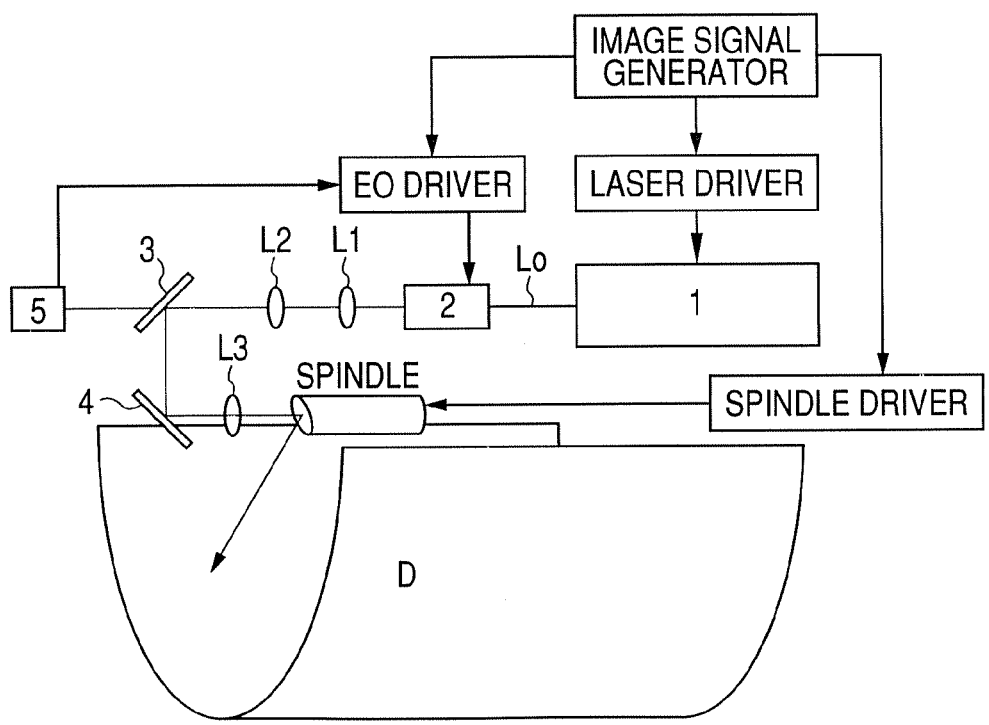
FIG. 4 A conceptual diagram illustrating a cylinder interior surface scanning-type light beam scanning apparatus used in the present invention.

FIG. 4 is a conceptual diagram illustrating a cylinder interior surface scanning-type light beam scanning apparatus according to an embodiment of the present invention. In FIG. 4, 1 indicates a UV laser as light beam output means.

A UV laser beam Lo is intensity-modulated by an optoelectronic modulation element 2, depending on an image signal, and further, a diameter of the beam is increased/changed by lenses L1 and L2 constituting a beam expander. The beam Lo is guided along a center axis of a drum (cylinder) D into the drum D by a half mirror 3 and a mirror 4. A condenser lens L3 and a spinner SP which constitute a scanning optical system are provided on the center axis of the drum D.

The spinner SP has a reflection surface of about 45° with respect to a center axis (axis of rotation) and is rotated with high speed by a motor. Note that a rotary encoder EN is attached to the motor so that an angle ($\theta=\omega t$) of rotation of the spinner SP is detected. Specifically, a pulse signal p which is output every a predetermined angle of rotation, and a reference position signal $p_o$ which indicates a reference position of one revolution, are output. A bean which is guided by the spinner SP is focused through the beam expander EX and the condenser lens L3 provided on the axis of rotation onto an inner circumferential surface of the drum D or a recording sheet S.

Note that the light power of the modulated laser beam can be calibrated by measuring laser light split by a half mirror 3 using a photodetector 5.

In the image recording apparatus, by moving the condenser lens L3 and the spinner SP along the center axis of the drum and in a sub-scanning direction with a constant speed using a moving means (not shown) while causing a condensed beam to scan with high speed using the spinner, a recording medium attached on the inner circumferential surface of the drum D is subjected to two-dimensional scanning exposure using exposure light emitted from the UV laser 1, so that an image corresponding to image data is recorded onto the recording medium.

Figure 5A:
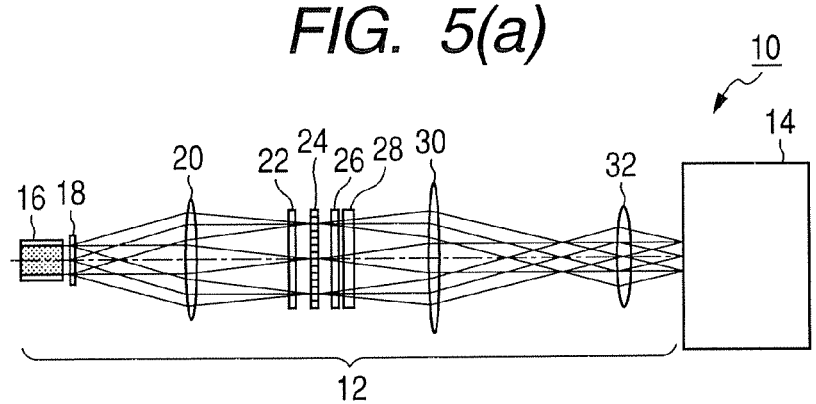
FIGS. 5 (a) and (b) are a top view and a side view illustrating a structure of an external drum type image recording apparatus used in the present invention.
Figure 5B:
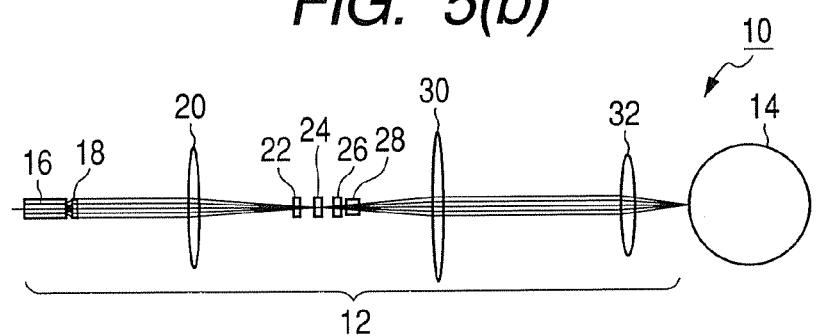

FIG. 5 is a conceptual diagram illustrating an external drum type structure of an image recording apparatus according to an embodiment of the present invention. Here, FIGS. 5(*a*) and 5(*b*) are a top view and a side view of the image recording apparatus 10 of this embodiment. The image recording apparatus 10 modulates light emitted from an illumination light source using a space light modulation element array, depending on image data, and uses the modulated exposure light to record an image corresponding to the image data onto a recording medium. The image recording apparatus 10 comprises the exposure head 12 and a drum 14.

The exposure head 12 generates exposure light which is modulated, depending on image data. The exposure head 12 comprises a broad area array laser diode (hereinafter referred to as a BALD) 16, which is an illumination light source, a cylindrical lens 18, a collimating lens 20, a λ/2 plate 22, a ferroelectric liquid crystal shutter array 24, which is a space light modulation element array, a λ/2 plate 26, an analyzer 28, and two lenses 30 and 32 of a scalable imaging optical system.

As an illumination light source, an LD array in which individual semiconductor laser chips are arranged on a line, as described in JP-A No. 2003-158332, may be used. Laser light emitted from the laser array 16 is converged by the cylindrical lens 18 in a vertical direction in FIG. 5(*b*), is caused by the collimating lens 20 to be light parallel to the vertical direction in FIG. 5(*a*), and is converged in the vertical direction in FIG. 5(*b*), and thereafter enters the λ/2 plate 22.

Following this, the polarized state of the laser light is rotated using the λ/2 plate 22 by 45° with respect to a direction perpendicular to the travel direction, and is modulated by the subsequent ferroelectric liquid crystal shutter array 24, depending on image data. In this case, the polarized state of the laser light transmitted through the ferroelectric liquid crystal shutter array 24 is rotated by 90° using the ferroelectric liquid crystal shutter array 24, and is rotated by 45° using the λ/2 plate 26, and thereafter enters the analyzer 28.

The analyzer 28 transmits only laser light whose polarized state is rotated by a predetermined angle, and blocks other laser light. The laser light transmitted through the analyzer 28 is imaged on a recording medium attached on the drum 14 by a predetermined scaling factor using the two lenses 30 and 32 of the scalable imaging optical system.

The exposure head 12 is moved in a sub-scanning direction (an axial direction of the drum 14) with a predetermined constant speed while emitting exposure light which is modulated, depending on image data, during recording of an image onto a recording medium.

The drum 14 is a support for a recording medium. During recording of an image onto a recording medium, the recording medium is attached on an outer circumferential surface of the drum 14, and the drum 14 is rotated in a predetermined direction (a direction opposite to a main scanning direction) with a predetermined constant speed.

In the image recording apparatus 10, by moving the exposure head 12 in the sub-scanning direction with a predetermined constant speed using a moving means (not shown) for the exposure head 12 while rotating the drum 14 in a direction opposite to the main scanning direction with a predetermined constant speed using a rotating means (not shown) for the drum 14, the recording medium attached on the outer circumferential surface of the drum 14 is subjected to two-dimensional scanning exposure with exposure light emitted from the exposure head 12, so that an image corresponding to image data is recorded onto the recording medium.

Note that SLM is not limited to the ferroelectric liquid crystal shutter array 24, and either a conventional known transmission type or reflection type SLM can be used, including, for example, GLV (grating light valve), DMD (digital micromirror device), and the like. Also, the support for a recording medium is not limited to the drum 14 and may be a flat plate.

Also in the embodiment of FIG. 5, as a space light modulation element array, the ferroelectric liquid crystal shutter array 24, which performs line modulation, is used, and the exposure head 12 and the drum 14 are relatively moved to subject a recording material to two-dimensional scanning exposure. However, the present invention is not limited to this. As a space light modulation element array, for example, one which can perform surface modulation can be used to enlarge/reduce exposure light at a predetermined scaling factor, thereby making it possible to perform surface exposure by one operation without scanning a recording material.

As an external drum method, a multichannel exposure method which employs an optical system composed of a combination of a space modulation element (e.g., a DMD modulation element, a GLV modulation element, etc.) and a 375- or 405-nm semiconductor laser, is advantageous and preferable in terms of high productivity and low cost.

Also, an internal drum method which employs laser light having a wavelength selected from 365 nm, 355 nm, and 266 nm, is advantageous and preferable in terms of high-speed exposure and low cost.

Note that an optical system used in combination with a DMD modulation element is described in JP-A No. 2004-012899, and an optical system used in combination with a GLV modulation element is described in JP-A No. 2000-168136, JP-A No. 2001-162866, and the like.

A pixel residence time is preferably as short as possible in order to minimize a competitive reaction with oxygen, and is preferably one millisecond or less, more preferably 500 μsec or less, and most preferably 100 μsec or less. When the pixel residence time exceeds one millisecond, polymerization is significantly inhibited by oxygen, resulting in a degradation in image formation.

[Planographic Printing Method]

In the planographic printing method of the present invention, as described above, the planographic printing plate precursor of the present invention is subjected to image-like exposure, printing is performed with supply of oil ink and a water component with or without via a development process.

<Development Process>

As a developer solution for use in a development process with a developer solution, a conventionally known alkali aqueous solution can be used. Examples of the alkali aqueous solution include: inorganic alkali agents, such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium acid carbonate, potassium acid carbonate, ammonium acid carbonate, sodium borate, potassium borate, ammonium borate, sodium hydroxide, ammonium hydroxide, potassium hydroxide, lithium hydroxide, and the like; and organic alkali agents, such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneamine, ethylenediamine, pyridine, and the like.

These alkali agents are used singly or in combination of two or more thereof. Among the above-described alkali aqueous solutions, a developer solution which exhibits the effect of the present invention to a higher extent is an aqueous solution of pH 12 or more containing alkali metal silicate. The alkali metal silicate aqueous solution can adjust development ability by changing the ratio of silicon oxide $SiO_2$ (silicate component) to alkali metal oxide $M_2O$ (generally represented with a molar ratio $[SiO_2]/[M_2O]$) and their concentrations. For example, a sodium silicate aqueous solution having a molar ratio $SiO_2/Na_2O$ of 1.0 to 1.5 (i.e., $[SiO_2]/[Na_2O]$ is 1.0 to 1.5) and a $SiO_2$ content of 1 to 4% by mass, as disclosed in JP-A No. 54-62004; and alkali metal silicate having a $[SiO_2]/[M]$ of 0.5 to 0.75 (i.e., $[SiO_2]/[M_2O]$ is 1.0 to 1.5) and a $SiO_2$ concentration of 1 to 4% by mass (the developer solution containing 20% by mass potassium where the gram atoms of all alkali metals present therein are used as a reference), as disclosed in JP-B No. 57-7427, are preferably used. The developer solution preferably has a pH in the range of 9 to 13.5, more preferably 10 to 13. The developer solution preferably has a temperature of 15 to 40° C., more preferably 20 to 35° C. The development time is preferably 5 to 60 sec, more preferably 7 to 40 sec.

Further, it is known that, when the planographic printing plate precursor is developed using an automatic developing machine, a large amount of planographic printing plate precursor can be processed without exchanging a developer solution in a development tank for a long time by adding, to the developer solution, an aqueous solution (refill solution) which has a higher alkali strength than that of the developer solution. This refill method is preferably applied to the present invention. For example, a method as disclosed in JP-A No. 54-62004 in which a sodium silicate aqueous solution having a $SiO_2$ content of 1 to 4% by mass is used (the developer solution has a molar ratio $SiO_2/Na_2O$ of 1.0 to 1.5, i.e., $[SiO_2]/[Na_2O]$ is 1.0 to 1.5), and a sodium silicate aqueous solution (refill solution) having a molar ratio $SiO_2/Na_2O$ of 0.5 to 1.5 (i.e., $[SiO_2]/[Na_2O]$ is 0.5 to 1.5) which is continuously or intermittently changed, depending on the processed amount of planographic printing plate precursor, is added to the developer solution; and a development method as disclosed in JP-B No. 57-7427 in which an alkali metal silicate developer solution having a $[SiO_2]/[M]$ of 0.5 to 0.75 (i.e., $[SiO_2]/[M_2O]$ is 1.0 to 1.5) and having a $SiO_2$ concentration of 1 to 4% by mass is used, alkali metal silicate used as a refill solution has a $[SiO_2]/[M]$ of 0.25 to 0.75 (i.e., $[SiO_2]/[M_2O]$ is 0.5 to 1.5), and both the developer solution and the refill solution contain at least 20% by mass potassium where the gram atoms of all alkali metals present therein are used as a reference, are preferably used.

The planographic printing plate precursor which has been subjected to the development process in this manner, is subjected to a postprocess using washing water, a rinse solution containing a surfactant or the like, and an antisensitizer solution containing gum arabic, a starch derivative, or the like, as described in JP-A Nos. 54-8002, 55-115045, and 59-58431, and the like. The postprocess of the planographic printing plate precursor of the present invention can be a combination of these processes. The planographic printing plate obtained by such a process is loaded into an offset printing machine and is used for printing of a number of sheets. As a plate cleaner used for removal of stain on the plate during printing, a conventionally known plate cleaner for a PS plate is used, including, for example, C1-1, C1-2, CP, CN-4, CN, CG-1, PC-1, SR, IC (manufactured by Fuji Photo Film Co., Ltd.), and the like.

In a planographic printing plate precursor producing process for use in the plate producing method of the present invention, an entire surface of the plate may be heated before exposure, during exposure, or during from exposure to development, as required. By heating in this manner, an image formation reaction is promoted in the image recording layer, advantageously resulting in an improvement in sensitivity and printing durability and stabilization of sensitivity. Further, it is effective to subject a developed image to entire surface heating or entire surface exposure in order to improve image strength and printing durability. Typically, heating before development is preferably performed under mild conditions where the heating temperature is 150° C. or less. If the temperature is excessively high, a fog occurs even in an unexposed portion, for example. Heating after development is performed under considerably strong conditions where the heating temperature is typically 200 to 500° C. If the temperature is low, a sufficient image enhancing action is not obtained. If the temperature is excessively high, a support is degraded and an image portion is thermally decomposed.

<Development-on-Machine Process>

Specific examples of a method of performing printing without via a development step include a method in which a planographic printing plate precursor is exposed, and thereafter, is attached to a printing machine, followed by printing without via a development step; a method in which a planographic printing plate precursor is attached to a printing machine, and thereafter, is exposed on the printing machine, directly followed by printing; and the like.

In the image recording layer of the planographic printing plate precursor which has been subjected to image-like exposure, an exposed portion thereof becomes insoluble due to polymerization curing. When printing is performed with the supply of oil ink and a water component without subjecting the exposed planographic printing plate precursor to a development process, such as a wet development step or the like, an uncured image recording layer is dissolved or dispersed in the oil ink and/or the water component and is thus removed, so that a hydrophilic support surface is uncovered at that portion. On the other hand, at the exposed portion, the image recording layer cured by polymerization remains to form an oil ink accepting portion (image portion) having lipophilic surface.

As a result, the water component adheres to the uncovered hydrophilic surface, while the oil ink adheres to the image recording layer in the exposed region, and printing is started. Here, although either the water component or the oil ink is first supplied onto a plate surface, it is preferable that the oil ink be supplied first in terms of prevention of the water component from being contaminated with the unexposed image recording layer. As the water component and the oil ink, typical fountain solution and printing ink for planographic printing are used.

Thus, the planographic printing plate precursor is subjected to development-on-machine on an offset printing machine, and is directly used for printing of a number of sheets.

[Planographic Printing Plate Precursor]

Hereinafter, components constituting a planographic printing plate precursor used in the present invention will be described.

<(A) Polymerization Initiator>

A polymerization initiator used in the present invention is a compound which generates radicals due to light energy, thereby starting and promoting polymerization of a compound having a polymerizable unsaturated group, particularly, a compound which is used singly or in combination with a sensitizer described below and absorbs light of 250 nm to 420 nm to generate radicals. As such a light radical generating agent, a known polymerization initiator, a compound which has a bond having a small level of bond dissociation energy, or the like, can be selected and used as appropriate.

Note that the emitted light spectral intensity of white light is strong in a visible region of higher than 400 nm, and therefore, when a polymerization initiator having photosensitivity sufficient for such a region is used, a fog is likely to occur under white light. Therefore, it is preferable that the initiator and the sensitizer have an absorption maximum of 400 nm or less.

Examples of the above-described compound which generates radicals include an organic halogen compound, a carbonyl compound, an organic peroxide, an azo compound, an azide compound, a metallocene compound, a hexaarylbiimidazole compound, an organic boron compound, a disulfone compound, an oxime ester compound, and an onium salt compound.

Specific examples of the above-described organic halogen compound include those described in Wakabayashi et al., "Bull Chem. Soc Japan", 42, 2924 (1969), U.S. Pat. No. 3,905,815, JP-B No. 46-4605, JP-A Nos. 48-36281, 53-133428, 55-32070, 60-239736, 61-169835, 61-169837, 62-58241, 62-212401, 63-70243, and 63-298339, and M. P. Hutt, "Journal of Heterocyclic Chemistry", 1 (No 3), (1970). Among them, an oxazole compound and a S-triazine compound which are substituted with a trihalomethyl group are preferable.

A s-triazine derivative in which at least one mono-, di-, or trihalogen substituted methyl group is linked to a s-triazine ring, and an oxadiazole derivative in which at least one mono-, di-, or trihalogen substituted methyl group is linked to an oxadiazole ring, are more preferable. Specific examples of such compounds include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, compounds described below, and the like.

[Chem. 1]

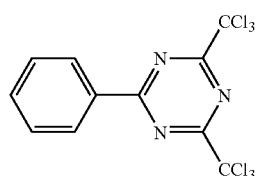

(I)-1

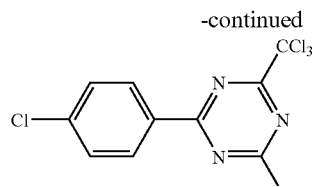

(I)-2

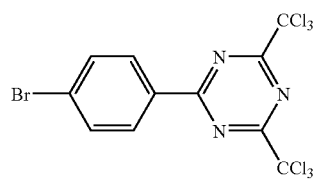

(I)-3

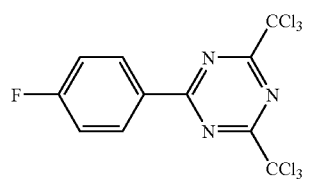

(I)-4

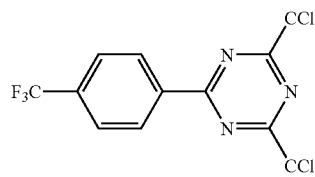

(I)-5

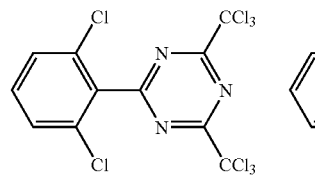 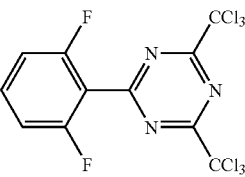

(I)-6     (I)-7

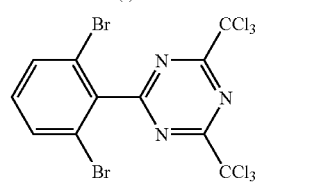

(I)-8

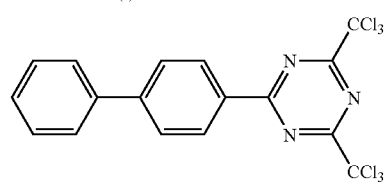

(I)-9

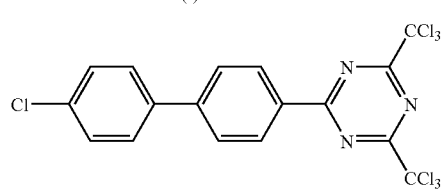

(I)-10

-continued
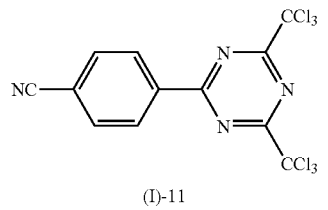
(I)-11
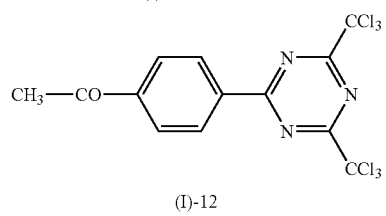
(I)-12
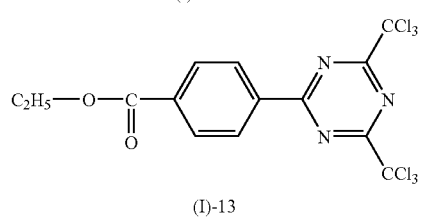
(I)-13
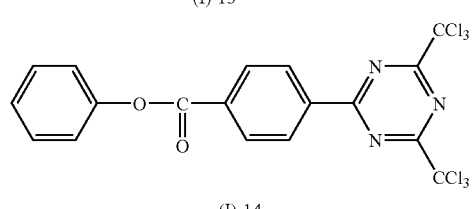
(I)-14
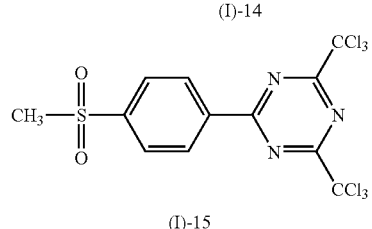
(I)-15
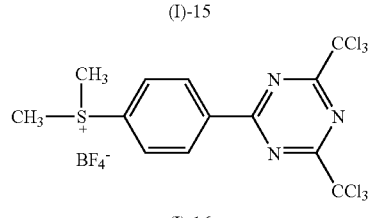
(I)-16
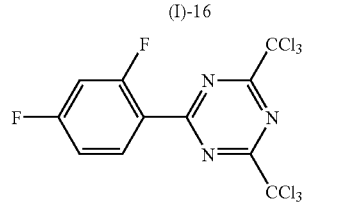
(I)-17
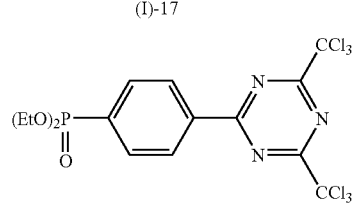
(I)-18
-continued
[Chem. 2]
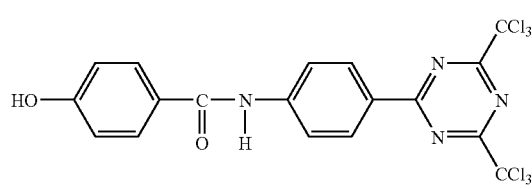
(I)-19
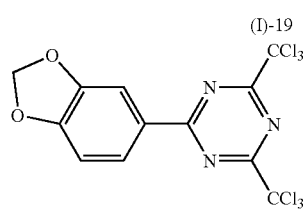
(I)-20
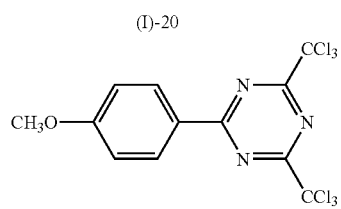
(I)-21
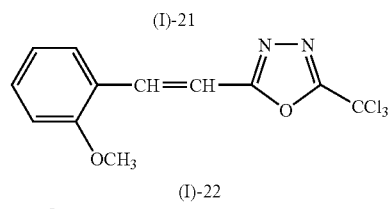
(I)-22
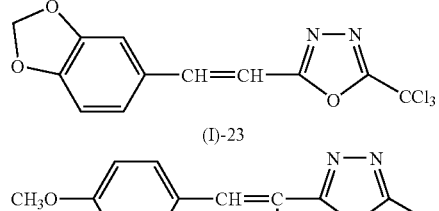
(I)-23
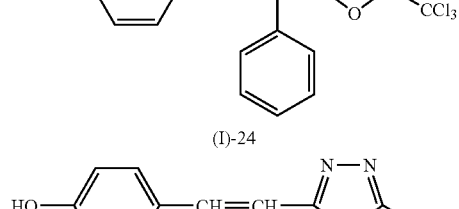
(I)-24
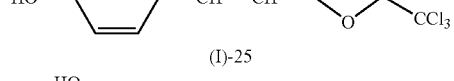
(I)-25
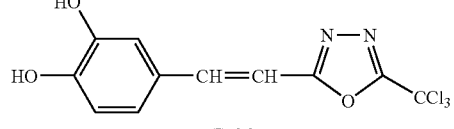
(I)-26
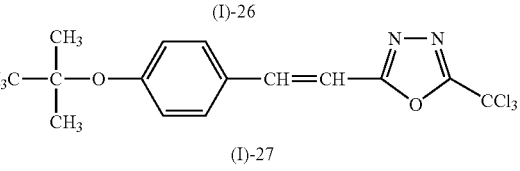
(I)-27
Examples of the above-described carbonyl compound include: benzophenone derivatives, such as phenone, 3-methylbenzophenone, 4-methylbenzophenone, 2-chlorobenzophenone, 4-bromobenzophenone, 2-carboxybenzophenone, and the like; acetophenone derivatives, such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4-(methylthio)phenyl)-2-morpholino-1-propanone, 1,1,1-trichloromethyl-(p-butylphenyl)ketone, and the like; thioxanthone derivatives, such as thioxanthone, 2-ethylthioxanthone, 2-isopropylthioxanthone, 2-chlorothioxanthone, 2,4-dimethyl thioxanthone, 2,4-diethylthioxanthone, 2,4-diisopropylthioxanthone, and the like; benzoic ester derivatives, such as ethyl-p-dimethylaminobenzoate, ethyl-p-diethylaminobenzoate, and the like.

Examples of the above-described azo compound include an azo compound described in JP-A No. 8-108621, and the like.

Examples of the above-described organic peroxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethyl hexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxylaurate, tercylcarbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyldi(t-butylperoxydihydrogendiphthalate), carbonyldi(t-hexylperoxydihydrogendiphthalate), and the like.

Examples of the above-described metallocene compound include: various titanocene compounds described in JP-A Nos. 59-152396, 61-151197, 63-41484, 2-249, 2-4705, and 5-83588, such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-]-yl, iron arene complex described in JP-A Nos. 1-304453 and 1-152109, and the like.

Examples of the above-described hexaarylbiimidazole compound includes various compounds described in JP-B No. 6-29285, U.S. Pat. Nos. 3,479,185, 4,311,783, and 4,622,286, and the like, such as, specifically, 2,2'-bis(o-chlorophenyl)-4,4',5,5'-tetraphenylbiimidazole, 2,2'-bis(o-bromophenyl))-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(0,0'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and the like.

Examples of the above-described organic boron compound include: organic borates described in JP-A Nos. 62-143044, 62-150242, 9-188685, 9-188686, 9-188710, 2000-131837, and 2002-107916, JP-B No. 2764769, JP-A No. 2002-116539, Kunz, Martin "Rad Tech '98. Proceeding Apr. 19-22, 1998, Chicago", and the like; organic boron sulfonium complexes or organic boron oxosulfonium complexes described in JP-A Nos. 6-157623, 6-175564, and No. 6-175561; organic boron iodonium complexes described in JP-A Nos. 6-175554 and 6-175553; organic boron phosphonium complexes described in JP-A No. 9-188710; organic boron transition metal-coordinate complexes described in JP-A Nos. 6-348011, 7-128785, 7-140589, 7-306527, 7-292014, and the like; and the like.

Examples of the above-described disulfone compound include compounds described in JP-A Nos. 61-166544 and 2003-328465, and the like.

Examples of the above-described oxime ester compound include compounds described in J. C. S. Perkin II (1979) 1653-1660, J. C. S. Perkin II (1979) 156-162, Journal of Photopolymer Science and Technology (1995) 202-232, and JP-A Nos. 2000-66385 and 2000-80068, such as, specifically, compounds represented by the following structural formulas.

[Chem. 3]

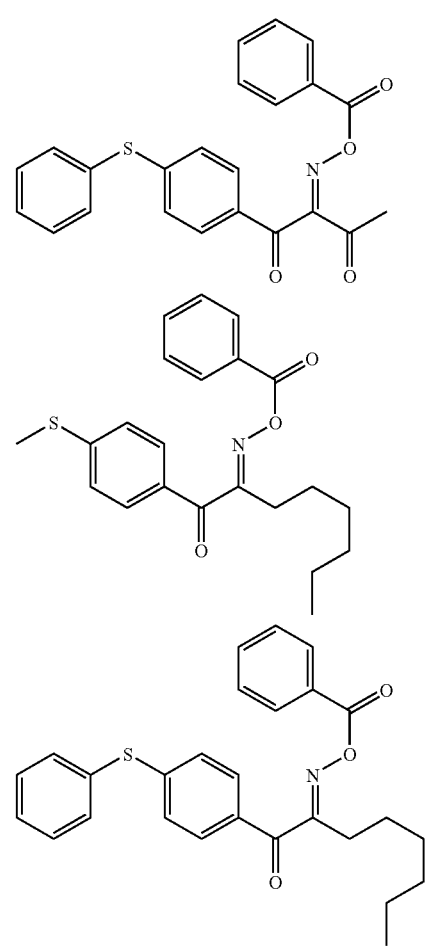

-continued
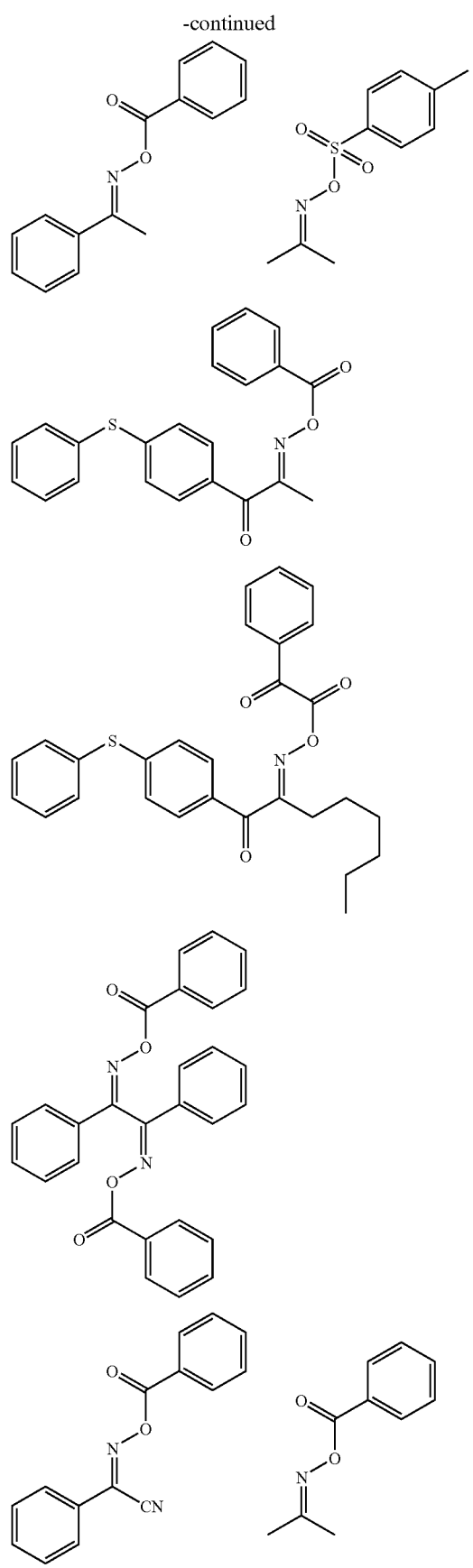
-continued
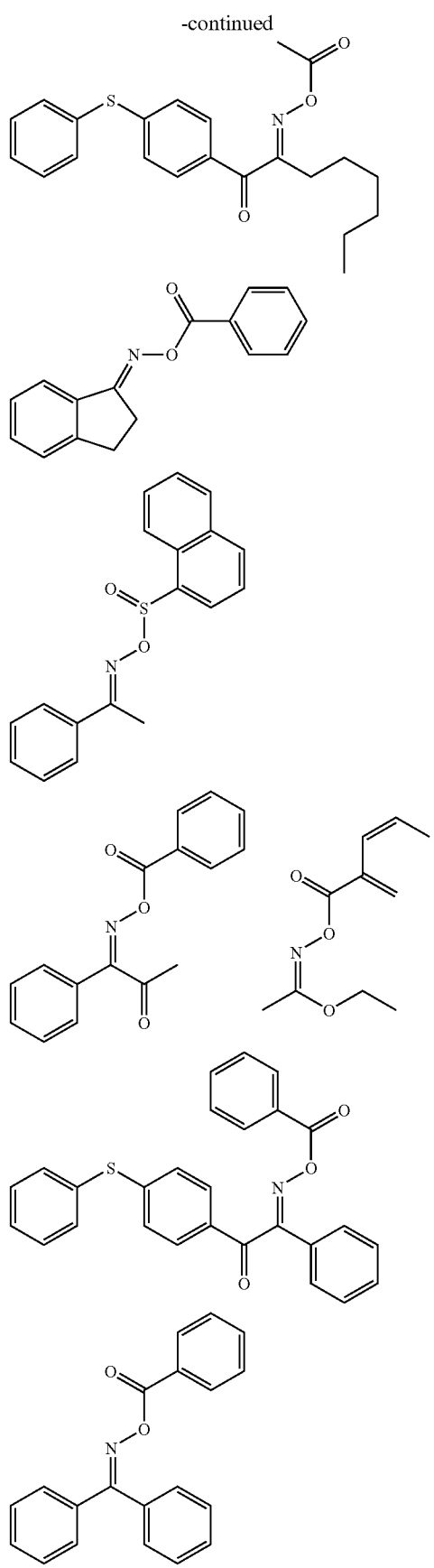

-continued

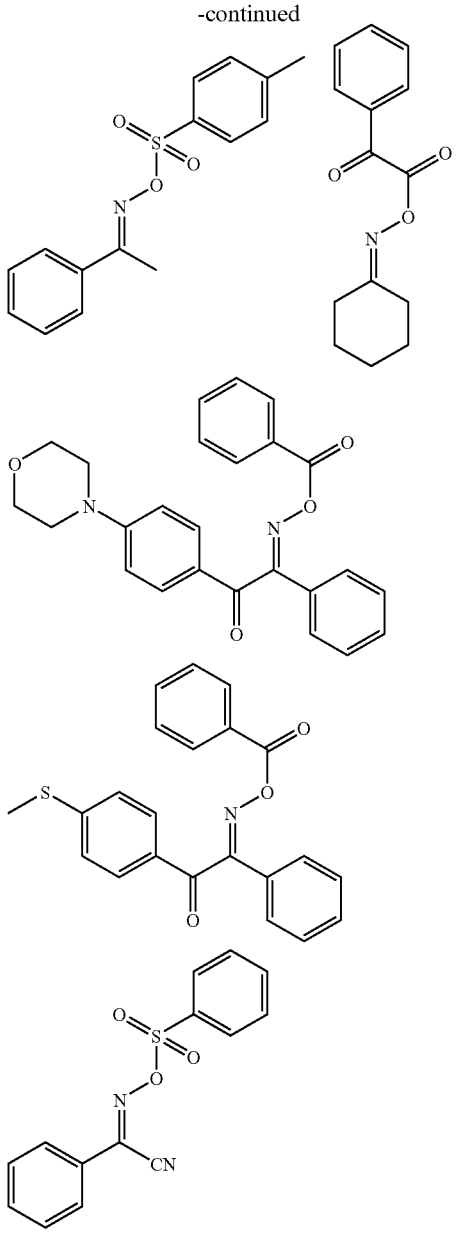

Examples of the above-described onium salt compound include: diazonium salts described in S. I. Schlesinger, Photogr. Sci. Eng., 18, 387 (1974) and T. S. Bal et al., Polymer, 21, 423 (1980); ammonium salts described in U.S. Pat. No. 4,069,055, JP-A No. 4-365049, and the like; phosphonium salts described in U.S. Pat. Nos. 4,069,055 and 4,069,056; iodonium salts described in European Patent No. 104,143, U.S. Pat. Nos. 339,049 and 410,201, and JP-A Nos. 2-150848 and 2-296514; sulfonium salts described in European Patent Nos. 370,693, 390,214, 233,567, 297,443, and 297,442, U.S. Pat. Nos. 4,933,377, 161,811, 410,201, 339,049, 4,760,013, 4,734,444, and 2,833,827, and German Patent Nos. 2,904,626, 3,604,580, and 3,604,581; selenonium salts described in J. V. Crivello et al., Macromolecules, 10(6), 1307 (1977) and J. V. Crivello et al., J. Polymer Sci., Polymer Chem. Ed., 17, 1047 (1979); arsonium salts described in C. S. Wen et al., Teh, Proc. Conf. Rad. Curing ASIA, p. 478, Tokyo, October (1988); and the like.

In the present invention, these onium salts serve as ionic radical polymerization initiators but not as acid generators.

Onium salts preferably used in the present invention are represented by the following general formulas (RI-I) to (RI-III).

[Chem. 4]

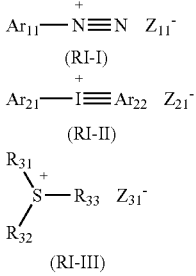

In the formula (RI-I), $Ar_{11}$ represents an aryl group having 20 or less carbon atoms and optionally having 1 to 6 substituents. Preferable examples of the substituent include alkyl groups having 1 to 12 carbon atoms, alkenyl groups having 1 to 12 carbon atoms, alkynyl groups having 1 to 12 carbon atoms, aryl groups having 1 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkylamido groups or arylamido groups having 1 to 12 carbon atoms, a carbonyl group, a carboxyl group, a cyano group, a sulfonyl group, thioalkyl groups having 1 to 12 carbon atoms, and thioaryl groups having 1 to 12 carbon atoms. $Z_{11}^-$ represents a monovalent anion, specifically including halogen ions, a perchlorate ion, a hexafluorophosphate ion, a tetrafluoroborate ion, a sulfonate ion, a sulfinate ion, a thiosulfonate ion, and a sulfate ion. From the viewpoint of stability, a perchlorate ion, a hexafluorophosphate ion, a tetrafluoroborate ion, a sulfonate ion, and a sulfinate ion are preferable.

In the formula (RI-II), $Ar_{21}$ and $Ar_{22}$ each independently represent an aryl group having 20 or less carbon atoms and optionally having 1 to 6 substituents. Preferable examples of the substituent include alkyl groups having 1 to 12 carbon atoms, alkenyl groups having 1 to 12 carbon atoms, alkynyl groups having 1 to 12 carbon atoms, aryl groups having 1 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkylamido groups or arylamido groups having 1 to 12 carbon atoms, a carbonyl group, a carboxyl group, a cyano group, a sulfonyl group, thioalkyl groups having 1 to 12 carbon atoms, and thioaryl groups having 1 to 12 carbon atoms. $Z_{21}^-$ represents a monovalent anion, specifically including halogen ions, a perchlorate ion, a hexafluorophosphate ion, a tetrafluoroborate ion, a sulfonate ion, a sulfinate ion, a thiosulfonate ion, and a sulfate ion. From the viewpoints of stability and reactivity, a perchlorate ion, a hexafluorophosphate ion, a tetrafluoroborate ion, a sulfonate ion, a sulfinate ion, and a carboxylate ion are preferable.

In the formula (RI-III), $R_{31}$, $R_{32}$, and $R_{33}$ each independently represent an aryl group, an alkyl group, an alkenyl group, or an alkynyl group having 20 or less carbon atoms and optionally having 1 to 6 substituents. From the viewpoints of stability and reactivity, an aryl group is preferable. Preferable examples of the substituent include alkyl groups having 1 to 12 carbon atoms, alkenyl groups having 1 to 12 carbon atoms, alkynyl groups having 1 to 12 carbon atoms, aryl groups having 1 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkylamido groups or arylamido groups having 1 to 12 carbon atoms, a carbonyl group, a carboxyl group, a cyano group, a sulfonyl group, thioalkyl groups having 1 to 12 carbon atoms, and thioaryl groups having 1 to 12 carbon atoms. $Z_{31}^-$ represents a monovalent anion, specifically including halogen ions, a perchlorate ion, a hexafluorophosphate ion, a tetrafluoroborate ion, a sulfonate ion, a sulfinate ion, a thiosulfonate ion, and a sulfate ion. From the viewpoints of stability and reactivity, a perchlorate ion, a hexafluorophosphate ion, a tetrafluoroborate ion, a sulfonate ion, a sulfinate ion, and a carboxylate ion are preferable. A carboxylate ion described in JP-A No. 2001-343742 is preferable, and a carboxylate ion described in JP-A No. 2002-148790 is particularly preferable.

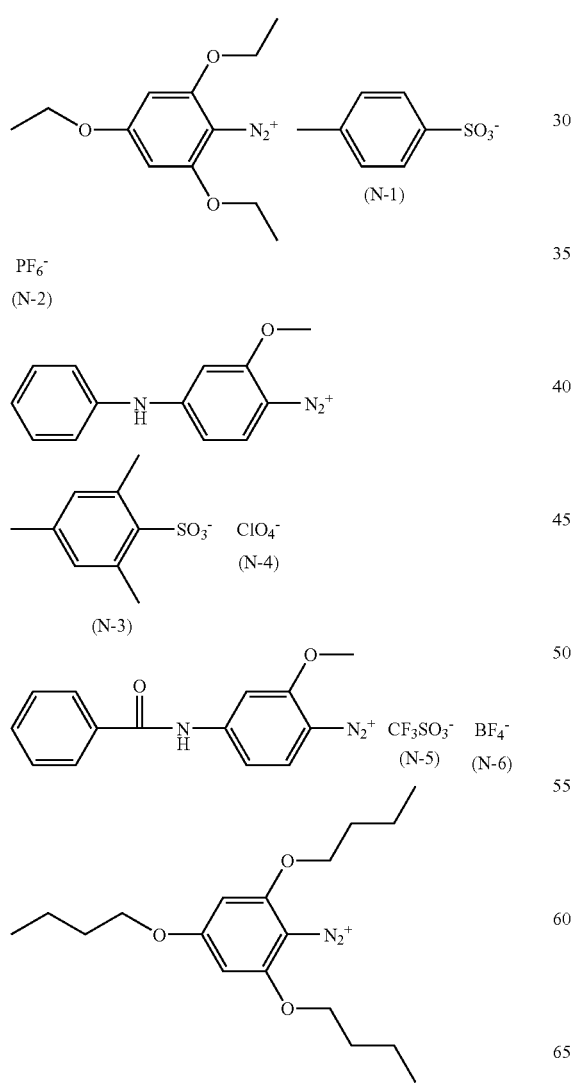

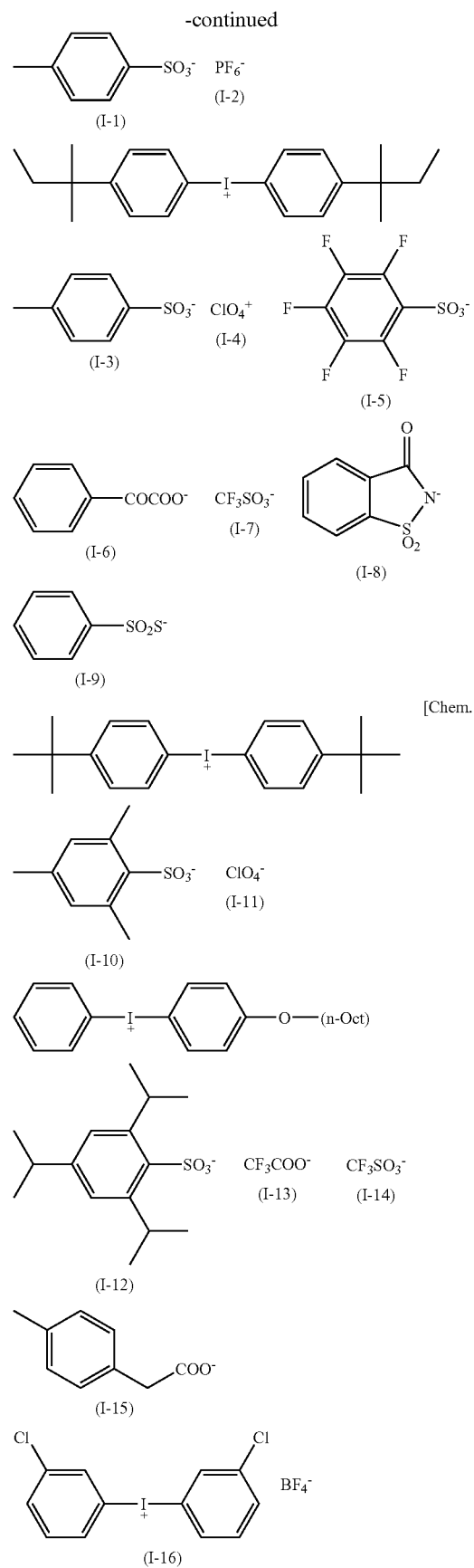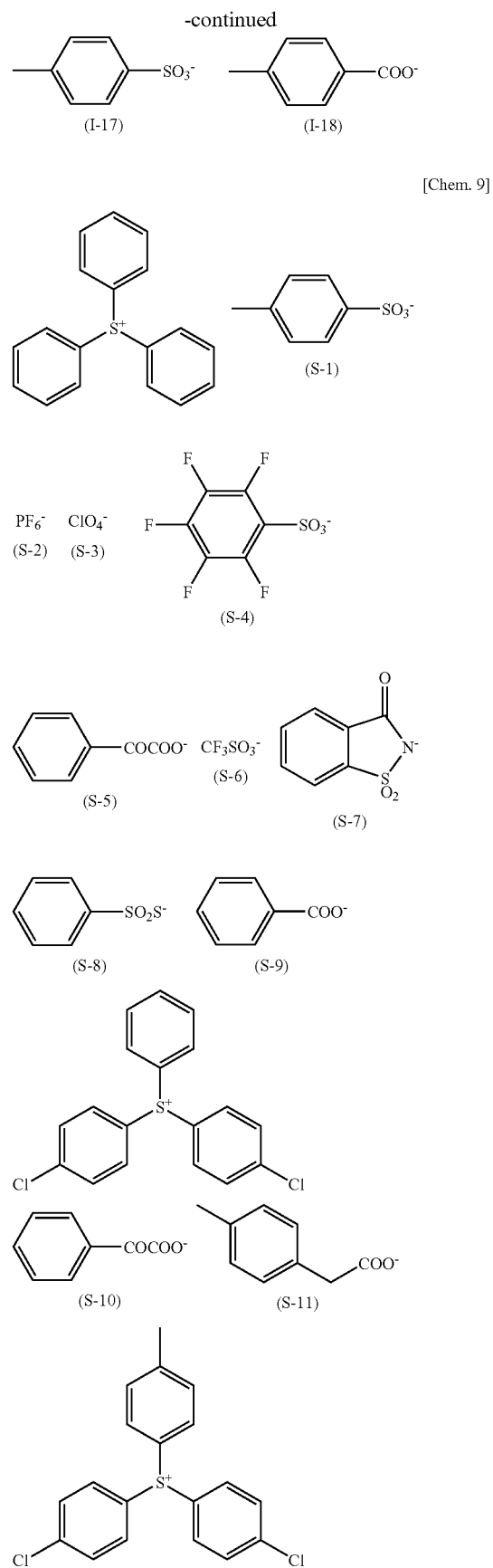

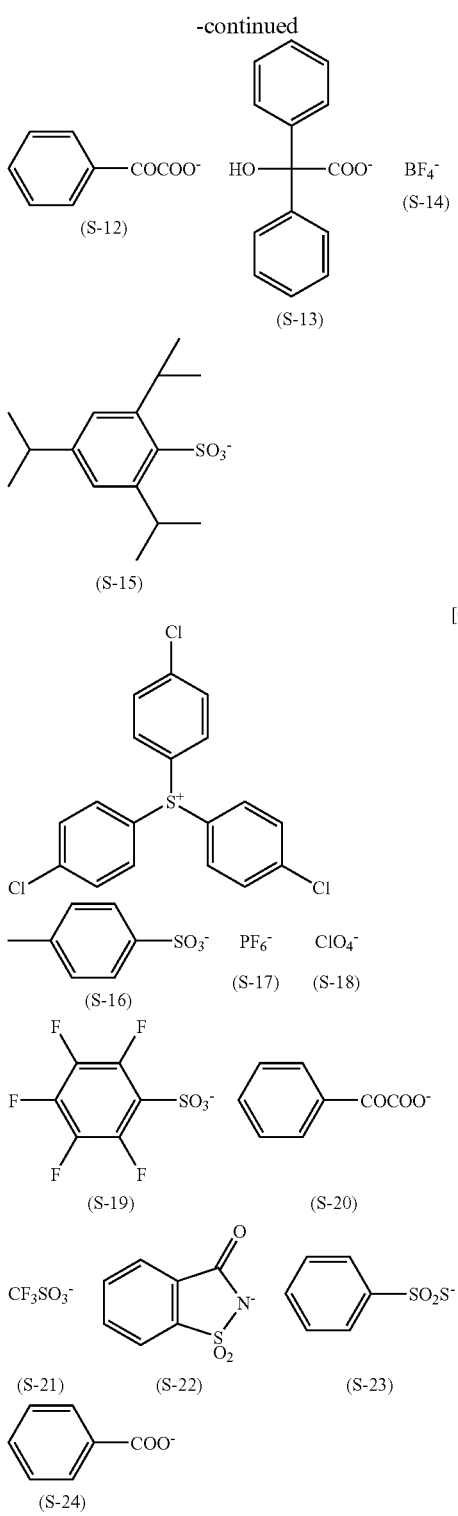

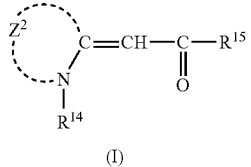

The polymerization initiator is not limited to the above-described compounds. Particularly, from the viewpoints of reactivity and stability, a triazine initiator, an organic halogen compound, an oxium ester compound, a diazonium salt, an iodonium salt, and a sulfonium salt are more preferable since they generate a large amount of radicals by short-time exposure.

It is preferable that these polymerization initiators (i.e., a triazine initiator, an organic halogen compound, an oxime ester compound, a diazonium salt, an iodonium salt, and a sulfonium salt) be used in combination with a sensitizer (hereinafter also referred to as a sensitizing coloring matter). By using the polymerization initiator in combination with the sensitizer, the photopolymerization rate can be increased.

Examples of the sensitizer include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methyl xanthone, 2-methoxy xanthone, thioxanthone, benzyl, dibenzyl acetone, p-(dimethylamino)phenyl styryl ketone, p-(dimethylamino)phenyl p-methyl styryl ketone, benzophenone, p-(dimethylamino)benzophenone (or Michler's ketone), p-(diethylamino)benzophenone, benzanthrone, and the like.

An example of a preferable sensitizer used in the present invention is a compound represented by the following formula (I) described in JP-B No. 51-48516.

[chem. 11]

$$\begin{matrix} Z^2 \\ \diagdown \\ N \\ | \\ R^{14} \end{matrix} C=CH-\underset{\underset{O}{\parallel}}{C}-R^{15}$$

(I)

In the formula, $R^{14}$ represents an alkyl group (e.g., a methyl group, an ethyl group, a propyl group, etc.) or a substituted alkyl group (e.g., a 2-hydroxyethyl group, a 2-methoxyethyl group, a carboxymethyl group, a 2-carboxyethyl group, etc.). $R^{15}$ represents an alkyl group (e.g., a methyl group, an ethyl group, etc.) or an aryl group (e.g., a phenyl group, a p-hydroxyphenyl group, a naphthyl group, a thienyl group, etc.).

$Z^2$ represents a non-metallic atom group required for forming a heterocyclic nucleus containing nitrogen, the heterocyclic nucleus being typically used in a cyanine coloring matter. Examples of the heterocyclic nucleus include benzothiazoles (benzothiazole, 5-chlorobenzothiazole, 6-chlorobenzothiazole, etc.), naphthothiazoles (α-naphthothiazole, β-naphthothiazole, etc.), benzoselenazoles (benzoselenazole, 5-chlorobenzoselenazole, 6-methoxybenzoselenazole, etc.), naphthoselenazoles (α-naphthoselenazole, β-naphthoselenazole, etc.), benzoxazoles (benzoxazole, 5-methyl benzoxazole, 5-phenyl benzoxazole, etc.), and naphthoxazoles (α-naphthoxazole, β-naphthoxazole, etc.).

Specific examples of the compound represented by the general formula (I) include compounds having a chemical structure having a combination of $Z^2$, $R^{14}$, and $R^{15}$. There are a number of known compounds represented by the formula (I). Therefore, the sensitizer may be selected from the known compounds as appropriate. Preferable examples of the sensitizer used in the present invention further include a merocyanine coloring matter described in JP-B 5-47095 and ketocoumarin compounds represented by the following general formula (II).

[Chem. 12]

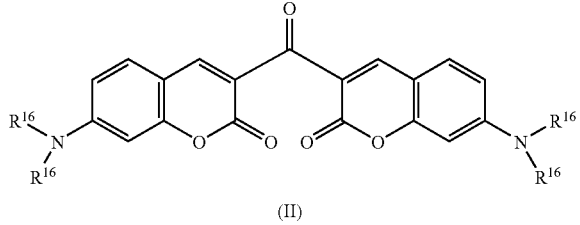

(II)

In the general formula (II), $R^{16}$ represents an alkyl group, such as a methyl group, an ethyl group, or the like.

As the sensitizer, merocyanine coloring matters described in JP-A 2000-147763 can also be used. Specifically, the following compounds may be used.

[Chem. 13]

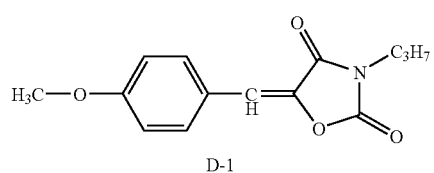

D-1

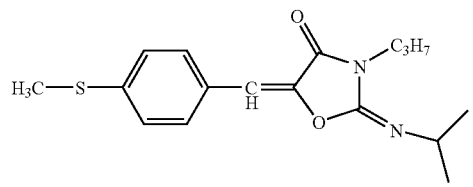

D-2

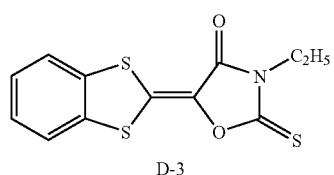

D-3

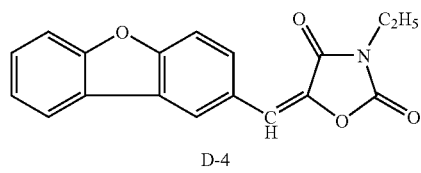

D-4

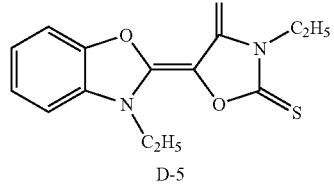

D-5

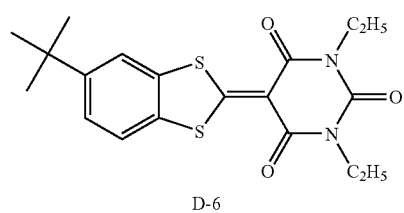

D-6

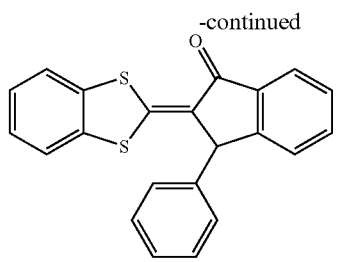

D-7

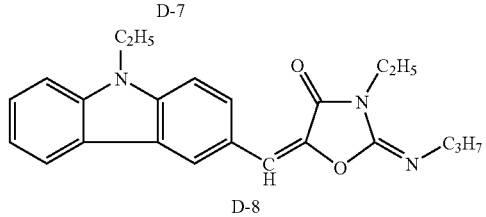

D-8

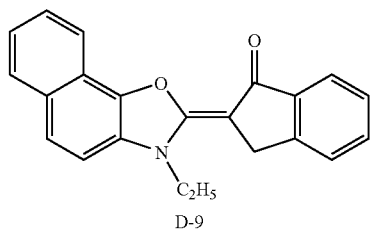

D-9

Each of these polymerization initiators and sensitizers can be preferably added in a proportion of 0.1 to 50% by mass, more preferably 0.5 to 30% by mass, and particularly preferably 0.8 to 20% by mass with respect to the total solid content constituting the image recording layer. When the content is within the above range, high sensitivity and excellent stain resistance of a non-image region during printing can be achieved. These polymerization initiators may be used singly or in combination of two or more thereof. These polymerization initiators may be added to the same layer containing other components or may be added to another layer separately provided.

<(B) Polymerizable Compound>

The polymerizable compound which can be used in the present invention is an addition-polymerizable compound having at least one ethylenically unsaturated double bond, and is selected from compounds each having at least one (preferably two or more) ethylenically unsaturated bond. Such compounds are widely known in the art and can be used in the present invention without any particular limitation. The polymerizable compound may be in the chemical form of a monomer, a prepolymer (i.e., a dimer, a trimer, and an oligomer), a mixture thereof, a copolymer thereof, or the like. Examples of the monomer and a copolymer thereof include unsaturated carboxylic acids (e.g., acrylic acid, methacrylic acid, itaconic acid, crotonic acid, isocrotonic acid, maleic acid, etc.), and esters and amides thereof. Preferably, an ester of an unsaturated carboxylic acid with an aliphatic polyvalent alcohol compound, and an amide of an unsaturated carboxylic acid with an aliphatic polyvalent amine compound, are used. An addition-reaction product of an unsaturated carboxylic ester or amide having a nucleophilic substituent, such as a hydroxyl group, an amino group, a mercapto group, or the like, with a mono- or multi-functional isocyanate or epoxy; a dehydration condensation reaction product of an unsaturated carboxylic ester or amide having a nucleophilic substituent, such as a hydroxyl group, an amino group, a mercapto group, or the like with a mono- or multi-functional carboxylic acid; and the like, are also preferably used. An addition-reaction product of an unsaturated carboxylic ester or amide having an electrophilic substituent, such as an isocyanate group, an epoxy group, or the like with a mono- or multi-functional alcohol, amine or thiol; and a substitution reaction product of an unsaturated carboxylic ester or amide having an dissociative substituent, such as a halogen group, a tosyloxy group, or the like with a mono- or multi-functional alcohol, amine, or thiol, are also preferable. As other examples, compounds obtained by replacing the above-described unsaturated carboxylic acid with an unsaturated phosphonic acid, styrene, vinyl ether, or the like, can be used.

Specific examples of the ester monomer of an aliphatic polyvalent alcohol with an unsaturated carboxylic acid include acrylic esters, methacrylic esters, itaconic esters, crotonic esters, isocrotonic esters, maleic ester, and the like. Examples of the acrylic esters include ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, polyester acrylate oligomers, isocyanuric acid EO-modified triacrylate, and the like.

Examples of the methacrylic ester include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, bis[p-(methacryloxyethoxy)phenyl]dimethyl methane, and the like.

Examples of the itaconic ester include ethylene glycol diitaconate, propylene glycol diitaconate, 1,3-butane diol diitaconate, 1,4-butane diol diitaconate, tetramethylene glycol diitaconate, pentaerythritol diitaconate, sorbitol tetraitaconate, and the like. Examples of the crotonic ester include ethylene glycol dicrotonate, tetramethylene glycol dicrotonate, pentaerythritol dicrotonate, sorbitol tetradicrotonate, and the like. Examples of the isocrotonic ester include ethylene glycol diisocrotonate, pentaerythritol diisocrotonate, sorbitol tetraisocrotonate, and the like. Examples of the maleic ester include ethylene glycol dimaleate, triethylene glycol dimaleate, pentaerythritol dimaleate, sorbitol tetramaleate, and the like.

Examples of other esters include aliphatic alcohol esters described in JP-B No. 51-47334 and JP-A No. 57-196231, esters having an aromatic backbone described in JP-A Nos. 59-5240, 59-5241 and 2-226149, esters having an amino group described in JP-A 1-165613, and the like. It is also possible to use a mixture of the above-described ester monomers.

Examples of the amide monomer of an aliphatic polyvalent amine with an unsaturated carboxylic acid include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, xylylene bismethacrylamide, and the like. Preferable examples of other amide monomers include those having a cyclohexylene structure described in JP-B 54-21726.

A urethane addition-polymerizable compound produced by an addition reaction between isocyanate and a hydroxyl group is also preferable. Examples of the urethane addition-polymerizable compound include a vinyl urethane compound having two or more polymerizable vinyl groups obtained by adding a vinyl monomer having a hydroxyl group represented by the following general formula (III) to a polyisocyanate compound having two or more isocyanate groups as described in JP-B No. 48-41708, and the like.

$$CH_2=C(R_4)COOCH_2CH(R_5)OH \qquad (III)$$

(where $R_4$ and $R_5$ represent H or $CH_3$)

Urethane acrylates described in JP-A No. 51-37193, and JP-B Nos. 2-32293 and 2-16765 and urethane compounds having an ethylene oxide backbone described in JP-B Nos. 58-49860, 56-17654, 62-39417, and 62-39418, are also preferable. Addition-polymerizable compounds containing an amino structure or sulfide structure described in JP-A Nos. 63-277653, 63-260909, and 1-105238 can be used to obtain photopolymerizable compositions having excellent photo-sensitization speed.

As other examples, multifunctional acrylates and methacrylates, such as polyester acrylates described in JP-A No. 48-64183, and JP-B Nos. 49-43191 and 52-30490, epoxy acrylates obtained by allowing epoxy resin to react with (meth)acrylic acid, and the like, can be illustrated. Also, specific unsaturated compounds described in JP-B Nos. 46-43946, 1-40337, and 1-40336, vinyl phosphonic acid compounds described in JP-A No. 2-25493, and the like can be illustrated. Also, in some cases, a structure containing a perfluoroalkyl group described in JP-A No. 61-22048, is preferably used. Further, photocurable monomers and oligomers described in Journal of Japanese Adhesive Society, vol. 20, No. 7, pp. 300-308 (1984), can be used.

Details of usage of these polymerizable compounds, such as the structure, the single use or combination use, the added amount, and the like, may be arbitrarily determined in accordance with design of performance of a final planographic printing plate precursor. For example, the details can be selected from the following viewpoints.

In terms of sensitivity, a structure containing a large amount of unsaturated group(s) per molecule is preferable. In many cases, bi- or higher-functionality is preferable. To increase the strength of an image region (i.e., a cured layer), tri- or higher-functionality is preferable. It is also effective to control both the sensitivity and the strength by using groups having different functionality and polymerizability (e.g. acrylates, methacrylates, styrene compounds, and vinyl ether compounds) in combination.

The selection and usage of the polymerizable compound is an important factor for compatibility with other components (e.g., a binder polymer, an initiator, a colorant, etc.) in the image recording layer and dispersibility in the image recording layer. The compatibility may be improved by using, for example, a low-purity polymerizable compound or a combination of two or more polymerizable compounds. A specific structure may be selected for the purpose of improving the adhesiveness to a support, a protective layer described below, or the like.

The polymerizable compound is used preferably in the range of 5 to 80% by mass, more preferably 25 to 75% by mass, with respect to the total solid content of the image recording layer. These polymerizable compounds may be used singly or in a combination of or two or more thereof. In other regards concerning the usage of the addition-polymerizable compound, the structure, mixture, and added amount of the addition-polymerizable compound may be arbitrarily selected, considering the degree of polymerization inhibition caused by oxygen, the resolution, the fogging property, the change in reflectance, the surface adhesiveness, and the like. Further, in some cases, a layer structure/coating method, such as undercoating and overcoating, may be carried out.

<(C) Binder Polymer>

In the present invention, a binder polymer can be used in order to improve the film strength or film formation ability of an image recording layer, and development-on-machine ability. Conventionally known binder polymers can be used without limitation. A linear organic polymer having film formation ability is preferable. Examples of the binder polymer include acrylic resin, polyvinyl acetal resin, polyurethane resin, polyurea resin, polyimide resin, polyamide resin, epoxy resin, methacrylic resin, polystyrene resin, novolak phenol resin, polyester resin, synthetic rubber, natural rubber, and the like.

To improve the film strength of an image region, the binder polymer preferably has crosslinkability. To allow the binder polymer to have crosslinkability, a crosslinkable functional group, such as an ethylenically unsaturated bond or the like, may be introduced into a main chain or a side chain of the polymer. The crosslinkable functional groups may be introduced by copolymerization.

Examples of a polymer having an ethylenically unsaturated bond in a main chain thereof include poly-1,4-butadiene, poly-1,4-isoprene, and the like.

Examples of a polymer having an ethylenically unsaturated bond in a side chain thereof include a polymer of an ester or an amide of acrylic acid or methacrylic acid in which the ester or amide residue (R in —COOR or —CONHR) has an ethylenically unsaturated bond.

Examples of the residue (the above-described R) having an ethylenically unsaturated bond include $—(CH_2)_n CR^1 = CR^2 R^3$, $—(CH_2O)_n CH_2 CR^1 = CR_2 R_3$, $—(CH_2 CH_2 O)_n CH_2 CR^1 = CR^2 R^3$, $—(CH_2)_n NH—CO—O—CH_2 CR^1 = CR^2 R^3$, $—(CH_2)_n —O—CO—CR^1 = CR^2 R^3$, and $—(CH_2 CH_2 O)_2 —X$, where $R^1$ to $R^3$ each independently represent a hydrogen atom, a halogen atom, or an alkyl, aryl, alkoxy, or aryloxy group having 1 to 20 carbon atoms; $R^1$ and $R^2$ or $R^3$ may be bound to each other to form a ring; n is an integer of 1 to 10; and X represents a dicyclopentadienyl residue.

Specific examples of the ester residue include —$CH_2 CH = CH_2$ (described in JP-B No. 7-21633), —$CH_2 CH_2 O—CH_2 CH = CH_2$, —$CH_2 C(CH_3) = CH_2$, —$CH_2 CH = CH—C_6 H_5$, —$CH_2 CH_2 OCOCH = CH—C_6 H_5$, —$CH_2 CH_2 —NHCOO—CH_2 CH = CH_2$, and —$CH_2 CH_2 O—X$, where X represents a dicyclopentadienyl residue.

Specific examples of the amide residue include —$CH_2 CH = CH_2$, —$CH_2 CH_2 —Y$ (Y represents a cyclohexene residue), and —$CH_2 CH_2 —OCO—CH = CH_2$.

The crosslinkable binder polymer is cured in, for example, the following manner. A free radical (a polymerization initiation radical or a growing radical of a polymerizable compound in the process of polymerization) is added to a crosslinkable functional group of the crosslinkable binder polymer, whereby the crosslinkable binder polymer are addition-polymerized directly or via the polymerized chain of the polymerizable compound, to form a crosslinkage between the polymer molecules. Alternatively, an atom (e.g., a hydrogen atom on a carbon atom adjacent to the functional crosslinkable group) in the polymer is extracted by a free radical to generate polymer radicals, and the polymer radicals are bound to each other to form a crosslinkage between the polymer molecules, whereby the binder polymer is cured.

The content of the crosslinkable group in the binder polymer (content of radical-polymerizable unsaturated double bonds determined by iodine titration) is preferably 0.1 to 10.0 mmol, more preferably 1.0 to 7.0 mmol, and most preferably 2.0 to 5.5 mmol, per gram of the binder polymer. Within this range, good sensitivity and good storage stability are obtained.

From the viewpoint of improving the development-on-machine ability of an unexposed portion of the image recording layer, the binder polymer preferably has high solubility or dispersibility in ink and/or fountain solution.

To improve solubility or dispersibility with respect to ink, the binder polymer is preferably lipophilic. To improve solubility or dispersibility with respect to fountain solution, the binder polymer is preferably hydrophilic. Therefore, it is also effective in the present invention to use a lipophilic binder polymer and a hydrophilic binder polymer in combination.

Preferable examples of the hydrophilic binder include those having a hydrophilic group, such as a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amide group, a carboxymethyl group, a sulfonic acid group, a phosphoric acid group, and the like.

Specific examples of the hydrophilic binder polymer include gum arabic, casein, gelatin, starch derivatives, carboxymethyl cellulose and sodium salts thereof, cellulose acetate, sodium alginate, vinyl acetate-maleic acid copolymers, styrene-maleic acid copolymers, polyacrylic acids and salts thereof, polymethacrylic acids and salts thereof, hydroxyethyl methacrylate homopolymers and copolymers, hydroxyethyl acrylate homopolymers and copolymers, hydroxypropyl methacrylate homopolymers and copolymers, hydroxypropyl acrylate homopolymers and copolymers, hydroxybutyl methacrylate homopolymers and copolymers, hydroxybutyl acrylate homopolymers and copolymers, polyethylene glycols, hydroxypropylene polymers, polyvinyl alcohols, hydrolyzed polyvinyl acetate with a hydrolyzation degree of at least 60 mol %, preferably at least 80 mol %, polyvinyl formal, polyvinyl butyral, polyvinyl pyrrolidone, acrylamide homopolymers and copolymers, methacrylamide homopolymers and copolymers, N-methylol acrylamide homopolymers and copolymers, polyvinyl pyrrolidone, alcohol-soluble nylon, polyether of 2,2-bis-(4-hydroxyphenyl)-propane with epichlorohydrin, and the like.

The mass-average molecular weight of the binder polymer is preferably 5,000 or more, more preferably in the range of 10,000 to 300,000, and the number-average molecular weight thereof is preferably 1,000 or more, more preferably 2,000 to 250,000. Polydispersability (mass-average molecular weight/number-average molecular weight) is preferably 1.1 to 10.

The binder polymer may be any of a random polymer, a block polymer, a graft polymer, and the like, and is preferably a random polymer.

The binder polymer can be synthesized in a conventionally known method. Examples of a solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N- dimethyl formamide, N,N-dimethyl acetamide, toluene, ethyl acetate, methyl lactate, ethyl lactate, dimethyl sulfoxide, water, and the like. These solvents are used singly or in combination of two or more thereof.

As a radical polymerization initiator used in synthesis of the binder polymer, a known compound, such as an azo initiator, a peroxide initiator, or the like, can be used.

The binder polymers may be used singly or in a mixture of two or more thereof.

The content of the binder polymer is preferably 10 to 90% by mass, more preferably 20 to 80% by mass, and even more preferably 30 to 70% by mass, with respect to the total solid content of the image recording layer. Within this range, an excellent level of strength and image formation ability of an image region can be obtained.

The polymerizable compound (B) and the binder polymer are used preferably in amounts which achieve a mass ratio of from 1/9 to 7/3.

<Compound (D) Having a Polymerizable Group and a Support Adsorptive Group>

The planographic printing plate precursor of the present invention contains a compound (D) having a polymerizable group and a support adsorptive group (hereinafter simply referred to as a "compound (D)") in at least the image recording layer or another layer. The compound (D) preferably further has a hydrophilicity imparting group.

The other layer which can contain the compound (D) may be a layer adjacent to the image recording layer, such as an undercoat layer (middle layer) provided between a support and the image recording layer, or the like. To sufficiently exhibit the effect of the present invention, it is particularly preferable that the undercoat layer contain the compound (D).

The support adsorptive group which can be contained in the compound (D) of the present invention is a group undergoing formation of a bond with a metal, a metal oxide, a hydroxyl group, or the like on a support having been subjected to anodic oxidation or hydrophilization, by means of an ionic bond, a hydrogen bond, a coordination bond, or a bond due to intermolecular force. As the support adsorptive group, an acid group or an onium group is preferable. An acid group having an acid dissociation constant (pKa) of 7 or less is preferable. Specific examples of the acid group include —COOH, —SO$_3$H, —OSO$_3$H, —PO$_3$H$_2$, —OPO$_3$H$_2$, —CONHSO$_2$—, —SO$_2$NHSO$_2$—, and the like. Among them, —PO$_3$H$_2$ is preferable. As the onium group, an onium group generated from an atom belonging to the group 5B (the group 15) or the group 6B (the group 16) in the periodic table is preferable, more preferably an onium group generated from a nitrogen, phosphorus, or sulfur atom, and particularly preferably an onium group generated from a nitrogen atom.

Examples of the polymerizable group which can be contained in the compound (D) of the present invention include addition-polymerization reactive groups, such as an alkenyl group, an alkynyl group, and the like. Examples of the alkenyl group include a vinyl group, a propenyl group, an alyl group, a butenyl group, a dialkylmaleimide group, and the like. Examples of the alkynyl group include an acetylene group, an alkylacetylene group, and the like. The present invention is not limited to these.

Among the above-described groups, a vinyl group, a propenyl group, an alyl group, an acryl group which is a derivative of a vinyl group, a methacryl group which is a derivative of a propenyl group, and the like are particularly preferable.

An example of the hydrophilicity imparting group which can be contained in the compound (D) of the present invention is an ethylene oxide group {—(OCH$_2$CH$_2$)$_n$—}, where n is preferably 1 to 50, more preferably 1 to 20.

It can be determined in the present invention whether or not the support adsorptive ability is present, for example, by the following method.

A test compound is dissolved in an easily soluble solvent to prepare a coating solution, and the coating solution is coated and dried on a support so as to have a coating amount after drying of 30 mg/m$^2$. After thoroughly washing the support coated with the test compound using the easily soluble solvent, the residual amount of the test compound which has not been removed by the washing is measured to calculate a support adsorptive amount. For measurement of the residual amount, the residual amount of the test compound may be measured directly, or may be calculated by measuring the amount of the test compound which is dissolved in the washing solution. Examples of a method for quantitating the compound include X-ray fluorescence spectrometry, reflection absorption spectrometry, liquid chromatography, and the like. As used herein, the compound having support adsorptive ability refers to a compound which remains by 15 mg/m$^2$ or more even after conducting a washing treatment as described above.

The molecular weight of the compound (D) of the present invention is preferably 10,000 or less, more preferably 2,000 or less.

Specific examples of the compound (D) of the present invention include the following compounds, but the present invention is not limited to these.

[A] CH$_2$=C(CH$_3$)COO(C$_2$H$_4$O)$_n$P=O(OH)$_2$, n=1; Uni-Chemical Co. Ltd.; PHOSMER M, Nippon Kayaku Co. Ltd.; KAYAMER-PM-1, Kyoeisha Yushi Co. Ltd.; LIGHT ESTER P-M, Shin-Nakamura Chemical Co. Ltd.; NK ESTER SA, n=2; Uni-Chemical Co. Ltd.; PHOSMER PE2, n=4 to 5; Uni-Chemical Co. Ltd.; PHOSMER PE, n=8; Uni Chemical Co. Ltd.; PHOSMER PE8,

[B] [CH$_2$=C(CH$_3$)COO(C$_2$H$_4$O)$_n$]$_m$P=O(OH)$_{3-m}$ a mixture where n=1 and m=1 and 2; Daihachi Chemical Co. Ltd.; MR-200,

[C] CH$_2$=CHCOO(C$_2$H$_4$O)$_n$P=O(OH)$_2$ n=1; Uni Chemical Co Ltd.; PHOSMER A, Kyoeisha Yushi Co. Ltd.; LIGHT ESTER P-A,

[D] [CH$_2$=CHCOO(C$_2$H$_4$O)$_n$]$_m$P=O(OH)$_{3-m}$ a mixture where n=1 and m=1 and 2; Daihachi Chemical Co. Ltd. AR-200,

[E] CH$_2$=C(CH$_3$)COO(C$_2$H$_4$O)$_n$P=O(OC$_4$H$_9$)$_2$ n=1; Daihachi Chemical Co. Ltd.; MR-204,

[F] CH$_2$=CHCOO(C$_2$H$_4$O)$_n$P=O(OC$_4$H$_9$)$_2$ n=1; Daihachi Chemical Co. Ltd.; AR-204,

[G] CH$_2$=C(CH$_3$)COO(C$_2$H$_4$O)$_n$P=O(OC$_8$H$_{17}$)$_2$ n=1; Daihachi Chemical Co. Ltd.; MR-208,

[H] CH$_2$=CHCOO(C$_2$H$_4$O)$_n$P=O(OC$_8$H$_{17}$)$_2$ n=1; Daihachi Chemical Co. Ltd.; AR-208,

[I] CH$_2$=C(CH$_3$)COO(C$_2$H$_4$O)P=O(OH)(ONH$_3$C$_2$H$_4$OH)

n=1; Uni-Chemical Co. Ltd.; PHOSMER MH,

[J] CH$_2$=C(CH$_3$)COO(C$_2$H$_4$O)$_n$P=O(OH)(ONH(CH$_3$)$_2$C$_2$H$_4$OCOC(CH$_3$)=CH$_2$) n=1; Uni-Chemical Co. Ltd.; PHOSMER DM,

[K] CH$_2$=C(CH$_3$)COO(C$_2$H$_4$O)$_n$P=O(OH)(ONH(C$_2$H$_5$)$_2$C$_2$H$_4$OCOC(CH$_3$)=CH$_2$) n=1; Uni-Chemical Co. Ltd.; PHOSMER DE,

[L] CH$_2$=CHCOO(C$_2$H$_4$O)$_n$P=O(O-ph)$_2$ (ph represents a benzene ring) n=1; Daihachi Chemical Co; AR-260,

[M] CH$_2$=C(CH$_3$)COO(C$_2$H$_4$O)$_n$P=O(O-ph)$_2$ n=1; Daihachi Chemical Co. Ltd.; MR-260,

[Q] [CH$_2$=CHCOO(C$_2$H$_4$O)$_n$]$_2$P=O(OC$_4$H$_9$)

n=1; Daihachi Chemical Co.; PS-A4,

[N] [CH$_2$=C(CH$_3$)COO(C$_2$H$_4$O)$_n$]$_2$P=O(OH)

n=1; Daihachi Chemical Co. Ltd.; MR-200, Nippon Kayaku Co. Ltd.; KAYAMER PM-2, Nippon Kayaku Co. Ltd.; KAYAMER-PM-21,

[O] [CH$_2$=CHCOO(C$_2$H$_4$O)$_n$]$_3$P=O n=1; Ohsaka Yuki Co. Ltd.; BISCOAT 3PA.

Commercially available products include the above-described compounds and the like, but are not limited to these.

Those phosphor compounds can be synthesized, in a manner similar to that of a general acrylic monomer, by a dehydration reaction or ester exchange between acrylic or methacrylic acid and a phosphoric acid compound as described in The Chemical Society of Japan, editor, "Experimental Chemistry Course", Vol. 12, Marzen Co., Ltd., 1976 and Kiyomi Kato, "UV-ray Curing system", Kabushiki Kaisha Sogogijyutsu center, 1990. Further, the phosphor compound may be used in a mixture of several compounds at an arbitrary ratio. Concerning the chain length n of ethylene oxide in the formula, as the value n is increased, it becomes more difficult to synthesize a pure product, resulting in a mixture of those having values around n. Specifically, n=0, 1, 2, about 4 to 5, about 5 to 6, about 7 to 9, about 14, about 23, about 40, about 50, and n is not limited to these values. These compounds may be used in a mixture of two or more thereof at an arbitrary ratio.

As the compound which has a polymerizable group and a support adsorptive group, a copolymer (E) (hereinafter also referred to as a "specific copolymer") having (a1) a repeating unit containing at least one ethylenically unsaturated bond and (a2) a repeating unit containing at least one support adsorptive group, may be used. The specific copolymer also preferably has a hydrophilic moiety.

As the specific copolymer, those having repeating units represented by the following formula (IV) are preferable.

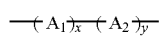

[Chem. 14]

(IV)

In the formula (IV), A$_1$ represents a repeating unit containing at least one ethylenically unsaturated bond, A$_2$ represents a repeating unit containing at least one support adsorptive group. x and y represent a copolymerization ratio.

In the formula (IV), the repeating unit represented by A$_1$ is preferably represented by the following formula (A1).

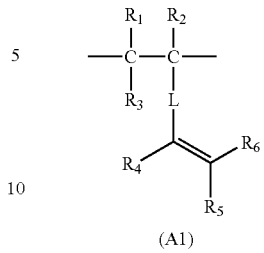

[Chem. 15]

(A1)

In the formula, R$_1$ to R$_3$ each independently represent a hydrogen atom, an alkyl group having 1 to 6 carbon atoms, or a halogen atom. R$_4$ to R$_6$ each independently represent a hydrogen atom, an alkyl group having 1 to 6 carbon atoms, a halogen atom, an acyl group, or an acyloxy group. R$_4$ and R$_5$, or R$_5$ and R$_6$ may form a ring. L represents a divalent linking group selected from the group consisting of —CO—, —O—, —NH—, a divalent aliphatic group, a divalent aromatic group, and a combination thereof.

Specific examples of L composed of the combination are described below. Note that the left-hand side of each compound is linked to a main chain, while the right-hand side thereof is linked to an ethylenically unsaturated bond.

L1: —CO—NH-divalent aliphatic group-O—CO—
L2: —CO-divalent aliphatic group-O—CO—
L3: —CO—O-divalent aliphatic group-O—CO—
L4: -divalent aliphatic group-O—CO—
L5: —CO—NH-divalent aromatic group-O—CO—
L6: —CO-divalent aromatic group-O—CO—
L7: -divalent aromatic group-O—CO—
L8: —CO-divalent aliphatic group-CO—O-divalent aliphatic group-O—CO—
L9: —CO-divalent aliphatic group-O—CO-divalent aliphatic group-O—CO—
L10: —CO-divalent aromatic group-CO—O-divalent aliphatic group-O—CO—
L11: —CO-divalent aromatic group-O—CO-divalent aliphatic group-O—CO—
L12: —CO-divalent aliphatic group-CO—O-divalent aromatic group-O—CO—
L13: —CO-divalent aliphatic group-O—CO-divalent aromatic group-O—CO—
L14: —CO-divalent aromatic group-CO—O-divalent aromatic group-O—CO—
L15: —CO-divalent aromatic group-O—CO-divalent aromatic group-O—CO—

The divalent aliphatic group refers to an alkylene group, a substituted alkylene group, an alkenylene group, a substituted alkenylene group, an alkynylene group, a substituted alkynylene group, or a polyalkyleneoxy group. Among them, an alkylene group, a substituted alkylene group, an alkenylene group, and a substituted alkenylene group are preferable. An alkylene group and a substituted alkylene group are more preferable.

A divalent aliphatic group having a ring structure is more preferable than that which has a chain structure. Further, a straight chain structure is more preferable than a chain structure having a branch.

The divalent aliphatic group preferably has 1 to 20 carbon atoms, more preferably 1 to 15, even more preferably 1 to 12, still even more preferably 1 to 10, and most preferably 1 to 8.

Examples of the substituent of the divalent aliphatic group include halogen atoms (F, Cl, Br, I), a hydroxyl group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, an arylamino group, a diarylamino group, and the like.

The divalent aromatic group refers to an aryl group or a substituted aryl group. Preferably, the divalent aromatic group is a phenylene group, a substituted phenylene group, a naphthylene group, or a substituted naphthylene.

Examples of the substituent of the divalent aromatic group include an alkyl group in addition to the above-described substituent examples of the divalent aliphatic group.

In the formula (IV), the repeating unit represented by $A_2$ is specifically represented by the following formula (A2).

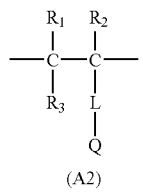

[Chem. 16]

(A2)

In the formula, $R_1$ to $R_3$ and L represent the same as those of the above-described formula (A1). Q represents a functional group which interacts with a support surface (hereinafter may be abbreviated as "specific functional group").

Specific examples of the specific functional group include groups which can have interaction, such as covalent bond, ionic bond, hydrogen bond, polar interaction, Van der Waals interaction, or the like, with Si—OH, Si—O⁻, $Al^{3+}$, aluminum oxide, zirconium oxide, or the like on a support surface. Specific examples of the specific functional group are described as follows.

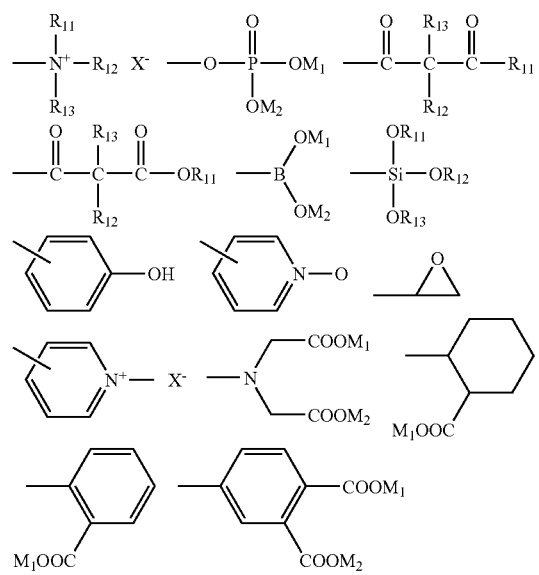

[Chem. 17]

In the above-described formulas, $R_{11}$ to $R_{13}$ each independently represent a hydrogen atom, an alkyl group, an aryl group, an alkynyl group, or alkenyl group; $M_1$ and $M_2$ each independently represent a hydrogen atom, a metal atom, or an ammonium group; and X– represents a counter anion.

Among them, as the specific functional group, an onium salt group (e.g., an ammonium group, a pyridinium group, etc.), a β-diketone group (e.g., a phosphoric ester group, a phosphonic acid group, a borate group, an acetylacetone group, etc.), or the like is preferable.

In the formula (A2), L represents a divalent linking group selected from a group consisting of —CO—, —O—, —NH—, a divalent aliphatic group, a divalent aromatic group, and a combination thereof.

Specific examples of L consisting of the combination include the above-described specific examples of L of (A1), and in addition, those described as follows. Note that, in the examples described below, the left-hand side of each compound is linked to a main chain, while the right-hand side thereof is linked to an ethylenically unsaturated bond.

L16: —CO—NH—
L17: —CO—O—
L18: -divalent aromatic group-

The repeating unit represented by the formula (A2) may contain a hydrophilic moiety. When a hydrophilic moiety is not contained in the formula (A2), the copolymer used in the present invention preferably contains, as a copolymer component, a repeating unit represented by a formula (A3) described as follows.

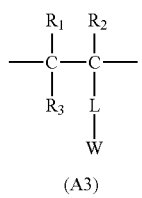

[Chem. 18]

(A3)

In the formula, $R_1$ to $R_3$, and L represent the same as those of the formula (A1). W represents groups described as follows.

[Chem. 19]

—COO—$M_1$    —$SO_3$—$M_1$    —C—N$\begin{smallmatrix}R_7\\R_8\end{smallmatrix}$
                                         ‖
                                         O —(—$R_9$—O—)$_n$—$R_{10}$ Note that $M_1$ represents the same as that which has been described in the formula (A2).

$R_7$ and $R_8$ each independently represent a hydrogen atom, or a straight- or branched-chain alkylene group having 1 to 6 carbon atoms. $R_9$ represents a straight- or branched-chain alkylene group having 1 to 6 carbon atoms. $R_{10}$ represents a hydrogen atom or an alkyl group having 1 to 12 carbon atoms. n represents an integer of 1 to 100.

The molecular weight (mass average molecular weight Mw) of the specific copolymer is preferably in the range of 500 to 100,000, more preferably 700 to 50,000. Also, (a1) is preferably 5 to 80 mol %, more preferably 10 to 50 mol %, with respect to the total copolymer monomer. (a2) is preferably 5 to 80 mol %, more preferably 10 to 50 mol %, with respect to the total copolymer monomer. (a3) is preferably 5 to 80 mol %, more preferably 10 to 50 mol %, with respect to the total copolymer monomer.

Specific examples of the specific copolymer used in the present invention are described as follow, but are not limited to these.
[Chem. 20]
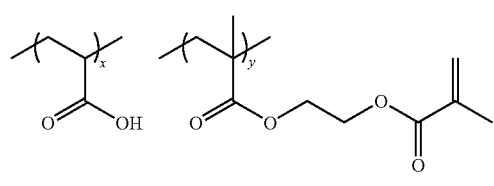
1
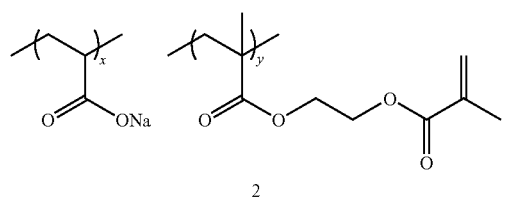
2
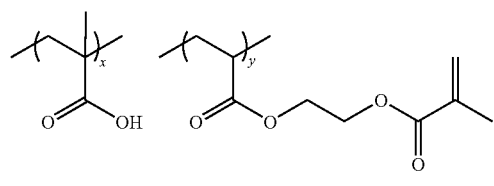
3
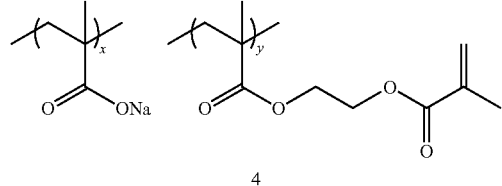
4
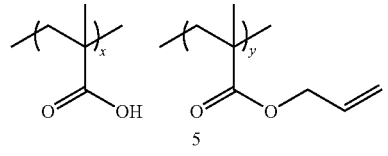
5
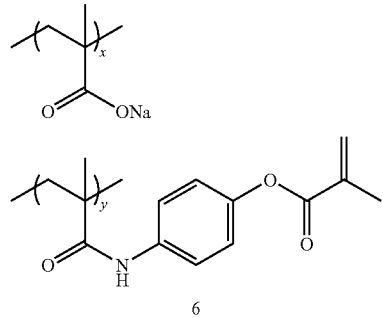
6
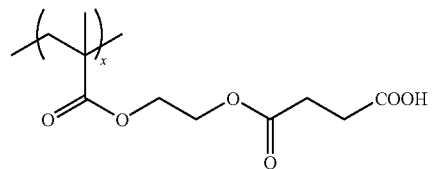
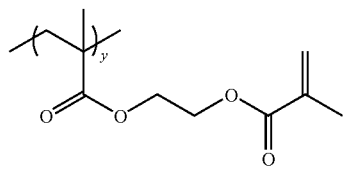
7
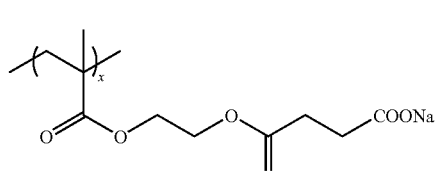
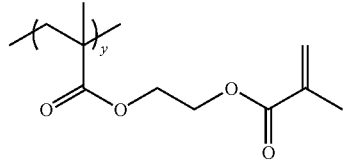
8
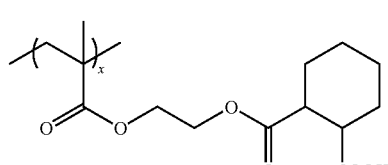
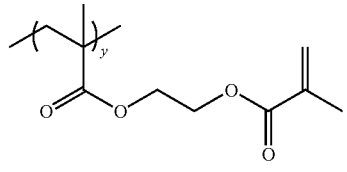
9
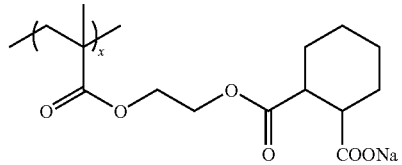
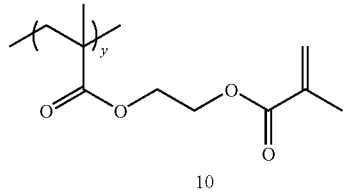
10
[Chem. 21]
11

-continued

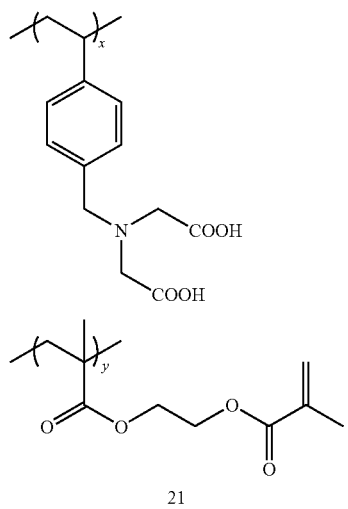
21
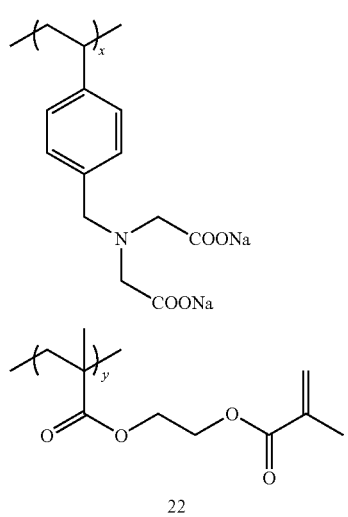
22
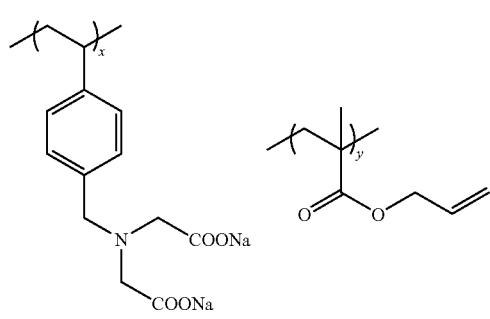
23
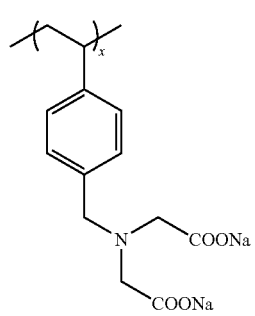
[Chem. 22]
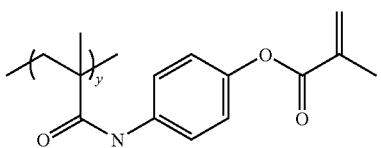
24
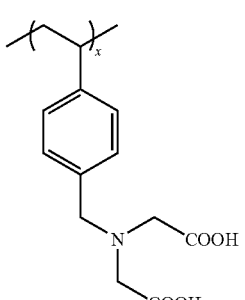
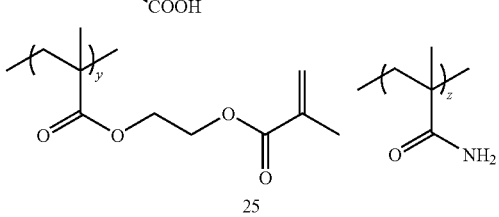
25
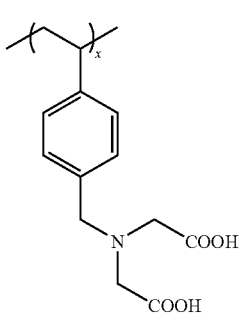
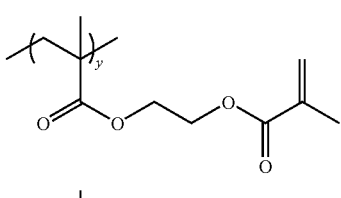
26
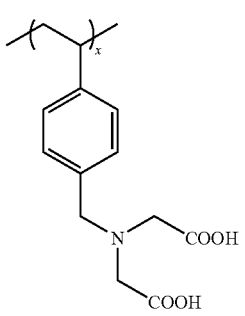

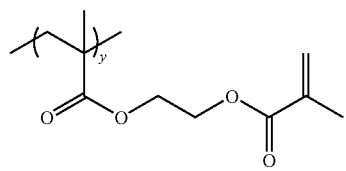
27
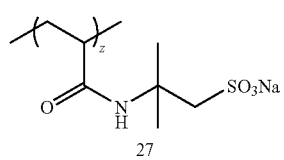
[Chem. 23]
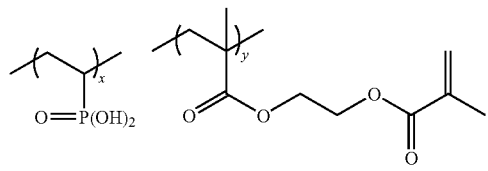
28
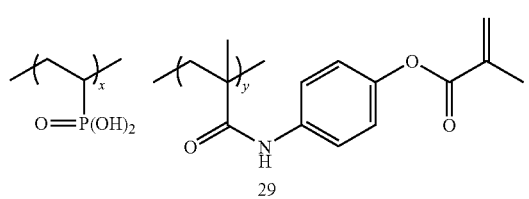
29
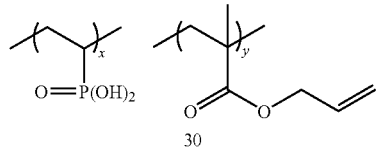
30
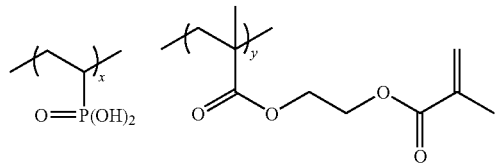
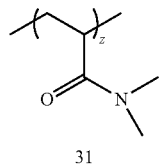
31
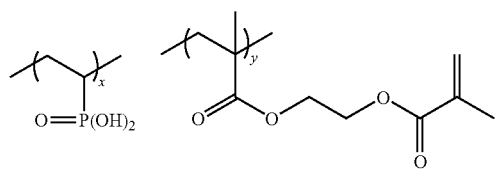
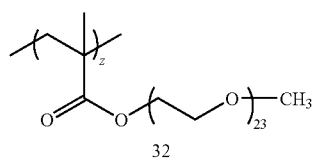
32
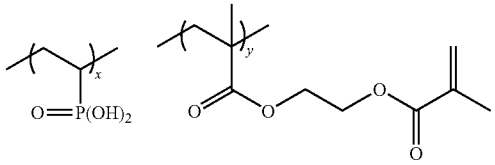
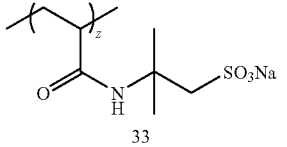
33
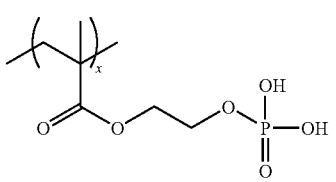
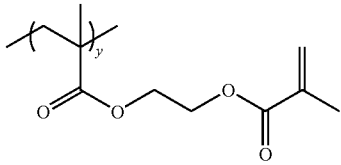
34
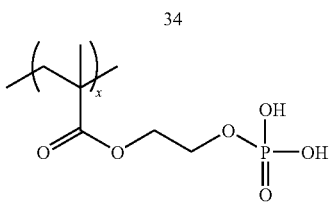
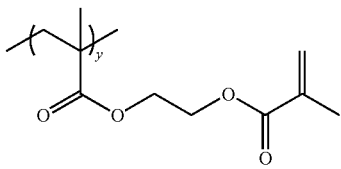
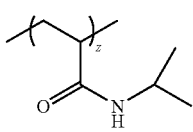
35
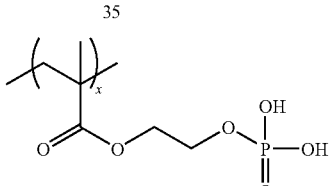
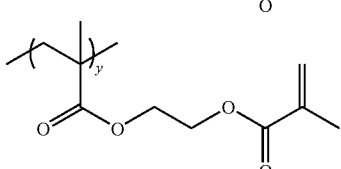
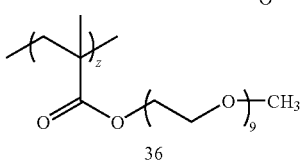
36

-continued
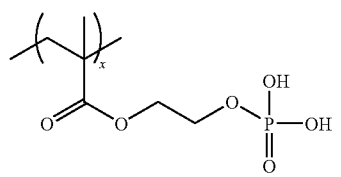
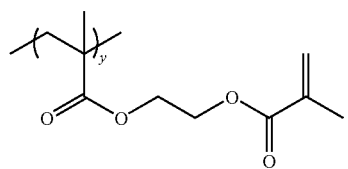
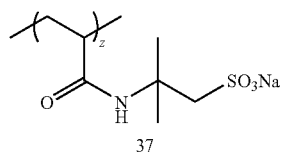
37
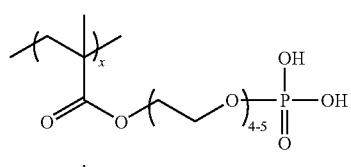
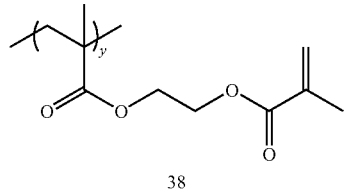
38
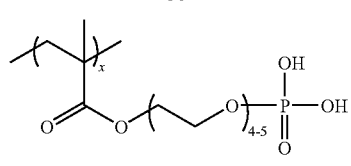
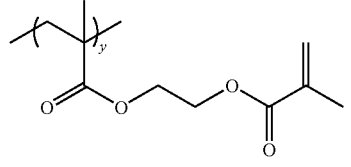
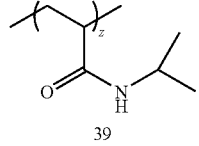
39
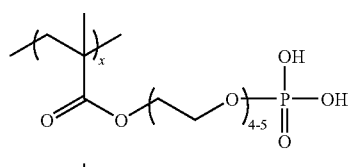
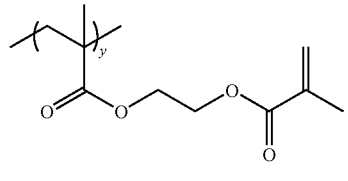
-continued
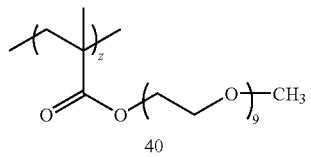
40
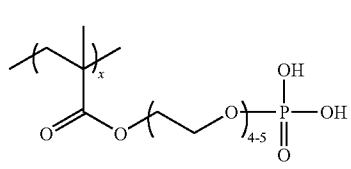
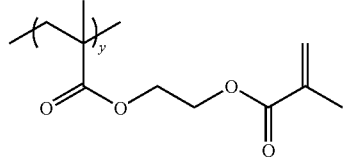
[Chem. 24]
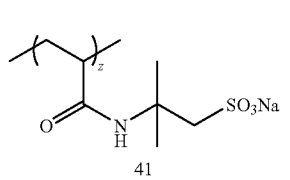
41
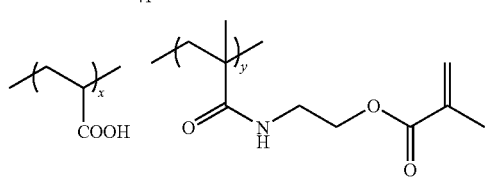
42
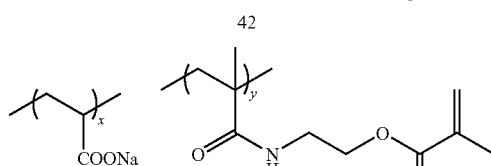
43
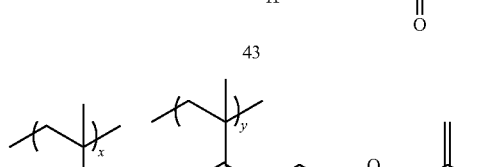
44
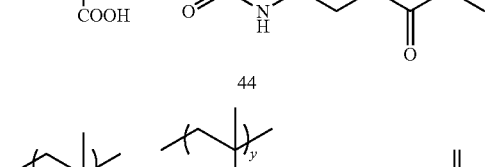
45
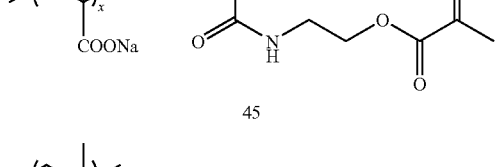
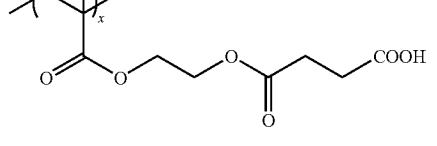

51
-continued
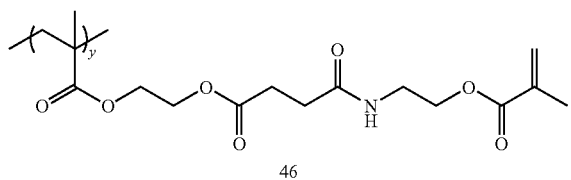
46
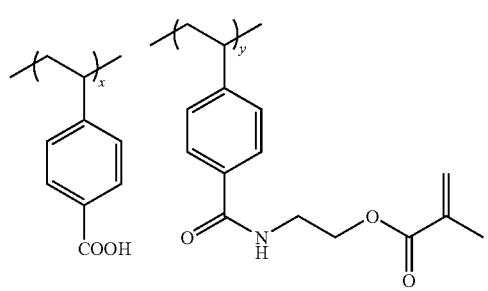
47
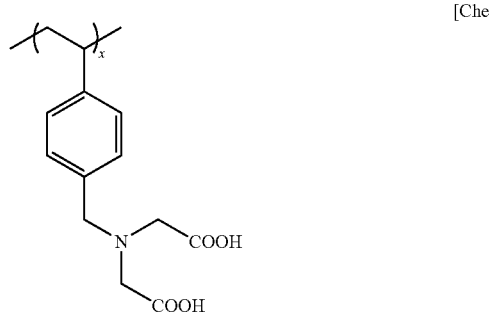
48
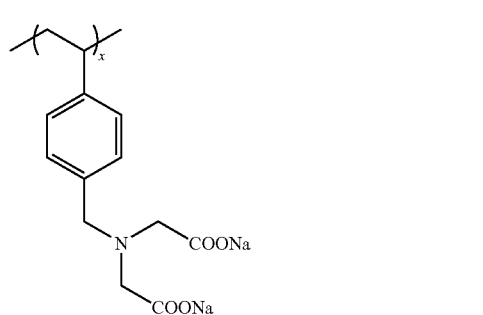
52
-continued
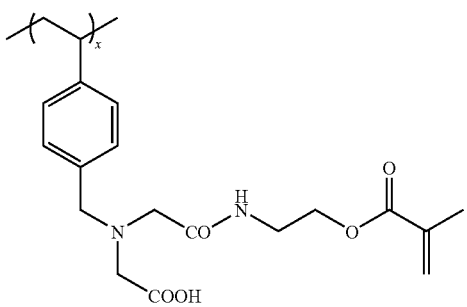
49
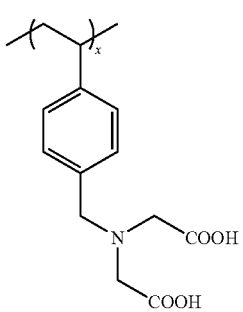
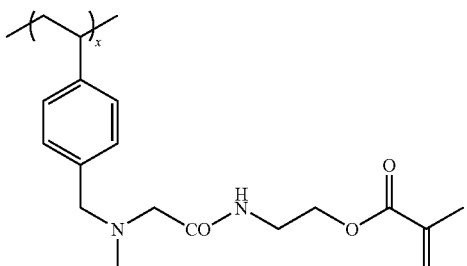
50
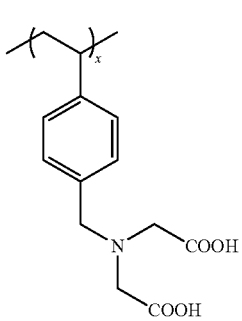

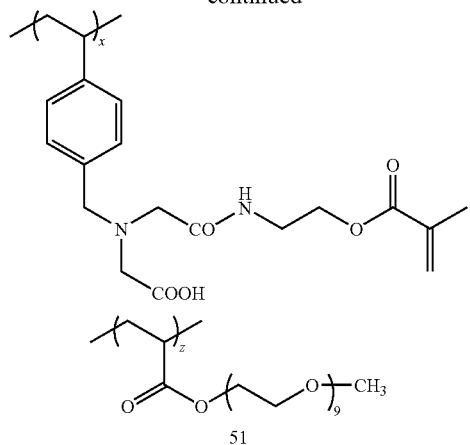
51
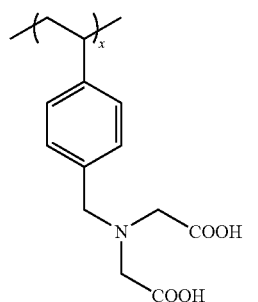
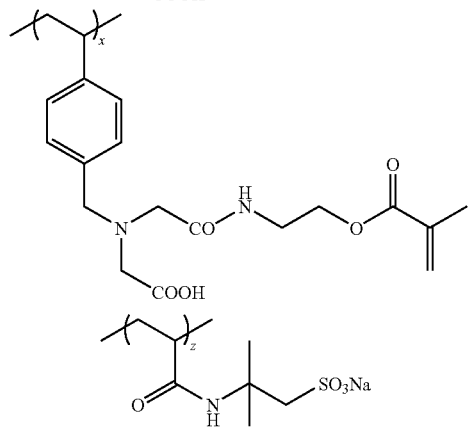
52
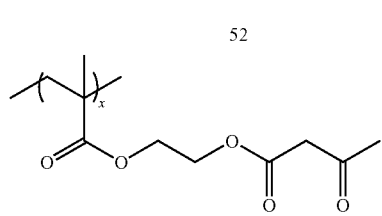
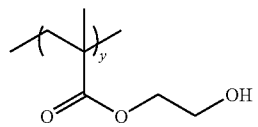
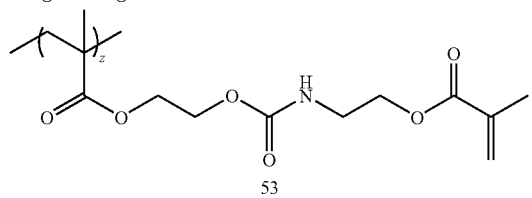
53
-continued
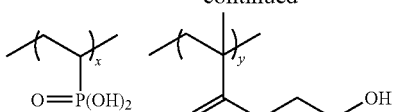
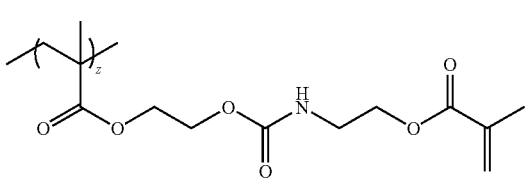
54
[Chem. 26]
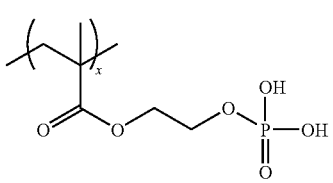
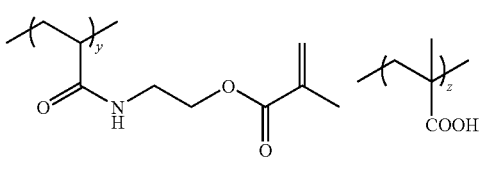
55

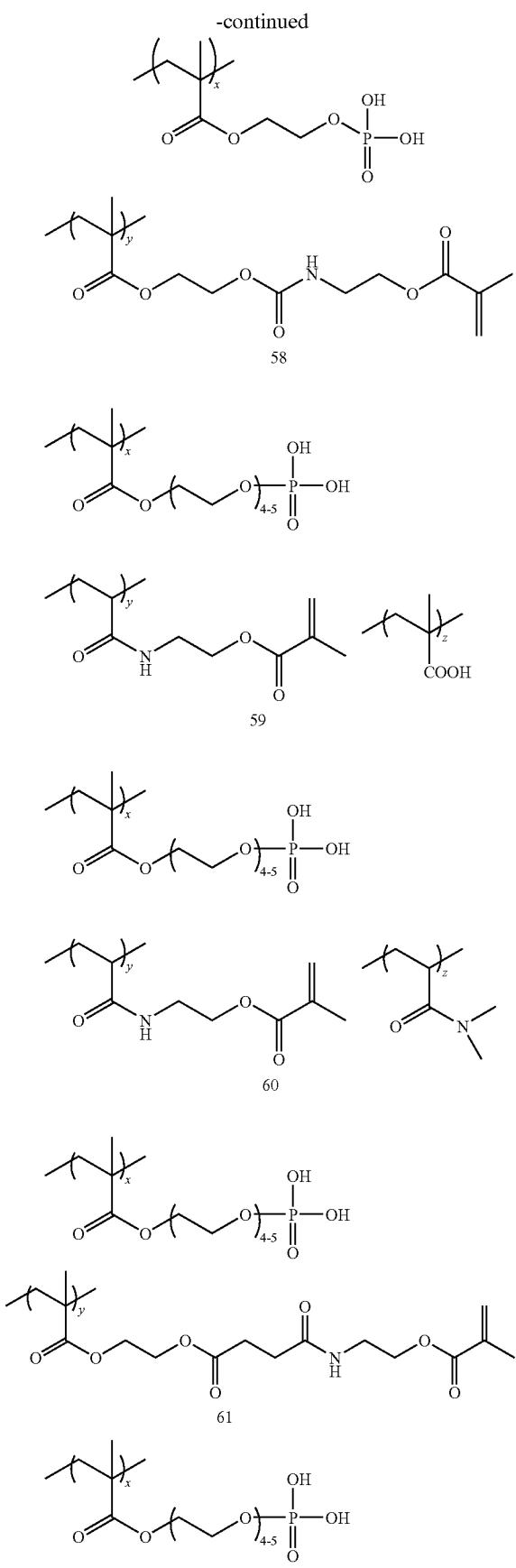

In the present invention, the above-described compound (D) having a polymerizable group and a support adsorptive group is contained either or both of the image recording layer and the undercoat layer.

To cause the image recording layer to contain the compound (D), a method of applying a coating solution prepared by dissolving or dispersing the compound (D) together with (A) a polymerization initiator, (B) a polymerizable compound, and other components of the image recording layer in an appropriate solvent, is used. The content of the compound (D) is preferably 0.5 to 40% by mass, more preferably 1 to 20% by mass, with respect to the solid content of the image recording layer.

The undercoat layer containing the compound (D) having a polymerizable group and a support adsorptive group can be provided using a method of applying a solution obtained by dissolving the compound (D) in water, an organic solvent (e.g., methanol, ethanol, methylethylketone, etc.), or a mixed solvent thereof, onto a surface-treated aluminum support, followed by drying, or a method of immersing a surface-treated aluminum support in a solution obtained by dissolving the compound (D) in water, an organic solvent (e.g., methanol, ethanol, methylethylketone, etc.), or a mixed solvent thereof, so that the compound is absorbed into the support, followed by washing with water or the like, and drying. In the former method, a solution containing the compound (D) having a concentration of 0.005 to 10% by mass can be applied using various methods. For example, any of bar coater coating, spin coating, spray coating, and the like can be used. In the latter method, the concentration of the solution is 0.01 to 20% by mass, preferably 0.05 to 5% by mass, the immersion temperature is 20 to 90° C., preferably 25 to 50° C., and the immersion time is 0.1 sec to 20 min, preferably 2 sec to 1 min. The coating amount after drying of the undercoat layer is preferably 0.1 to 100 mg/m$^2$, more preferably 1 to 30 mg/m$^2$.

<(F) Filler>

As a filler used in the present invention, fillers typically used for resin can be used. For example, metal oxides, metal hydroxides, metal carbonates, metal sulfates, metal silicates, metal nitrides, carbons, and other fillers are used.

Examples of the metal oxide include silica, diatomaceous earth, alumina, zinc oxide, titanium oxide, calcium oxide, magnesium oxide, iron oxide, tin oxide, antimony oxide, and the like.

Examples of the metal hydroxide include calcium hydroxide, magnesium hydroxide, aluminum hydroxide, basic magnesium carbonate, and the like.

Examples of the metal carbonate include calcium carbonate, magnesium carbonate, zinc carbonate, barium carbonate, dawsonite, hydrotalcite, and the like.

Examples of the metal sulfate include calcium sulfate, barium sulfate, gypsum fiber, and the like.

Examples of the metal silicate include calcium silicate, talc, kaolin, clay, mica, montmorillonite, bentonite, activated clay, sepiolite, imogolite, sericite, glass fiber, glass beads, silica-based balloon, and the like.

Examples of the metal nitride include aluminum nitride, boron nitride, silicon nitride, and the like.

Examples of the carbon include carbon black, graphite, carbon fiber, carbon balloon, charcoal powder, carbon nanotube, fullerene, and the like.

Examples of other fillers include various metal powders (e.g., gold, silver, copper, tin, etc.), potassium titanate, lead titanate zirconate, aluminum borate, molybdenum sulfide, silicon carbide, stainless steel fiber, zinc borate, slag fiber, Teflon (registered trademark) powder, wood powder, pulp, rubber powder, aramide fiber, and the like.

Also, internally crosslinked organic fine particles can also be preferably used. The internally crosslinked organic fine particles can be obtained by emulsion polymerization of a multi-functional monomer having at least two polymerizable unsaturated double bonds within the molecule and a monofunctional monomer having a polymerizable unsaturated double bond. Specific examples thereof include those described as "crosslinked latex particles" in JP-A No. 2003-39841.

These fillers may be used singly or in combination of two or more thereof.

Among them, metal oxides, metal silicates, and internally crosslinked organic fine particles are preferable. Metal oxides and metal silicates are more preferable. Silica, alumina, titanium oxide, talc, kaolin, clay, activated clay, sepiolite, and glass beads are particularly preferable. Silica and alumina are most preferable.

Examples of the filler shape include a fibrous shape, a needle-like shape, a plate-like shape, a spherical shape, a granular shape (amorphous, the same applies to the following description), a tetrapod-like shape, a balloon-like shape, and the like. Among them, a fibrous shape, a granular shape, a needle-like shape, a plate-like shape, and a spherical shape are preferable. A spherical shape, a granular shape, and a plate-like shape are particularly preferable. Further, porous fillers are preferable since they provide good development-on-machine ability.

The fillers may be surface-treated with a treating agent. As the treating agent, typical treating agents can be used. For example, a silane coupling agent, a titanate coupling agent, an aluminate coupling agent, fatty acid, fat and oil, a polyethylene glycol-type nonionic surfactant, a polyhydric alcohol-type nonionic surfactant, wax, a carboxylic acid coupling agent, a phosphoric acid coupling agent, and the like can be used.

Examples of the silane coupling agent include γ-chloropropyltrimethoxysilane, vinyltriethoxysilane, vinyltrimethoxysilane, vinyltris(β-methoxyethoxy)silane, γ-methacryloxypropyltrimethoxysilane, β-(3,4-epoxycyclohexyl) ethyltrimethoxysilane, and the like.

Examples of the titanate coupling agent include isopropyltriisostearoyl titan, and the like. Examples of the aluminate coupling agent include acetoalkoxyaluminum diisopropylate, and the like.

Examples of the fatty acid include stearic acid, oleic acid, linoleic acid, linolenic acid, eleostearic acid, and the like.

Examples of the fat and oil include coconut oil, rice bran oil, soybean oil, linseed oil, dehydrated castor oil, safflower oil, tung oil, and the like.

Examples of the polyethylene glycol-type nonionic surfactant include an ethylene oxide adduct of higher alcohol, an ethylene oxide adduct of fatty acid, an ethylene oxide adduct of higher alkylamine, an ethylene oxide adduct of polypropylene glycol, and the like.

Examples of the polyhydric alcohol-type nonionic surfactant include a fatty acid ester of polyethylene oxide or glycerin, a fatty acid ester of pentaerythritol, a fatty acid ester of sorbitol or sorbitan, an alkyl ether of polyhydric alcohol, an aliphatic amide of alkanolamine, and the like.

Examples of the wax include maleinized polypropylene, maleinized polyethylene, and the like.

Examples of the carboxylic acid coupling agent include carboxylated polybutadiene, carboxylated polyisoprene, and the like.

Examples of the phosphoric acid coupling agent include monooctyl phosphate, mono(2,6-dimethyl-7-octenyl)phosphate, mono(6-mercaptohexyl)phosphate, mono(2-methacryloxypropyl)phosphate, and the like.

As the filler used in the present invention, those having a lipophilic group are preferable. As a surface treating agent for that purpose, the above-described silane coupling agent, titanate coupling agent, aluminate coupling agent, fatty acid, fat and oil, wax, carboxylic acid coupling agent, and phosphoric acid coupling agent, and the like are preferable.

Also, as the filler used in the present invention, those having a polymerizable functional group on a surface thereof are more preferable in terms of an improvement in printing durability. As a surface treatment for that purpose, a surface treatment employing a compound having an ethylenically unsaturated bond is preferable, and a surface treatment employing a silane coupling agent having an ethylenically unsaturated bond is particularly preferable.

In the present invention, the added amount of the filler may be variously changed depending on the types and added amounts of other components in the image-forming layer, and is preferably from 0.1 to 80% by mass, more preferably from 1 to 60% by mass, and even more preferably from 5 to 50% by mass. Within this range, both the printing durability and the development-on-machine ability of an image portion can be achieved.

The average particle diameter of the filler used in the present invention is preferably 5 nm to 100 µm, more preferably 5 nm to 10 µm, and even more preferably 10 nm to 1 µm, though depending on the film thickness of the image recording layer. Within this range, both the printing durability and the development-on-machine ability of an image portion can be achieved.

<Other Components of Image Recording Layer>

The image recording layer of the present invention can further contain, as required, an additive, such as a surfactant, a colorant, a printing-out agent, a polymerization inhibitor, a higher fatty acid derivative, a plasticizer, an inorganic fine particle, a low molecular weight hydrophilic compound, and the like. These components will be described below.

<Surfactant>

In the present invention, a surfactant is preferably used in the image recording layer in order to promote development-on-machine ability upon initiation of printing and improve a state of a coating surface. Examples of the surfactant include a nonionic surfactant, an anionic surfactant, a cationic surfactant, an amphoteric surfactant, a fluorine-based surfactant, and the like. The surfactants may be used singly or in combination of two or more thereof.

The nonionic surfactant used in the present invention is not particularly limited, and conventionally known nonionic surfactants can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty partial acid esters, sorbitan fatty acid partial esters, pentaerythritol fatty acid partial esters, propylene glycol monofatty acid esters, sucrose fatty acid partial esters, polyoxyethylene sorbitan fatty partial esters, polyoxyethylene sorbitol fatty acid partial esters, polyethylene glycol fatty acid esters, polyglycerin fatty acid partial esters, polyoxyethylene castor oil, polyoxyethylene glycerin fatty acid partial esters, fatty acid diethanol amides, N,N-bis-2-hydroxyalkyl amines, polyoxyethylene alkyl amine, triethanol amine fatty acid ester, trialkyl amine oxide, polyethylene glycol, a polyethylene glycol-polypropylene glycol copolymer, and the like.

The anionic surfactant used in the present invention is not particularly limited, and conventionally known anionic surfactants can be used. Examples of the anionic surfactant include aliphatic acid salts, abietates, hydroxyalkane sulfonates, alkane sulfonates, dialkylsulfosuccinates, linear alkyl benzene sulfonates, branched alkyl benzene sulfonates, alkyl naphthalene sulfonates, alkyl phenoxy polyoxyethylene propyl sulfonates, polyoxyethylene alkyl sulfophenyl ether salts, N-methyl-N-oleyl taurine sodium salt, N-alkyl sulfosuccinic monoamide disodium salt, petroleum sulfonates, sulfuric tallow oil, fatty acid alkyl ester sulfates, alkyl sulfates, polyoxyethylene alkyl ether sulfates, fatty acid monoglyceride sulfates, polyoxyethylene alkyl phenyl ether sulfates, polyoxyethylene styryl phenyl ether sulfates, alkyl phosphates, polyoxyethylene alkyl ether phosphates, polyoxyethylene alkyl phenyl ether phosphates, partially saponified styrene/maleic anhydride copolymers, partially saponified olefin/maleic anhydride copolymers, naphthalene sulfonate formalin condensates, and the like.

The cationic surfactant used in the present invention is not particularly limited, and conventionally known cationic surfactants can be used. Examples of the cationic surfactant include alkyl amine salts, quaternary ammonium salts, polyoxyethylene alkyl amine salts, polyethylene polyamine derivatives, and the like.

The amphoteric surfactant used in the present invention is not particularly limited, and conventionally known amphoteric surfactants can be used. Examples of the amphoteric surfactant include carboxy betaines, aminocarboxylic acids, sulfobetaines, aminosulfates, imidazolines, and the like.

The term "polyoxyethylene" in the surfactants described above can be used interchangeably with "polyoxyalkylene", such as polyoxymethylene, polyoxypropylene, polyoxybutylene, or the like, and these surfactants can also be used in the present invention.

Further preferable surfactants are fluorine-based surfactants containing a perfluoroalkyl group in their molecule. Examples of such fluorine-based surfactants include: anionic surfactants, such as perfluoroalkyl carboxylates, perfluoroalkyl sulfonates, perfluoroalkyl phosphates, and the like; amphoteric surfactants, such as perfluoroalkyl betaine and the like; cationic surfactants, such as perfluoroalkyl trimethyl ammonium salts, and the like; and nonionic surfactants, such as perfluoroalkyl amine oxide, perfluoroalkyl ethylene oxide adducts, perfluoroalkyl group- and hydrophilic group-containing oligomers, perfluoroalkyl group- and lipophilic group-containing oligomers, perfluoroalkyl group-, hydrophilic group- and lipophilic group-containing oligomers, and perfluoroalkyl group- and lipophilic group-containing urethane, and the like. Preferable examples also include fluorine-based surfactants described in JP-A Nos. 62-170950, 62-226143, and 60-168144.

The surfactants can be used singly or in combination of two or more thereof.

The surfactant may be preferably contained in the image recording layer in an amount of 0.001 to 10% by mass, more preferably 0.01 to 7% by mass, with respect to the total solid content of the image recording layer.

<Colorant>

In the present invention, various compounds other than the above-mentioned compounds may be added as required. For example, dyes having large absorption in the visible light range can be used as colorants of images. Specific examples of the colorant include Oil Yellow #101, Oil Yellow #103, Oil Pink #312, Oil Green BG, Oil Blue BOS, Oil Blue #603, Oil Black BY, Oil Black BS, Oil Black T-505 (all are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A No. 62-293247. Pigments, such as phthalocyanine pigment, azo pigment, carbon black, titanium oxide, and the like, can also be preferably used.

Such a colorant is preferably added to the image recording layer since it can distinguish the image region from the non-image region after image formation. The colorant is preferably contained in the image recording layer in an amount of 0.01 to 10% by mass with respect to the total solid content of the image recording layer.

<Printing-Out Agent>

A compound which discolors with an acid or radical can be added to the image recording layer of the present invention in order to form an image printed out. Examples of such a compound include diphenyl methane, triphenyl methane, thiazine, oxazine, xanthene, anthraquinone, iminoquinone, azo, and azomethine coloring matters, and the like.

Specific examples of such a compound include: dyes, such as Brilliant Green, Ethyl Violet, Methyl Green, Crystal Violet, Basic Fuchsin, Methyl Violet 2B, Quinaldine Red, Rose Bengal, Metanil Yellow, Thymol Sulfophthalein, Xylenol Blue, Methyl Orange, Paramethyl Red, Congo Red, Benzopulpurine 4B, α-Naphthyl Red, Nile Blue 2B, Nile Blue A, Methyl Violet, Malachite Green, Parafuchsin, Victoria Pure Blue BOH [manufactured by Hodogaya Kagaku Co., Ltd.], Oil Blue #603 [manufactured by Orient Chemical Industries, Ltd.], Oil Pink #312 [manufactured by Orient Chemical Industries, Ltd.], Oil Red 5B [manufactured by Orient Chemical Industries, Ltd.], Oil Scarlet #308 [manufactured by Orient Chemical Industries, Ltd.], Oil Red OG [manufactured by Orient Chemical Industries, Ltd.], Oil Red RR [manufactured by Orient Chemical Industries, Ltd.], Oil Green #502 [manufactured by Orient Chemical Industries, Ltd.], Spirone Red BEH Special [manufactured by Hodogaya Kagaku Co., Ltd.], m-Cresol Purple, Cresol Red, Rhodamine B, Rhodamine 6G, Sulforhodamine B, Auramine, 4-p-diethylaminophenyl iminonaphthoquinone, 2-carboxyanilino-4-p-diethylaminophenyl iminonaphthoquinone, 2-carboxystearylamino-4-p-N,N-bis(hydroxyethyl)amino-phenyliminonaphthoquinone, 1-phenyl-3-methyl-4-p-diethylaminophenyl-imino-5-pyrazolone, 1-β-naphthyl-4-p-diethylaminophenylimino-5-pyrazolone, and the like; and leuco dyes, such as p,p',p"-hexamethyl triaminophenyl methane (Leuco Crystal Violet), Pergascript Blue SRB (manufactured by Ciba-Geigy), and the like.

In addition to those described above, preferable examples include leuco dyes known as materials for thermal sensitive paper and pressure sensitive paper. Specific examples thereof include crystal violet lactone, malachite green lactone, benzoyl leucomethylene blue, 2-(N-phenyl-N-methylamino)-6-(N-p-tolyl-N-ethyl)amino-fluoran, 2-anilino-3-methyl-6-(N-ethyl-p-toluidino)fluoran, 3,6-dimethoxy fluoran, 3-(N,N-diethylamino)-5-methyl-7-(N,N-dibenzylamino)-fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-zaphthalide, 3-(4-diethylaminophenyl)-3-(1-ethyl-2-methylindol-3-yl) phthalide, and the like.

The dye which is discolored due to acid or radical is contained in the image recording layer in an amount of 0.01 to 15% by mass with respect to the solid content of the image recording layer.

<Polymerization Inhibitor>

A small amount of a heat-polymerization inhibitor is preferably added to the image recording layer of the present invention in order to prevent undesired heat polymerization of the radical polymerizable compound (C) during the production or storage of the image recording layer.

Preferable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylenebis(4-methyl-6-t-butyl phenol), N-nitroso-N-phenyl hydroxylamine aluminum salt, and the like.

The heat-polymerization inhibitor is preferably contained in the image recording layer in an amount of about 0.01 to about 5% by mass with respect to the total solid content of the image recording layer.

<Higher Fatty Acid Derivatives and the Like>

To prevent the inhibition of polymerization by oxygen, for example, a higher fatty acid derivative, such as behenic acid or behenic amide, may be added so that it is allowed to be locally present on the surface of the image recording layer of the present invention in a drying step after application. The higher fatty acid derivative is preferably contained in the image recording layer in an amount of about 0.1 to about 10% by mass with respect to the total solid content of the image recording layer.

<Plasticizer>

A plasticizer may be contained in the image recording layer of the present invention in order to improve development-on-machine ability.

Preferable examples of the plasticizer include: phthalates, such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate, and the like; glycol esters, such as dimethyl glycol phthalate, ethyl phthalyl ethyl glycolate, methyl phthalyl ethyl glycolate, butyl phthalyl butyl glycolate, triethylene glycol dicaprylate, and the like; phosphates, such as tricresyl phosphate, triphenyl phosphate, and the like; aliphatic dibasic acid esters, such as diisobutyl adipate, dioctyl adipate, dimethyl sebacate, dibutyl sebacate, dioctyl azelate, dibutyl maleate, and the like; polyglycidyl methacrylate; triethyl citrate; glycerin triacetyl ester; butyl laurate; and the like.

The plasticizer is preferably contained in the image recording layer in an amount of about 30% by mass or less with respect to the total solid content of the image recording layer.

<Low-Molecular Hydrophilic Compound>

The image recording layer of the present invention may contain a hydrophilic low-molecular compound in order to improve development-on-machine ability. Examples of the hydrophilic low-molecular compound include water-soluble organic compounds including: glycols, such as ethylene glycol, diethylene glycol, triethylene glycol, propylene glycol, dipropylene glycol, tripropylene glycol, and the like, and ethers or ester derivatives thereof, polyhydroxy compounds, such as glycerin, pentaerythritol, and the like; organic amines, such as triethanol amine, diethanol amine monoethanol amine, and the like, and salts thereof; organic sulfonic acids, such as toluene sulfonic acid, benzene sulfonic acid, and the like, and salts thereof, organic phosphonic acids, such as phenyl phosphonic acid, and the like, and salts thereof, organic carboxylic acids, such as tartaric acid, oxalic acid, citric acid, malic acid, lactic acid, gluconic acid, amino acids, and the like, and salts thereof, and the like.

<Formation of Image Recording Layer>

In the present invention, several embodiments can be used as a method of incorporating the above-described components of the image recording layer into the image recording layer. One embodiment is a molecule dispersion type image recording layer obtained by dissolving the components in an appropriate solvent and applying the solution as described in, for example, JP-A No. 2002-287334. Another embodiment is a microcapsule type image recording layer obtained by incorporating the components of the image recording layer contained in microcapsules into the image recording layer as described in, for example, JP-A Nos. 2001-277740 and 2001-277742. Moreover, in the microcapsule type image recording layer, the components may be contained outside the microcapsules. Here, the microcapsule type image recording layer preferably contains a hydrophobic component encapsulated in a microcapsule and a hydrophilic component outside the microcapsule. To obtain better development-on-machine ability, the image recording layer is preferably of the microcapsule type.

As a method of microencapsulating the components of the image recording layer, known methods can be employed. Examples of a method of preparing a microcapsule include, but are not limited to: a method of utilizing coacervation described in U.S. Pat. Nos. 2,800,457 and 2,800,458; a surface polymerization method described in U.S. Pat. No. 3,287,154, and JP-B Nos. 38-19574 and 42-446; a polymer deposition method described in U.S. Pat. Nos. 3,418,250 and 3,660,304; a method of using an isocyanate polyol wall material described in U.S. Pat. No. 3,796,669; a method of using an isocyanate wall material as described in U.S. Pat. No. 3,914,511; a method of using a urea-formaldehyde or urea-formaldehyde-resorcinol wall-forming material described in U.S. Pat. Nos. 4,001,140, 4,087,376, and 4,089,802; a method of using a wall material, such as melamine-formaldehyde resin, hydroxycellulose, or the like, described in U.S. Pat. No. 4,025,445; an in situ method of using monomer polymerization described in JP-B Nos. 36-9163 and 51-9079; a spray-drying method described in GB Patent No. 930422 and U.S. Pat. No. 3,111,407; a electrolytic dispersion freezing method described in GB Patent Nos. 952807 and 967074; and the like.

A microcapsule wall used in the present invention preferably has a three-dimensional crosslink and an ability to swell in a solvent. In these regards, a wall material for the microcapsule is preferably polyurea, polyurethane, polyester, polycarbonate, polyamide, and a mixture thereof, particularly preferably polyurea and polyurethane. Also, a compound having a crosslinkable functional group, such as, for example, an ethylenically unsaturated bond which can be introduced into the above-described binder polymer, may be introduced into the microcapsule wall.

The microcapsule preferably has an average particle size of 0.01 to 3.0 µm, more preferably 0.05 to 2.0 µm, and particularly preferably 0.10 to 1.0 µm. Within this range, good resolution and good stability over time can be obtained.

The image recording layer of the present invention is formed by applying a coating solution prepared by dispersing or dissolving the above-described necessary components in a solvent. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethyl acetamide, N,N-dimethyl formamide, tetramethylurea, N-methylpyrrolidone, dimethyl sulfoxide, sulfolane, γ-butyrol lactone, toluene, water, and the like. These solvents may be used singly or in mixture. The solid content concentration of the coating solution is preferably 1 to 50% by mass.

The image recording layer of the present invention can also be formed by preparing a plurality of coating solutions in which the same or different components are dispersed or dissolved in the same or different solvents, and repeating application and drying of the solutions a plurality of times.

Further, the coating amount (solid content) of the image recording layer on the support after application and drying varies depending on the use, and in general, is preferably 0.3 to 3.0 $g/m^2$. Within this range, good sensitivity and good film-forming characteristics of the image recording layer are obtained.

As an application method, various methods can be used. Examples thereof include bar-coater application, rotary application, spray application, curtain application, dip application, air-knife application, blade application, roll application, and the like.

<Support>

The support used in the planographic printing plate precursor of the present invention is not particularly limited and may be any plate-like matter having a high level of dimensional stability. Examples thereof include paper, paper having a plastic (e.g., polyethylene, polypropylene, polystyrene, etc.) laminated thereon, a metal plate (e.g., aluminum, zinc, copper, etc.), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), paper or plastic film having the above-described metal laminated or vapor-deposited thereon, and the like. As the support, a polyester film and an aluminum plate are preferable. Among them, an aluminum plate is preferable because of its excellent dimensional stability and relatively low cost.

Examples of the aluminum plate include a pure aluminum plate, an alloy plate containing aluminum as a major component and a small amount of a different element, and an aluminum or aluminum alloy plate having a plastic laminated or vapor-deposited thereon. Examples of the different element contained in the aluminum alloy include silicon, iron, manganese, copper, magnesium, chromium, zinc, bismuth, nickel, titanium, and the like. The content of such a different element in the alloy is preferably 10% by mass or less. Although a pure aluminum plate is preferable in the present invention, it is difficult to produce completely pure aluminum in view of refining techniques. Thus, aluminum containing a small amount of a different element may be used. The composition of the aluminum plate is not particularly limited and can be made of a commonly known and used material as appropriate.

The support preferably has a thickness of 0.1 to 0.6 mm, more preferably 0.15 to 0.4 mm, and even more preferably 0.2 to 0.3 mm.

Before using the aluminum plate, it is preferable to carry out a surface treatment, such as roughening, anodic oxidation, or the like. With the surface treatment, the hydrophilicity can be improved and the adhesion between the image recording layer and the support can be secured. Before roughening a surface of the aluminum plate, a degreasing treatment is carried out so as to remove rolling oil from the surface using a surfactant, an organic solvent, an alkali aqueous solution, or the like.

The treatment for roughening the aluminum plate surface can be carried out by various methods. Examples thereof include a mechanical surface-roughening treatment, an electrochemical surface roughening treatment (a surface-roughening treatment of electrochemically dissolving a surface), and a chemical surface roughening treatment (a surface-roughening treatment of chemically selectively dissolving a surface).

Examples of the mechanical surface roughening treatment method include known methods, such as a ball grinding method, a brush grinding method, a blast grinding method, a buff grinding method, and the like, can be used.

An example of the electrochemical surface-roughening treatment method is a method which is carried out in an electrolytic solution containing an acid, such as hydrochloric acid, nitric acid, or the like, under alternating current or direct current. It is also possible to use an acid mixture as disclosed in JP-A No. 54-63902.

The aluminum plate thus surface-roughened is optionally subjected to an alkali etching treatment using an aqueous solution of potassium hydroxide, sodium hydroxide, or the like, followed by neutralization and, if desired, followed by an anodic oxidation treatment to improve abrasion resistance.

As an electrolyte used in the anodic oxidation treatment of the aluminum plate, various electrolytes which form a porous oxidation film can be used. In general, sulfuric acid, hydrochloric acid, oxalic acid, chromic acid, or a mixture of thereof is used. The concentration of such an electrolyte is determined as appropriate, depending on the type of the electrolyte.

Conditions for the anodic oxidation treatment vary depending on the electrolyte employed. In general, it is preferable that the concentration of the electrolyte solution be 1 to 80% by mass, the solution temperature be 5 to 70° C., the current density be 5 to 60 $A/dm^2$, the voltage be 1 to 100 V, and the electrolysis time be 10 sec to 5 min. It is preferable that the amount of the anodic oxidation film be 1.0 to 5.0 $g/m^2$, more preferably 1.5 to 4.0 $g/m^2$. Within this range, good printing durability and good resistance to scratch in a non-image portion are obtained.

The support used in the present invention may be the above-described substrate having been subjected to a surface treatment and having an anodic oxidation film, as it is. To further improve the adhesiveness to an upper layer, hydrophilicity, stain resistance, heat-insulating property, or the like, the substrate can be optionally subjected to a treatment selected as appropriate from a treatment for enlarging micropores in the anodic oxidation film, a treatment for closing micropores, a surface-hydrophilization treatment by immersion in an aqueous solution containing a hydrophilic compound, and the like, described in JP-A Nos. 2001-253181 and 2001-322365.

The hydrophilization treatment may be carried out by an alkali metal silicate method as described in U.S. Pat. Nos. 2,714,066, 3,181,461, 3,280,734 and 3,902,734. In this method, the support is immersed in an aqueous solution of sodium silicate or the like, or is subjected to an electrolysis treatment. Alternatively, a method of treating with potassium fluorozirconate disclosed in JP-B No. 36-22063, a method of treating with polyvinylphosphonic acid as disclosed in U.S. Pat. Nos. 3,276,868, 4,153,461, and 4,689,272, are used.

When a support with a surface having an insufficient level of hydrophilicity (e.g., polyester film, etc.) is used as the support of the present invention, it is desirable to apply a hydrophilic layer thereonto so as to impart hydrophilicity to the surface. Preferable examples of such a hydrophilic layer include: a hydrophilic layer formed by applying a coating solution containing a colloid of an oxide or a hydroxide of at least one element selected from beryllium, magnesium, aluminum, silicon, titanium, boron, germanium, tin, zirconium, iron, banadium, antimony and transition metals, described in JP-A No. 2001-199175; a hydrophilic layer having an organic hydrophilic matrix obtained by crosslinking or pseudo-crosslinking an organic hydrophilic polymer, described in JP-A No. 2002-79772; a hydrophilic layer having an inorganic hydrophilic matrix obtained by sol-gel conversion via a hydrolysis or condensation reaction of polyalkoxysilane, titanate, zirconate or aluminate; and a hydrophilic layer comprising an inorganic film having a surface containing a metal oxide. Among them, a hydrophilic layer formed by applying a coating solution containing silicone oxide or hydroxide colloid is preferable.

When a polyester film or the like is used as the support of the present invention, it is preferable to provide an antistatic layer on a side facing the hydrophilic layer, a side opposite thereto, or both thereof of the support. Such an antistatic layer provided between the support and the hydrophilic layer contributes to an improvement in adhesiveness to the hydrophilic layer. As the antistatic layer, a polymer layer having a fine metal oxide particle or a matting agent dispersed therein, described in JP-A No. 2002-79772, or the like can be used.

The support preferably has a centerline average roughness of 0.10 to 1.2 μm. Within this range, good adhesiveness to the image recording layer, good printing durability, and good stain resistance are obtained.

The support preferably has a color density of 0.15 to 0.65 as measured as a reflection density. Within this range, a satisfactory level of image forming ability and ease of checking a plate after development can be obtained by prevention of halation during image exposure.

<Backcoat Layer>

After a surface treatment of the support or formation of an undercoat layer, a backcoat can be optionally provided on a back surface of the support.

A preferable example of the backcoat is a coating layer made of an organic polymer compound described in JP-A No. 5-45885 or a metal oxide obtained by hydrolysis and polycondensation of an organic or inorganic metal compound, described in JP-A No. 6-35174. Among them, it is preferable to use a silicon alkoxy compound, such as $Si(OCH_3)_4$, $Si(OC_2H_5)_4$, $Si(OC_3H_7)_4$, $Si(OC_4H_9)_4$, or the like, since such a material is easily available at low cost.

<Protective Layer>

In the planographic printing plate precursor of the present invention used in the planographic printing method of the present invention, image formation by exposure is not likely to be affected by oxygen, and therefore, a protective layer for blocking oxygen is not necessarily required. However, a protective layer can be optionally provided on the image recording layer in order to prevent occurrence of scratch or the like in the image recording layer, prevent abrasion upon high-illuminance laser exposure, or block oxygen so as to enhance image strength.

In the present invention, exposure is typically performed in the atmosphere. The protective layer prevents contamination of the image recording layer with a low-molecular weight compound, such as oxygen, basic substance, or the like, which is present in the atmosphere and inhibits an image formation reaction caused by exposure in the image recording layer, thereby preventing inhibition of the image formation reaction due to exposure in the atmosphere. Therefore, it is preferable that the protective layer have a low permeability with respect to a low-molecular weight compound, such as oxygen or the like, a high transmittance of light used for exposure, and excellent adhesiveness to the image recording layer, and be able to be easily removed in a development-on-machine step following exposure. Conventionally, various protective layers having such properties have been studied as described in detail in, for example, U.S. Pat. No. 3,458,311 and JP-A No. 55-49729.

As a material used in the protective layer, for example, a water-soluble polymer compound having relatively excellent crystallinity is used. Specific examples of such a water-soluble polymer include polyvinyl alcohol, polyvinyl pyrrolidone, acidic celluloses, gelatin, gum arabic, polyacrylic acid, and the like.

Among them, when polyvinyl alcohol (PVA) is used as a major component, a most desirable result may be obtained in fundamental properties, such as oxygen-blocking ability, development/removal ability, and the like. The polyvinyl alcohol may be partially substituted with ester, ether, or acetal or may partially have other copolymer components as long as it contains an unsubstituted vinyl alcohol unit for imparting the required oxygen-blocking ability and water-solubility to the protective layer. Similarly, it may partially have another comonomer.

Specific examples of the polyvinyl alcohol include those which are hydrolyzed to an extent of 71 to 100 mol % and have a degree of polymerization of 300 to 2,400. Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (all are manufactured by KURARAY).

The components (selection of PVA, use of additive(s), etc.), coating amount, and the like of the protective layer are selected as appropriate, taking into consideration a fog property, adhesiveness, resistance to scratch, and the like in addition to oxygen-blocking ability and development/removal ability. In general, the higher the hydrolysis ratio of PVA (i.e., the higher content of unsubstituted vinyl alcohol units in the protective layer) or the larger the film thickness, the higher the oxygen-blocking ability, which is preferable in terms of sensitivity. To prevent an unnecessary polymerization reaction during production or preservation, and an unnecessary fog, a thickened image line, and the like during image exposure, it is preferable that the oxygen permeability be not excessively high. Thus, it is preferable that the oxygen permeability A at 25° C. under 1 atmospheric pressure be $0.2 < A \leqq 20$ (cc/m² day).

As other components of the protective layer, glycerol, dipropylene glycol, or the like can be added in an amount corresponding to several percents by mass with respect to the (co)polymer, to impart flexibility. It is also possible to add: an anionic surfactant, such as a sodium alkylsulfate, a sodium alkylsulfonate, or the like; an amphoteric surfactant, such as an alkylaminocarboxylic acid salt, an alkylaminodicarboxylic acid salt, or the like; or a nonionic surfactant, such as a polyoxyethylene alkyl phenyl ether or the like, in an amount corresponding to several percent by mass with respect to the (co)polymer.

Adhesiveness to an image portion, resistance to scratch, and the like of the protective layer are highly important in terms of handling of the planographic printing plate precursor. Specifically, when a hydrophilic protective layer containing a water-soluble polymer compound is laminated on a lipophilic image recording layer, the protective layer is likely to peel off due to insufficient adhesive force, leading to a defect, such as, for example, film curing failure due to inhibition of polymerization by oxygen, at the peeled portion.

To overcome this, various proposals have been made so as to improve the adhesion between the image recording layer and the protective layer. For example, JP-A No. 49-70702 and GB-A No. 1303578 describe that a sufficient level of adhesiveness is obtained by mixing a hydrophilic polymer mainly comprising polyvinyl alcohol with 20 to 60% by mass of an acrylic emulsion, a water-insoluble vinylpyrrolidone-vinyl acetate copolymer, and the like, and laminating the resultant mixture on the image recording layer. Any of these known techniques can be used in the present invention.

Further, other functions may be imparted to the protective layer. For example, addition of a colorant (e.g., a water-soluble dye) having an excellent transmittance of light used for exposure and being capable of well absorbing light of wavelengths other than that of the exposure light makes it possible to improve a safe light property without a reduction in sensitivity.

The protective layer preferably has a film thickness of 0.1 to 5 μm, particularly preferably 0.2 to 2 μm.

The method for applying such a protective layer is described in detail in, for example, U.S. Pat. No. 3,458,311 and JP-A No. 55-49729.

EXAMPLES

Hereinafter, the present invention will be described in detail by way of examples. The present invention is not limited to these examples.

1. Preparation of Support

A melt of a JIS A1050 aluminum alloy containing 99.5% by mass or more aluminum, 0.30% by mass Fe, 0.10% by mass Si, 0.02% by mass Ti, and 0.013% by mass Cu was subjected to a cleaning treatment, followed by casting. In this cleaning treatment, the melt was degassed to remove unnecessary gas, such as hydrogen or the like, and was filtered through a ceramic tube filter. Casting was conducted using a DC casting method. The coagulated ingot plate having a wall thickness of 500 mm was shaved from a surface thereof by a depth of 10 mm, and thereafter, the plate was subjected to a homogenization treatment at 550° C. for 10 hours so that an intermetallic compound was not formed into a rough and large mass. Then, the plate was hot-rolled at 400° C. and was then annealed at 500° C. for 60 seconds in a continuous annealing furnace, followed by cold-rolling to form an aluminum rolled plate having a thickness of 0.30 mm. By controlling the roughness of pressure rollers, the centerline average roughness $R_a$ after cold rolling was controlled to be 0.2 μm. Thereafter, the plate was placed in a tension leveler to improve flatness. The resultant aluminum plate was subjected to the following surface treatment.

To remove rolling oil from a surface of the aluminum plate, the aluminum plate surface was subjected to a degreasing treatment at 50° C. for 30 seconds using 10-mass % aluminate soda aqueous solution, and thereafter, the aluminum plate surface was grained by using three nylon brushes implanted with bundled hairs having a hair diameter of 0.3 mm and a water suspension (specific gravity: 1.1 g/cm$^3$) of pumice having a median diameter of 25 μm, followed by thorough washing with water. This plate was etched by immersing it in a 25-mass % sodium hydroxide aqueous solution at 45° C. for 9 seconds, and after washing with water, was immersed in 20-mass % nitric acid at 60° C. for 20 seconds, followed by washing with water. At this time, the etched amount of the grained surface was about 3 g/m$^2$.

Next, the aluminum plate was subjected to a continuous electrochemical surface-roughening treatment by using an alternating voltage of 60 Hz. An electrolytic solution used here was a 1-mass % nitric acid aqueous solution (containing 0.5% by mass of aluminum ions) and had a liquid temperature of 50° C. This electrochemical surface-roughening treatment was conducted using an alternating current power source which gives a trapezoidal alternating current having a trapezoidal waveform which has a time TP (required for a current value to reach a peak from zero) of 0.8 msec and a duty ratio of 1:1, and using a carbon electrode as a counter electrode. An auxiliary anode was made of ferrite. A current density was 30 A/dm$^2$ when the current had a peak value, and 5% of the current flowing from the power source was shunted into the auxiliary anode. The quantity of electricity in the nitric acid electrolysis was 175 C/dm$^2$ when the aluminum plate was serving as an anode. Thereafter, the aluminum plate washed by spraying water.

Next, the aluminum plate was subjected to an electrochemical surface-roughening treatment in a manner similar to that of the nitric acid electrolysis under conditions where a 0.5-mass % hydrochloric acid aqueous solution (containing 0.5% by mass of aluminum ions) was used, the liquid temperature was 50° C., and the quantity of electricity was 50 C/dm$^2$ when the aluminum plate was serving as an anode. Thereafter, the aluminum plate was washed by spraying water. This plate was treated in 15-mass % sulfuric acid (containing 0.5% by mass of aluminum ions) as an electrolytic solution at a current density of 15 A/dm$^2$ to provide a DC anodic oxide film of 2.5 g/m$^2$, followed by washing with water and drying, and was further treated in an aqueous 2,5-mass % sodium silicate solution at 30° C. for 10 seconds. The centerline average roughness (Ra) was measured by using a needle having a diameter of 2 μm to be found to be 0.51 μm.

2. Fabrication of Planographic Printing Plate Precursor 2-1. Fabrication of Planographic Printing Plate Precursor (1) (Photopolymer Plate Material)

On the above-described support, an undercoat layer coating solution (1) having a composition described below was used to prepare a liquid composition (sol liquid) in a manner described below. Next, this sol solution was diluted with methanol/ethylene glycol=20/1 (mass ratio) to 0.5% by mass. The resultant diluted solution was applied onto a substrate by a wheeler, followed by drying at 100° C. for one minute. The coating amount at this time was 5 mg/m$^2$. The coating amount was defined by the amount of Si element measured by X-ray fluorescence analysis.

| <Undercoat layer coating solution (1)> | |
|---|---|
| Si(OC$_2$H$_5$)$_4$ | 50 g |
| 3-methacryloyloxypropyltrimethoxysilane | 20 g |
| 85% by mass phosphate aqueous solution | 18 g |
| ion exchanged water | 20 g |
| methanol | 150 g |

<Preparation of Sol Solution>

The undercoat layer coating solution (1) composition was placed and weighed in a beaker, followed by stirring at 25° C. for 20 minutes. The resultant solution was transferred to a three-neck flask equipped with a reflux condenser, and the three-neck flask was immersed in an oil bath kept at room temperature. The content of the three-neck flask was heated to 50° C. in 30 minutes while being stirred with a magnetic stirrer. The mixture was allowed to react for a further one hour while keeping the temperature of the bath at 50° C. to obtain a liquid composition (sol solution).

Next, an image recording layer coating solution (1) having a composition described below was applied to a dried coating mass of 1.5 g/m², followed by drying at 100° C. for one minute, to form an image recording layer. A protective layer coating solution (1) having a composition described below was applied onto the image recording layer to a dried coating mass of 2.5 g/m², followed by drying 120° C. for one minute, to obtain a planographic printing plate precursor (1).

| <Image recording layer coating solution (1)> | |
|---|---|
| tetramethylolmethane tetraacrylate | 20 g |
| binder polymer (1) (average molecular weight 50,000) described below | 30 g |
| polymerization initiator (1) described below | 1 g |
| ε-phthalocyanine/binder polymer (1) dispersion | 2 g |
| fluorine nonionic surfactant Megafack F177 (manufactured by Dainippon Ink & Chemicals Inc.) | 0.5 g |
| cupferron AL (nitroso compound, manufactured by Wako Pure Chemical Industries Ltd.) | 0.2 g |
| methylethylketone | 200 g |
| propylene grycol monomethyl ether acetate | 200 g |

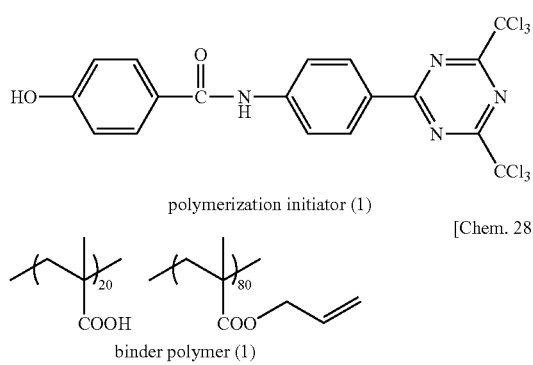

polymerization initiator (1)

binder polymer (1)

| <Protective layer coating solution (1)> | |
|---|---|
| polyvinyl alcohol (sponification degree: 95 mol %; polymerization degree: 800) | 40 g |
| polyvinyl pyrrolidone (molecular weight: 50,000) | 5 g |
| poly(vinylpyrrolidone/vinyl acetate (1/1)) (molecular weight: 70,000) | 5 g |
| water | 950 g |

2-2. Fabrication of Planographic Printing Plate Precursor (2) (Development-on-Machine Plate Material)

An undercoat layer coating solution (2) having a composition described below was applied onto the above-described support using a bar having a liquid amount of 7.5 ml/m², followed by drying in an oven at 80° C. for 10 seconds. An image recording layer coating solution (2) having a composition described below was applied using a bar coating technique, followed by drying in an oven at 70° C. for 60 seconds, to form an image recording layer having a dried coating amount of 1.0 g/m². On the image recording layer, a protective layer coating solution (1) having the above-described composition (1) was applied to a dried coating amount of 0.5 g/m², followed by drying at 120° C. at one minute, to obtain a planographic printing plate precursor (2).

| <Undercoat layer coating solution (2)> | |
|---|---|
| water | 300 g |
| methanol | 2700 g |
| compound (D)-1 described below | 1.45 g |
| <Image recording layer coating solution (2)> | |
| polymerization initiator (1) described above | 0.2 g |
| binder polymer (2) (average molecular weight 80,000) described below | 6.0 g |
| polymerizable compound isocyanuric acid EO modified triacrylate (M-315, manufactured by Toa Gosei Co., Ltd.) | 12.4 g |
| Leuco Crystal Violet | 3.0 g |
| thermopolymerization inhibitor | 0.1 g |
| N-nitroso phenylhydroxylamine aluminum salt | |
| tetraethylammonium chloride | 0.1 g |
| fluorine surfactant (1) described below | 0.1 g |
| methylethylketone | 70.0 g |

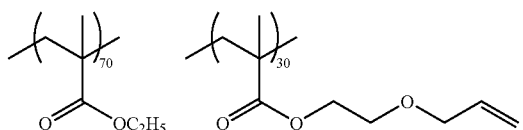

binder polymer (2)

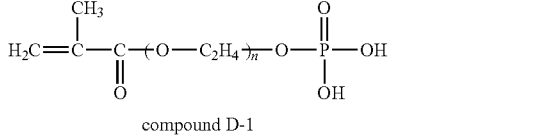

compound D-1
(n = 4~5)

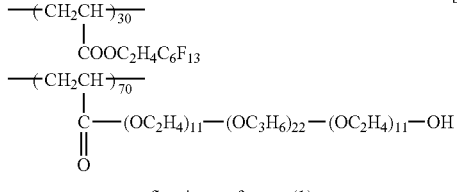

fluorine surfactant (1)

2-3. Fabrication of Planographic Printing Plate Precursor (3) (Microcapsule Type Development-on-Machine Plate Material)

A planographic printing plate precursor (3) was obtained in a manner similar to that of the planographic printing plate precursor (2), except that the image recording layer coating solution (2) was changed to an image recording layer coating solution (3) having a composition described below.

| <Image recording layer coating solution (3)> | |
|---|---|
| polymerization initiator (1) described above | 0.2 g |
| binder polymer (2) (average molecular weight: 80,000) described above | 3.0 g |

-continued

| <Image recording layer coating solution (3)> | |
|---|---|
| polymerizable compound isocyanuric acid EO modified triacrylate (M-315, manufactured by Toa Gosei Co., Ltd.) | 6.2 g |
| Leuco Crystal Violet | 3.0 g |
| thermopolymerization inhibitor N-nitroso phenylhydroxylamine aluminum salt | 0.1 g |
| tetraethylammonium chloride | 0.1 g |
| fluorine surfactant (1) described above | 0.1 g |
| microcapsule (1) described below (solid content) | 10.0 g |
| methylethylketone | 35.0 g |
| 1-methoxy-2-propanol | 35.0 g |
| water | 10.0 g |

(Synthesis of Microcapsule (1))

10 g of trimethylol propane-xylene diisocyanate adduct (Takenate D-110N, manufactured by Mitsui Takeda Chemicals, Inc.), 3.15 g of pentaerythritol triacrylate (SR444, manufactured by Nippon Kayaku Co., Ltd.), 1 g of 3-(N,N-diethylamino)-6-methyl-7-anilinofluoran (ODB, manufactured by Yamamoto Chemicals, Inc.), and 0.1 g of Pionine A-41C (manufactured by Takemoto Oil & Fat Co., Ltd.) (oil-phase components) were dissolved in 17 g of ethyl acetate. As an aqueous-phase component, 40 g of 4-mass % PVA-205 aqueous solution was prepared. The oil-phase components were mixed with the aqueous-phase component, followed by emulsification using a homogenizer at 12,000 rpm for 10 minutes. Thereafter, the resultant emulsion was added to 25 g of distilled water, followed by stirring at room temperature for 30 minutes and further stirring at 40° C. for 3 hours. The microcapsule solution (1) thus prepared was diluted with distilled water to 20% by mass. The microcapsules had an average particle diameter of 0.25 μm.

2-4. Fabrication of Planographic Printing Plate Precursor (4) (Development-on-Machine Plate Material, Initiator was Changed)

A planographic printing plate precursor (4) was obtained in a manner similar to that of the planographic printing plate precursor (2), except that the polymerization initiator (1) used in the fabrication of the planographic printing plate precursor (2) was changed to a polymerization initiator (2) described below.

[Chem. 32]

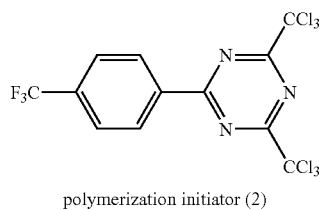

polymerization initiator (2)

2-5. Fabrication of Planographic Printing Plate Precursors (5) to (7) (Development-on-Machine Plate Material, Initiator was Changed)

Planographic printing plate precursors (5) and (6) were obtained in a manner similar to that of the planographic printing plate precursor (2), except that the polymerization initiator (1) for the image recording layer coating solution (2) was changed to polymerization initiators (3) and (4) described below and 0.5 g of a sensitizing coloring matter (1) described below was added thereto. Also, a planographic printing plate precursor (7) was obtained in a manner similar to that of the planographic printing plate precursor (2), except that the polymerization initiator (1) for the image recording layer coating solution (2) was changed to the polymerization initiator (3) described below and 0.5 g of a sensitizing coloring matter (2) described below was added thereto.

[Chem. 33]

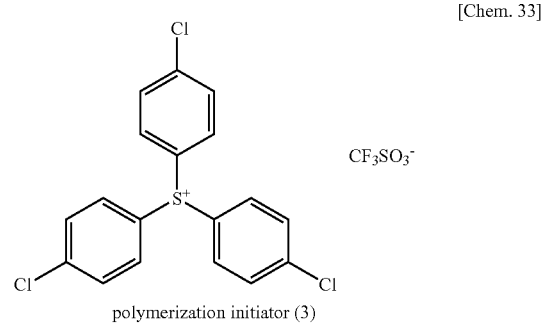

polymerization initiator (3)

[Chem. 34]

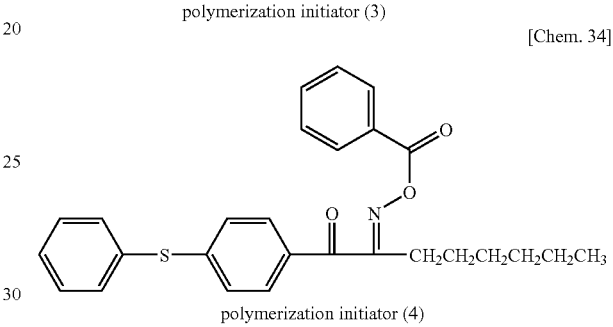

polymerization initiator (4)

[Chem. 35]

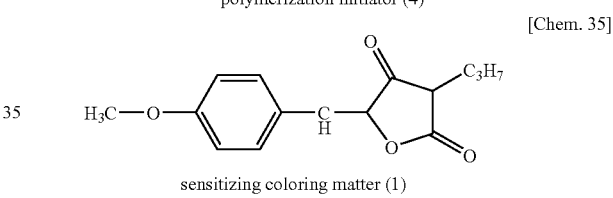

sensitizing coloring matter (1)

[Chem. 36]

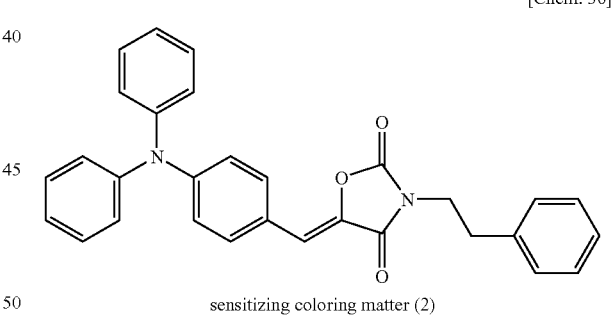

sensitizing coloring matter (2)

2-6. Fabrication of Planographic Printing Plate Precursors (8) and (9) (without Protective Layer)

In the above-described fabrication of the planographic printing plate precursors (1) and (2), the planographic printing plate precursors (8) and (9) were used as planographic printing plate precursors before applying the protective layer on to the image recording layer.

2-7. Fabrication of Planographic Printing Plate Precursor (10) (for Comparative Example)

A planographic printing plate precursor (10) was obtained in a manner similar to that of the planographic printing plate precursor (2), except that the sensitizing coloring matter (1) used in the planographic printing plate precursor (5) was changed to a sensitizing coloring matter (3) described below.

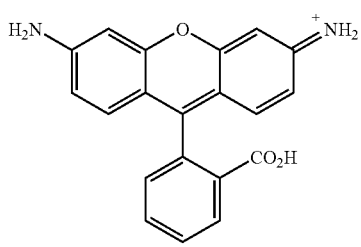

[Chem. 37]

sensitizing coloring matter (3)

Examples 1 to 9

The planographic printing plate precursors (1) to (9) fabricated as described above were used to carry out image formation and printing to evaluate sensitivity, fine line reproducibility, and white light safety. Hereinafter, an exposure method, a development method, a printing method, and an evaluation method used herein will be described. The planographic printing plate precursors used in the examples and the results of evaluation are shown in Table 1.

Examples 10 and 11

Exposure and printing were performed in a manner similar to that of Examples 1 and 2, except that a one-pixel drawing time was changed as shown in Table 1. The result is shown in Table 1.

Example 12

Exposure and printing were performed in a manner similar to that of Example 4, except that the planographic printing plate precursor (2) was used and a one-pixel drawing time was changed as shown in Table 1. The result is shown in Table 1.

Comparative Examples 1 and 2

Exposure and printing evaluations were performed in a manner similar to that of Example 2, except that a one-pixel drawing time was changed as shown in Table 1. The result is shown in Table 1.

Comparative Example 3

Exposure and printing evaluations were performed in a manner similar to that of Example 2, except that the planographic printing plate precursor (10) was used, 488-nm Ar laser was used, and a one-pixel drawing time was changed as shown in Table 1. The result is shown in Table 1.

(1) Exposure Method

Examples 1 to 3 and 5 to 11, Comparative Examples 1 to 2

Figure 6:
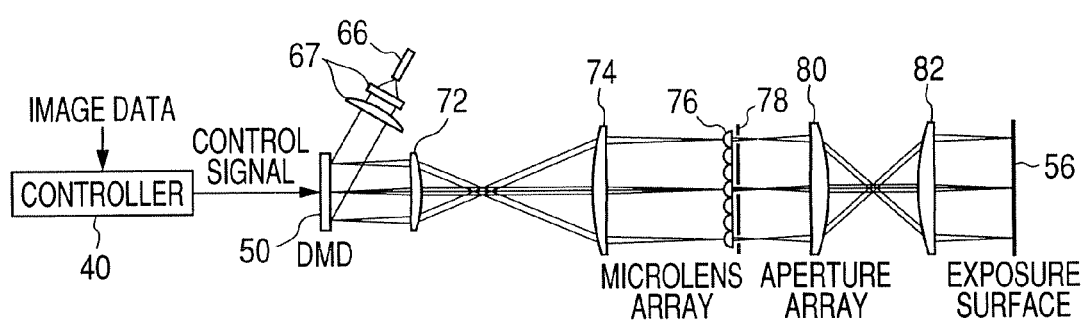
FIG. 6 A cross-sectional view illustrating a structure of an exposure head employing a DMD space light modulation element, when viewed in a sub-scanning direction along an optical axis.

The planographic printing plate precursor was subjected to exposure using an exposure head composed of an optical system employing a DMD space modulation element illustrated in FIG. 6 under conditions where 375-nm or 405-nm (Example 7) semiconductor laser was used, the power was 2 mW, an external drum having a circumferential length of 900 mm, the rotational speed of the drum was 800 rpm, and the resolution was 2400 dpi. The one-pixel drawing time is as shown in Table 1.

Examples 4 and 12, Comparative Example 3

The planographic printing plate precursor was subjected to exposure under conditions where 266-nm (Example 4), 355-nm (Example 12), or 488-nm (Comparative Example 3) laser was used (the quadruple wave of the YAG oscillation mode locked solid laser of FIG. 4), the power was 100 mW, a spindle mirror had 30,000 rpm, an internal drum was used, and the resolution was 2400 dpi. The one-pixel drawing time is as shown in Table 1.

(2) Development Process

The planographic printing plate precursors (1) and (8) were immersed in an 18-fold water-dilution of DP-4 developer solution (manufactured by Fuji Photo Film Co., Ltd.) at 30° C. for 15 seconds. Next, a surface of the plate was treated with a two-fold water-dilution of GU-7 (manufactured by Fuji Photo Film Co., Ltd.) rubber solution.

The planographic printing plate precursors (2) to (7), (9), and (10) were subjected to development-on-machine without subjecting the exposed precursors to a development process, as described in the printing method section below.

(3) Printing Method

After a development process, the planographic printing plate precursors (1) and (8) were attached to a printing machine SOR-M (manufactured by Heidelberg). Printing was performed at a printing speed of 6,000 sheets per hour using fountain solution (EU-3 (etching solution, manufactured by Fuji Photo Film Co., Ltd.)/water/isopropyl alcohol=1/89/10 (ratio by volume)) and TRANS-G (N) black ink (manufactured by Dainippon Ink and Chemicals, Inc.).

The exposed planographic printing plate precursors (2) to (7), (9), and (10) were attached, without a development treatment, into a cylinder of a printing machine SOR-M (manufactured by Heidelberg). The precursors were supplied with fountain solution (EU-3 (etching solution manufactured by Fuji Photo Film Co., Ltd.)/water/isopropyl alcohol=1/89/10 (ratio by volume)) and TRANS-G (N) black ink (manufactured by Dainippon Ink and Chemicals, Inc.). Printing was performed at a printing speed of 6000 sheets per hour, to print 100 sheets. Removal of an unexposed portion of the image recording layer was completed on the printing machine, and printed matter free from stain on a non-image portion was obtained.

(4) Evaluation of Planographic Printing Plate Precursor

<Sensitivity>

After 100 sheets were printed and it was confirmed that no printed sheets had ink stain in a non-image portion thereof, 500 sheets were further printed. An exposure amount which did not cause an irregular ink concentration in an image portion of a 600-th printed sheet was measured as sensitivity.

<Fine Line Reproducibility>

As described above, after 100 sheets were printed and it was confirmed that no printed sheets had ink staining in a non-image portion thereof, 500 sheets were further printed. A fine line chart (a chart on which 10, 12, 14, 16, 18, 20, 25, 30, 35, 40, 60, 80, 100, and 200 μm fine lines were exposed) of a 600-th printed sheet was observed with a 25× loupe, and fine line reproducibility was evaluated from the fine line width reproduced with the ink without discontinuity.

<White Light Safety>

Planographic printing plate precursors which had not been exposed were placed under a white fluorescent lamp to be subjected to exposure under conditions where the light amount was 400 lux on a surface of the planographic printing plate precursor. The planographic printing plate precursors which had been exposed to white light were attached to a cylinder of a printing machine SOR-M (manufactured by Heidelberg) as described above after being subjected to a development process as required. After 100 sheets were printed, an exposure time with which ink stain did not occur under a white fluorescent lamp, was measured. The longer this time, the better the white light safety.

TABLE 1

| Examples | Planographic printing plate precursor | Presence of OC layer | Light source | Pixel residence time | Maximum initiator absorption $\lambda$max[nm] | Sensitivity [mJ/cm$^2$] | Fine line reproducibiilty [μm] | White light safety [min] |
|---|---|---|---|---|---|---|---|---|
| Example 1 | (1) | Yes | 375-nm SL | 0.9 μsec | 360 | 0.05 | 10 | 180 |
| Example 2 | (2) | Yes | 375-nm SL | 0.9 μsec | 360 | 0.07 | 10 | 180 |
| Example 3 | (3) | Yes | 375-nm SL | 0.9 μsec | 360 | 0.07 | 12 | 180 |
| Example 4 | (4) | Yes | 266-nm L | 0.02 μsec | 267 | 0.05 | 10 | 150 |
| Example 5 | (5) | Yes | 375-nm SL | 0.9 μsec | 375 | 0.15 | 12 | 240 |
| Example 6 | (6) | Yes | 375-nm SL | 0.9 μsec | 375 | 0.15 | 12 | 240 |
| Example 7 | (7) | Yes | 405-nm SL | 0.9 μsec | 405 | 0.20 | 12 | 240 |
| Example 8 | (8) | No | 375-nm SL | 0.9 μsec | 360 | 0.25 | 12 | 240 |
| Example 9 | (9) | No | 375-nm SL | 100 μsec | 360 | 0.08 | 12 | 150 |
| Example 10 | (1) | Yes | 375-nm SL | 100 μsec | 360 | 0.08 | 12 | 150 |
| Example 11 | (2) | Yes | 375-nm SL | 1 msec | 360 | 0.10 | 12 | 120 |
| Example 12 | (2) | Yes | 355-nm L | 0.1 μsec | 360 | 0.10 | 12 | 150 |
| Comparative Example 1 | (2) | Yes | 375-nm SL | 2 msec | 360 | 1.00 | 20 | 240 |
| Comparative Example 2 | (2) | Yes | 375-nm SL | 1 sec | 360 | 1.50 | 40 | 240 |
| Comparative Example 3 | (10) | Yes | 488-nm L | 1 sec | 510 | 20 | 40 | 5 |

Note)
SL is an abbreviation for "semiconductor laser",
L is an abbreviation for "laser".

As can be seen from the above-described result, the image forming method and the planographic printing method of the present invention (Examples 1 to 12) can simultaneously achieve both high sensitivity and white light safety, and can provide high quality with a satisfactory level of fine line reproducibility.

Example 13

An image recording layer coating solution (4) having a composition described below was applied on the above-described support using a bar coating technique, followed by drying in an oven at 70° C. for 60 seconds, to form an image recording layer having a dried coating amount of 1.0 g/m$^2$. The above-described protective layer coating solution (1) was applied to the image recording layer to a dried coating amount of 0.5 g/m$^2$, followed by drying at 120° C. for one minute, to obtain a planographic printing plate precursor (13).

| Image recording layer coating solution (4) | |
|---|---|
| polymerization initiator (1) described above | 0.2 g |
| binder polymer (2) (average molecular weight; 80,000) described above | 6.0 g |
| polymerizable compound isocyanuric acid EO modified triacrylate (M-315, manufactured by Toa Gosei Co., Ltd.) | 12.4 g |
| compound (D)-1 described above | 1.5 g |
| Leuco Crystal Violet | 3.0 g |
| thermopolymerization inhibitor N-nitroso phenylhydroxylamine aluminum salt | 0.1 g |
| tetraethylammonium chloride | 0.1 g |
| fluorine surfactant (1) described above | 0.1 g |
| methylethylketone | 70.0 g |

Example 14

The above-described undercoat layer coating solution (1) was applied onto the support used in Example 13 using a bar having a liquid amount of 7.5 ml/m$^2$, followed by drying in an oven at 80° C. for 10 seconds. Next, an image recording layer and a protective layer were provided in a manner similar to the method of Example 13, except that the compound (D)-1 was not contained in the image recording layer coating solution (4) of Example 13, to obtain a planographic printing plate precursor (14).

Examples 15 to 18

Planographic printing plate precursors (15) to (18) were obtained in a manner similar to that of Example 14, except that the compound (D)-1 of Example 14 was replaced with a compound contained in an undercoat layer shown in Table 2.

TABLE 2

(Examples 15 to 18)

| Examples | Compound contained in undercoat layer | Copolymer composition (molar ratio) | Mass average molecular weight |
|---|---|---|---|
| Example 15 | Compound (D-2) | — | — |
| Example 16 | Illustrated compound 4 | x/y = 70/30 | 30,000 |
| Example 17 | Illustrated compound 25 | x/y/z = 30/50/20 | 25,000 |
| Example 18 | Illustrated compound 33 | x/y/z = 40/40/20 | 15,000 |

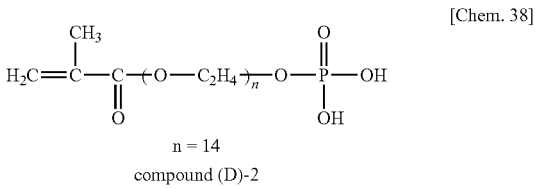

[Chem. 38]

n = 14
compound (D)-2

Examples 19 to 23

Planographic printing plate precursors (19) to (23) were obtained in a manner similar to that of Example 13, except that the polymerization initiator (1) of Example 13 was replaced with that shown in Table 3.

TABLE 3

(Examples 19 to 23)

| Examples | Polymerization initiator | Added amount to coating solution |
|---|---|---|
| Example 19 | H₃CO—C₆H₄—triazine(CCl₃)₂ | 0.2 g |
| Example 20 | (H₃C)₂N—C₆H₄—CO—C₆H₄—N(CH₃)₂ / C₆H₅—CO—C₆H₅ | 0.1 g/ 0.1 g |
| Example 21 | (H₃C)₂N—C₆H₄—CO—C₆H₄—N(CH₃)₂ / C₆H₅—CO—C₆H₄—S—C₆H₄—CH₃ | 0.1 g/ 0.1 g |
| Example 22 | (H₃C)₂N—C₆H₄—CO—C₆H₄—N(CH₃)₂ / 2-chlorothioxanthone | 0.1 g/ 0.2 g |
| Example 23 | morpholino-C₆H₄—CO—C(C₂H₅)(CH₂Ph)—N(CH₃)₂ | 0.2 g |

Example 24

An undercoat layer similar to that of Example 14 was provided on the support of Example 13. Next, an image recording layer coating solution (5) having a composition described below was applied using a bar coating technique, followed by drying in an oven at 70° C. for 60 seconds, to form an image recording layer having a dried coating amount of 1.0 g/m². The above-described protective layer coating solution (1) was applied onto the image recording layer to a dried coating mass of 0.5 g/m², followed by drying 120° C. for one minutes, to obtain a planographic printing plate precursor (24).

| Image recording layer coating solution (5) | |
|---|---|
| polymerization initiator (5) described below | 0.2 g |
| binder polymer (2) (average molecular weight: 80,000) described above | 6.0 g |
| polymerizable compound isocyanuric acid EO modified triacrylate (M-315, manufactured by Toa Gosei Co., Ltd.) | 12.4 g |
| sensitizing coloring matter (1) described above | 1.0 g |
| Leuco Crystal Violet | 3.0 g |

-continued

| Image recording layer coating solution (5) | |
|---|---|
| thermopolymerization inhibitor N-nitroso phenylhydroxylamine aluminum salt | 0.1 g |
| tetraethylammonium chloride | 0.1 g |
| fluorine surfactant (1) described above | 0.1 g |
| methylethylketone | 70.0 g |

[Chem. 39]

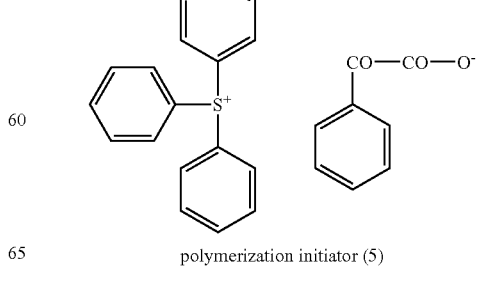

polymerization initiator (5)

Examples 25 to 27

Planographic printing plate precursors (25) to (27) were obtained in a manner similar to that of Example 24, except that the combinations of the polymerization initiator (5) and the sensitizing coloring matter (1) of Example 24 were replaced with combinations of compounds illustrated in Table 4.

Comparative Example 4

A planographic printing plate precursor (29) was obtained in a manner similar to that of Example 13, except that the compound (D)-1 was not contained in the image recording layer coating solution (4) of Example 13.

TABLE 4

(Examples 25 to 27)

| Examples | Polymerization initiator | Sensitizing coloring matter |
|---|---|---|
| Example 25 | Diphenyliodonium $CF_3SO_3^-$ | 9,10-diphenylanthracene |
| Example 26 | Polymerization initiator (5) | bis(7-dimethylamino-coumarin-3-yl) ketone |
| Example 27 | Polymerization initiator (4) | 2,4-diethylthioxanthone |

Example 28

A planographic printing plate precursor (28) was obtained in a manner similar to that of Example 14, except that the image recording layer coating solution (4) of Example 14 was changed to an image recording layer coating solution (6) having a composition described below.

| Image recording layer coating solution (6) | |
|---|---|
| polymerization initiator (1) described above | 0.2 g |
| binder polymer (2) (average molecular weight: 80,000) described above | 3.0 g |
| polymerizable compound isocyanuric acid EO modified triacrylate (M-315, manufactured by Toa Gosei Co., Ltd.) | 6.2 g |
| compound (D)-1 described above | 1.5 g |
| Leuco Crystal Violet | 3.0 g |
| thermopolymerization inhibitor N-nitroso phenylhydroxylamine aluminum salt | 0.1 g |
| tetraethylammonium chloride | 0.1 g |
| fluorine surfactant (1) described above | 0.1 g |
| microcapsule (1) described below (solid content) | 10.0 g |
| methylethylketone | 35.0 g |
| 1-methoxy-2-propanol | 35.0 g |
| water | 10.0 g |

Comparative Examples 5 and 6

Planographic printing plate precursors (30) and (31) were obtained in a manner similar to that of Example 16, except that the compound 4 contained in the undercoat layer of Example 16 was replaced with a compound P-1 (described below) which does not have a polymerizable group (Comparative Example 5) or a compound P-2 (described below) which does not have a support adsorptive group (Comparative Example 6), respectively.

[Chem. 40]

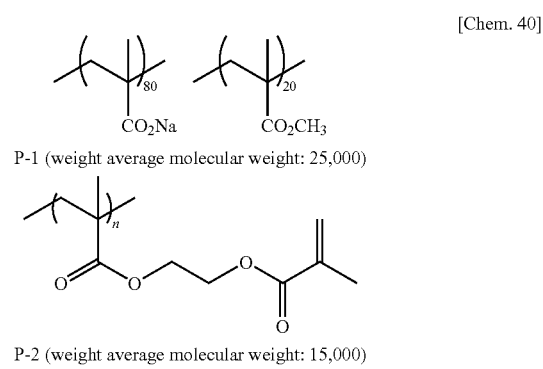

P-1 (weight average molecular weight: 25,000)

P-2 (weight average molecular weight: 15,000)

Machine Ability, Printing Durability, and Stain Resistance]

The planographic printing plate precursors (13) to (31) thus obtained were subjected to exposure using 375-nm semiconductor laser under conditions where the power was 2 mW, an external drum having a circumferential length of 900 mm was used, the rotational speed of the drum was 800 rpm, and the resolution was 2400 dpi. The resultant exposed precursors were attached to a cylinder of a printing machine SOR-M (manufactured by Heidelberg), without a development process. The precursors were supplied with fountain solution (EU-3 (etching solution manufactured by Fuji Photo Film Co., Ltd.)/water/isopropyl alcohol=1/89/10 (ratio by volume)) and TRANS-G (N) black ink (manufactured by Dainippon Ink and Chemicals, Inc.). Printing was performed at a printing speed of 6000 sheets per hour.

The number of sheets of printing paper required until ink was no longer transferred onto printing paper after removal of an unexposed portion of the image recording layer was completed on the printing machine, was measured as development-on-machine ability.

After the development-on-machine was completed, printing was further continued. As the number of printing sheets was increased, the image recording layer was gradually abraded, resulting in a reduction in ink acceptability. Therefore, ink concentration on printing paper was reduced. The number of printing sheets when ink concentration (reflectance concentration) was reduced by 0.1 compared to the start of printing, was evaluated as printing durability. During evaluation of printing durability, scumming did not occur in any one of the plates.

The result of the evaluation of development-on-machine ability and printing durability was shown in Table 5.

TABLE 5

| | Evaluation result | | |
|---|---|---|---|
| | Planographic printing plate precursor | Number of sheets in development-on-machine | Number of sheets as durability |
| Example 13 | (13) | 30 | 20,000 |
| Example 14 | (14) | 35 | 25,000 |
| Example 15 | (15) | 25 | 20,000 |
| Example 16 | (16) | 30 | 30,000 |
| Example 17 | (17) | 30 | 25,000 |
| Example 18 | (18) | 40 | 35,000 |
| Example 19 | (19) | 25 | 20,000 |
| Example 20 | (20) | 25 | 25,000 |
| Example 21 | (21) | 40 | 30,000 |
| Example 22 | (22) | 35 | 25,000 |
| Example 23 | (23) | 35 | 35,000 |
| Example 24 | (24) | 25 | 20,000 |
| Example 25 | (25) | 30 | 25,000 |
| Example 26 | (26) | 45 | 40,000 |
| Example 27 | (27) | 35 | 30,000 |
| Example 28 | (28) | 25 | 20,000 |
| Comparative Example 4 | (29) | 150 | 8,000 |
| Comparative Example 5 | (30) | 30 | 1,000 |
| Comparative Example 6 | (31) | 200 | 5,000 |

As can be seen from Table 5, the planographic printing method of the present invention using the planographic printing plate precursor (Examples 13 to 28) of the present invention can achieve a considerably excellent level of development-on-machine ability and printing durability compared to conventional planographic printing plate precursors (Comparative Examples 4 to 6). Also, since scumming did not occur during a printing process, it can be understood that the resistance to stain is excellent.

Examples 29 to 34, Comparative Examples 7 and 8

An image recording layer coating solution having a composition described in Table 6 below was applied onto the above-described support using a bar coating technique, followed by drying 100° C. for 60 seconds, to form an image recording layer having a dried coating amount of 10 g/m². The above-described protective layer coating solution (1) was applied onto the image recording layer to a dried coating amount of 0.5 g/m², followed by drying in an oven at 125° C. for 75 seconds, to obtain a planographic printing plate precursor.

TABLE 6

| Image recording layer coating solution | | | | | | | | |
|---|---|---|---|---|---|---|---|---|
| | Ex. 29 | Ex. 30 | Ex. 31 | Ex. 32 | Ex. 33 | Ex. 34 | C. Ex. 7 | C. Ex. 8 |
| Polymerization initiator (1) | 0.2 | 0.2 | 0.2 | 0.2 | 0.2 | 0.2 | 0.2 | 0.2 |
| Binder polymer (2) | 3.0 | | | 0.39 | | | 6.0 | 0.79 |
| Isocyanuric acid EO modified triacrylate (NK ester M-315, from Shin-Nakamura Chemical Co., Ltd.) | 12.4 | 12.4 | 12.4 | 1.94 | 1.94 | 1.94 | 12.4 | 1.94 |
| Leuco Crystal Violet | 3.0 | 3.0 | 3.0 | 3.0 | 3.0 | 3.0 | 3.0 | 3.0 |
| Thermopolymerization inhibitor N-nitroso phenylhydroxylamine aluminum salt | 0.1 | 0.1 | 0.1 | 0.1 | 0.1 | 0.1 | 0.1 | 0.1 |
| Fluorine surfactant (1) | 0.1 | 0.1 | 0.1 | 0.1 | 0.1 | 0.1 | 0.1 | 0.1 |
| Microcapsule (1) (15 mass % aqueous solution) | | | | | 67 | 67 | | 13.1 |
| Surface lipophilic functional group-containing inorganic microparticle (30 mass % methylethylketone solution)(Nissan Chemical Industries, Ltd., particle diameter: 10 to 20 nm) | 10 | 20 | | 1.3 | 2.63 | | | |
| Surface polymerizable functional group-containing inorganic microparticle R722 | | | 6.0 | | | 0.79 | | |

TABLE 6-continued

| | Image recording layer coating solution | | | | | | | |
|---|---|---|---|---|---|---|---|---|
| | Ex. 29 | Ex. 30 | Ex. 31 | Ex. 32 | Ex. 33 | Ex. 34 | C. Ex. 7 | C. Ex. 8 |
| (slica and 2-propenic acid-2-methyl, 3-(trimethoxysilyl)propyl ester reaction product) (Nippon Aerosil Co., Ltd., particle diameter: 10 to 20 nm) | | | | | | | | |
| Methylethylketone | 63 | 56 | 70 | 4.5 | 2.66 | 5.4 | 70 | 5.4 |
| Propylene grycol monomethyl ether | | | | 42.7 | 42.7 | 42.7 | | 42.7 |
| Water | | | | 12.1 | 12.1 | 12.1 | | 12.1 |

The resultant planographic printing plate precursors were subjected to exposure and printing to evaluate development-on-machine ability and printing durability in a manner similar to that of Examples 13 to 28, except that a printing machine Sprint 25 (manufactured by Komori Corporation) was used at a printing speed of 8,000 per hour. The result of the evaluation is shown in Table 7.

TABLE 7

Evaluation result

| | Number of sheets in development-on-machine | Number of sheets as durability |
|---|---|---|
| Example 29 | 30 | 6,000 |
| Example 30 | 40 | 8,000 |
| Example 31 | 50 | 10,000 |
| Example 32 | 25 | 5,000 |
| Example 33 | 40 | 8,000 |
| Example 34 | 35 | 9,000 |
| Comparative Example 6 | 100 | 8,000 |
| Comparative Example 7 | 80 | 7,000 |

As can be seen from Table 7, the planographic printing method of the present invention using the planographic printing plate precursor (Examples 29 to 34) of the present invention can achieve an excellent level of development-on-machine ability while holding printing durability, compared to when conventional planographic printing plate precursors are used (Comparative Examples 7 to 8).

The present invention has been described in detail and with reference to the specific embodiments. It will be understood by those skilled in the art that various changes and modifications can be made without departing the spirit and scope of the present invention.

The present application is based on Japanese Patent Application No. 2004-86216 filed on Mar. 24, 2004, Japanese Patent Application No. 2004-86217 filed on Mar. 24, 2004, and Japanese Patent Application No. 2004-89828 filed on Mar. 24, 2004, the entire contents of which are hereby incorporated by reference.

The invention claimed is:

1. An image forming method comprising:
subjecting a planographic printing plate precursor to exposure using laser light in a wavelength range of 250 nm to 420 nm with a one-pixel drawing time of one millisecond or less, wherein the planographic printing plate precursor comprises:
on a support, an undercoat layer that consists essentially of a polymer having repeating units of the formula (A1) and the formula (A2)

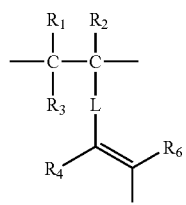
(A1)

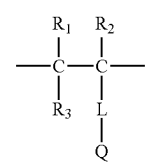
(A2)

wherein $R_1$ to $R_3$ each independently represent a hydrogen atom, an alkyl group having 1 to 6 carbon atoms, or a halogen atom, $R_4$ to $R_6$ each independently represent a hydrogen atom, an alkyl group having 1 to 6 carbon atoms, a halogen atom, an acyl group, or an acyloxy group, and $R_4$ and $R_5$, or $R_5$ and $R_6$ may form a ring, L represents a divalent linking group selected from the group consisting of —CO—, —O—, —NH—, a divalent aliphatic group, a divalent aromatic group, and a combination thereof, and Q represents a functional group which interacts with a surface of the support, the coating amount of the undercoat layer after drying being from 1 to 30 mg/m²; and
on the undercoat layer, an image recording layer that contains (A) a polymerization initiator, (B) a polymerizable compound, and (C) a binder polymer, and has photosensitivity in the wavelength range of 250 nm to 420 nm.

2. The image forming method of claim 1, wherein the laser light wavelength is a wavelength selected from 405 nm, 375 nm, 365 nm, 355 nm, and 266 nm.

3. The image forming method of claim 1, wherein exposure is performed using an optical system comprising: a DMD or GLV modulation element and a 405 nm or 375 nm-wavelength semiconductor laser.

4. The image forming method of claim 1, wherein the laser light wavelength is a wavelength selected from 365 nm, 355 nm, and 266 nm, and exposure is performed using an internal drum method.

5. The image forming method of claim 1, wherein the polymer of the undercoat layer has repeating units of the formula (A1) and the formula (A2) and the formula (A3)

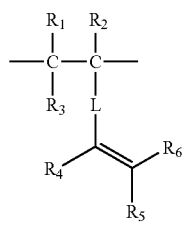
(A1)

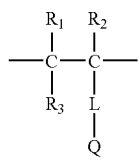
(A2)

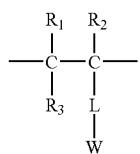
(A3)

wherein $R_1$ to $R_3$ each independently represent a hydrogen atom, an alkyl group having 1 to 6 carbon atoms, or a halogen atom, $R_4$ to $R_6$ each independently represent a hydrogen atom, an alkyl group having 1 to 6 carbon atoms, a halogen atom, an acyl group, or an acyloxy group, and $R_4$ and $R_5$, or $R_5$ and $R_6$ may form a ring, L represents a divalent linking group selected from the group consisting of —CO—, —O—, —NH—, a divalent aliphatic group, a divalent aromatic group, and a combination thereof, Q represents a functional group which interacts with a surface of the support, and W represents groups as follows:

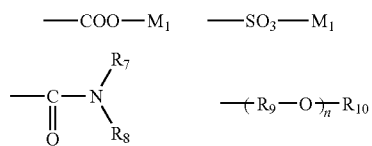

wherein $M_1$ represents a hydrogen atom, a metal atom, or an ammonium group, $R_7$ and $R_8$ each independently represent a hydrogen atom or a straight- or branched-chain alkylene group having 1 to 6 carbon atoms, $R_9$ represents a straight- or branched-chain alkylene group having 1 to 6 carbon atoms, $R_{10}$ represents a hydrogen atom or an alkyl group having 1 to 12 carbon atoms, and n represents an integer of 1 to 100.

6. The image forming method of claim 1, wherein Q represents a phosphoric ester group, a phosphonic acid group, or an iminodiacetic acid group of the formula

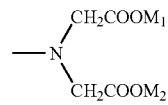

wherein $M_1$ and $M_2$ each independently represent a hydrogen atom, a metal atom, or an ammonium group.

7. A planographic printing method comprising:
   forming an image by subjecting a planographic printing plate precursor to exposure using laser light in a wavelength range of 250 nm to 420 nm with a one-pixel drawing time of one millisecond or less, wherein the planographic printing plate precursor comprises: on a support, an undercoat layer that consists essentially of a polymer having repeating units of the formula (A1) and the formula (A2)

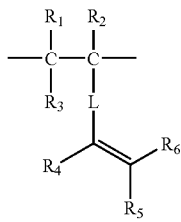
(A1)

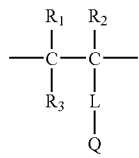
(A2)

wherein $R_1$ to $R_3$ each independently represent a hydrogen atom, an alkyl group having 1 to 6 carbon atoms, or a halogen atom, $R_4$ to $R_6$ each independently represent a hydrogen atom, an alkyl group having 1 to 6 carbon atoms, a halogen atom, an acyl group, or an acyloxy group, and $R_4$ and $R_5$, or $R_5$ and $R_6$ may form a ring, L represents a divalent linking group selected from the group consisting of —CO—, —O—, —NH—, a divalent aliphatic group, a divalent aromatic group, and a combination thereof, and Q represents a functional group which interacts with a surface of the support, the coating amount of the undercoat layer after drying being from 1 to 30 mg/m$^2$; and on the undercoat layer, an image recording layer that contains (A) a polymerization initiator, (B) a polymerizable compound, and (C) a binder polymer, and has photosensitivity in the wavelength range of 250 nm to 420 nm;
   developing said image using a developer solution or development-on-machine performed with supply of printing ink and/or fountain solution; and
   then printing.

* * * * *